(12) United States Patent
Cho et al.

(10) Patent No.: US 12,245,479 B2
(45) Date of Patent: Mar. 4, 2025

(54) DISPLAY PANEL

(71) Applicant: Samsung Display Co., Ltd., Yongin-si (KR)

(72) Inventors: Youngjin Cho, Yongin-si (KR);
Kyoungjin Park, Yongin-si (KR);
Wonkyu Kwak, Yongin-si (KR);
Joongsoo Moon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/981,346

(22) Filed: Nov. 4, 2022

(65) Prior Publication Data

US 2023/0225160 A1 Jul. 13, 2023

(30) Foreign Application Priority Data

Jan. 12, 2022 (KR) .................. 10-2022-0004737

(51) Int. Cl.
*H10K 59/131* (2023.01)
*G09G 3/3233* (2016.01)

(52) U.S. Cl.
CPC ......... *H10K 59/131* (2023.02); *G09G 3/3233* (2013.01); *G09G 2300/0426* (2013.01); *G09G 2300/0452* (2013.01); *G09G 2300/0819* (2013.01); *G09G 2300/0842* (2013.01); *G09G 2300/0852* (2013.01); *G09G 2300/0861* (2013.01); *G09G 2320/0242* (2013.01); *G09G 2320/041* (2013.01)

(58) Field of Classification Search
None
See application file for complete search history.

(56) References Cited

U.S. PATENT DOCUMENTS

2006/0262130 A1\* 11/2006 Kim ................. G09G 3/3233
345/589
2013/0181967 A1 7/2013 Lee et al.
(Continued)

FOREIGN PATENT DOCUMENTS

CN 110223633 A \* 9/2019 ........... G09G 3/3208
KR 10-2013-0083664 A 7/2013
(Continued)

OTHER PUBLICATIONS

CN-110223633-A (English translation) (Year: 2019).\*
Partial ESR issued Jun. 15, 2023, in corresponding EP Patent Application No. 22210044.8 (12 pages).

Primary Examiner — Dorothy Harris
(74) Attorney, Agent, or Firm — Womble Bond Dickinson (US) LLP

(57) ABSTRACT

A display panel includes a first initialization voltage line in the display area and configured to transmit a first initialization voltage, a second initialization voltage line in the display area and configured to transmit a second initialization voltage, a first transistor in a first pixel area of the display area and connected to a pixel electrode of a first light-emitting diode emitting light of a first color and the first initialization voltage line, and a second transistor in a second pixel area adjacent to the first pixel area, the second transistor being connected to a pixel electrode of a second light-emitting diode emitting light of a second color and the second initialization voltage line.

19 Claims, 44 Drawing Sheets

(56) References Cited

U.S. PATENT DOCUMENTS

| | | | | |
|---|---|---|---|---|
| 2015/0163942 A1* | 6/2015 | Wu | ................... | G02F 1/13454 |
| | | | | 361/679.21 |
| 2015/0279278 A1* | 10/2015 | Park | ................... | G09G 3/3233 |
| | | | | 345/212 |
| 2018/0033833 A1* | 2/2018 | An | ..................... | H10K 59/40 |
| 2018/0075804 A1* | 3/2018 | Kim | ................... | G09G 3/3233 |
| 2018/0293944 A1* | 10/2018 | Kim | ................... | G09G 3/3233 |
| 2018/0308917 A1* | 10/2018 | Cheng | ................. | G09G 3/34 |
| 2018/0373070 A1* | 12/2018 | Zhao | .................. | G09G 3/3648 |
| 2020/0066212 A1 | 2/2020 | Kim et al. | | |
| 2021/0183315 A1 | 6/2021 | Ka et al. | | |
| 2021/0193774 A1 | 6/2021 | Won et al. | | |
| 2021/0343234 A1* | 11/2021 | Yoon | .................. | G09G 3/3225 |
| 2021/0391407 A1* | 12/2021 | Yoon | .................. | G06F 3/0412 |
| 2022/0320202 A1* | 10/2022 | Xian | .................. | H10K 59/122 |
| 2022/0320215 A1* | 10/2022 | Lee | ................... | H10K 59/1213 |

FOREIGN PATENT DOCUMENTS

| | | | |
|---|---|---|---|
| KR | 10-2015-0124922 A | 11/2015 | |
| KR | 10-2016-0070653 A | 6/2016 | |
| KR | 10-2019-0049995 A | 5/2019 | |
| KR | 10-2020-0023566 A | 3/2020 | |
| KR | 10-2021-0078648 A | 6/2021 | |

\* cited by examiner

DISPLAY PANEL

CROSS-REFERENCE TO RELATED APPLICATION

The present application claims priority to and the benefit of Korean Patent Application No. 10-2022-0004737, filed on Jan. 12, 2022, in the Korean Intellectual Property Office, the entire disclosure of which is incorporated herein by reference.

BACKGROUND

1. Field

Aspects of one or more embodiments relate to a display panel and a display device having the same.

2. Description of the Related Art

In general, an organic light-emitting diode display includes a plurality of pixels including an organic light-emitting diode and a thin-film transistor. Sub-pixels that are configured to emit light of different colors may have different electrical properties depending, for example, on an emission layer of an organic light-emitting diode.

The above information disclosed in this Background section is only for enhancement of understanding of the background and therefore the information discussed in this Background section does not necessarily constitute prior art.

SUMMARY

Aspects of one or more embodiments relate to a display panel and a display device having the same, and for example, to a display panel including pixels emitting light of different colors and a display device having the same.

Aspects of one or more embodiments include a display panel having relatively improved image quality properties by compensating for electrical properties of an organic light-emitting diode for each pixel emitting light of different colors, and a display device including the same. However, this is merely an example, and the scope of embodiments according to the present disclosure are not limited thereto.

Additional aspects will be set forth in part in the description which follows and, in part, will be apparent from the description, or may be learned by practice of the presented embodiments of the disclosure.

According to one or more embodiments, in a display panel including a display area and a peripheral area outside the display area, the display panel includes a first initialization voltage line extending in a first direction in the display area and configured to transmit a first initialization voltage, a second initialization voltage line extending in the first direction in the display area and configured to transmit a second initialization voltage, a first transistor in a first pixel area of the display area and including a pixel electrode of a first light-emitting diode emitting light of a first color, a first semiconductor layer connected to the first initialization voltage line, and a first gate electrode, and a second transistor in a second pixel area adjacent to the first pixel area, the second transistor including a pixel electrode of a second light-emitting diode emitting light of a second color, a second semiconductor layer connected to the second initialization voltage line, and a second gate electrode, wherein the first initialization voltage line is in direct contact with the first semiconductor layer, and the second initialization voltage line is connected to the second semiconductor layer through a connection electrode.

According to some embodiments, the first initialization voltage line and the second initialization voltage line may be on different layers.

According to some embodiments, the first transistor and the second transistor may be line-symmetric with respect to a boundary line in a second direction perpendicular to the first direction.

According to some embodiments, the first initialization voltage line may extend in a zigzag shape.

According to some embodiments, in a plan view, the first initialization voltage line may include a first portion and a second portion, which are parallel to the second initialization voltage line, and a third portion crossing the first initialization voltage line and connecting the first portion to the second portion.

According to some embodiments, the second initialization voltage line may be on a layer between a second gate electrode of the second transistor and the first initialization voltage line.

According to some embodiments, the connection electrode and the first initialization voltage line may be on the same layer.

According to some embodiments, the display panel may further include a third semiconductor layer arranged in a third pixel area adjacent to the second pixel area, the third transistor including a pixel electrode of a third light-emitting diode emitting light of a third color, a third semiconductor layer connected to the second initialization voltage line, and a third gate electrode transistor, wherein the second initialization voltage line may be connected to the third semiconductor layer through the connection electrode.

According to some embodiments, the display panel may further include a first initialization voltage supply line extending in a second direction perpendicular to the first direction in the peripheral area and supplying the first initialization voltage to the first initialization voltage line, and a second initialization voltage supply line extending in the second direction in the peripheral area and supplying the second initialization voltage to the second initialization voltage line.

According to some embodiments, the display panel may further include a scan driving circuit arranged in the peripheral area and configured to supply a scan signal to the first gate electrode of the first transistor and the second gate electrode of the second transistor, wherein the first initialization voltage supply line and the second initialization voltage supply line may overlap the scan driving circuit.

According to one or more embodiments, in a display panel including a display area and a peripheral area outside the display area, the display panel includes a first initialization voltage line extending in a first direction in the display area and configured to transmit a first initialization voltage, a second initialization voltage line extending in the first direction in the display area and configured to transmit a second initialization voltage, a first transistor in a first pixel area of the display area and including a pixel electrode of a first light-emitting diode emitting light of a first color, a first semiconductor layer connected to the first initialization voltage line, and a first gate electrode, and a second transistor arranged in a second pixel area adjacent to the first pixel area, the second transistor including a pixel electrode of a second light-emitting diode emitting light of a second color, a second semiconductor layer connected to the second initialization voltage line, and a second gate electrode, wherein, in at least one of the first initialization voltage and the second initialization voltage, a value at a temperature higher than a reference temperature is different from a value at a temperature below the reference temperature.

According to some embodiments, the first initialization voltage line and the second initialization voltage line may be on different layers.

According to some embodiments, the first transistor and the second transistor may be line-symmetric with respect to a boundary line in a second direction perpendicular to the first direction.

According to some embodiments, the first initialization voltage line may extend in a zigzag shape.

According to some embodiments, in a plan view, the first initialization voltage line may include a first portion and a second portion, which are parallel to the second initialization voltage line, and a third portion crossing the first initialization voltage line and connecting the first portion to the second portion.

According to some embodiments, the second initialization voltage line may be on a layer between a second gate electrode of the second transistor and the first initialization voltage line.

According to some embodiments, the first initialization voltage line may be in direct contact with the first semiconductor layer, the second initialization voltage line may be connected to the second semiconductor layer through a connection electrode, and the connection electrode and the first initialization voltage line may be on the same layer.

According to some embodiments, the display panel may further include a third semiconductor layer arranged in a third pixel area adjacent to the second pixel area, the third transistor including a pixel electrode of a third light-emitting diode emitting light of a third color, a third semiconductor layer connected to the second initialization voltage line, and a third gate electrode transistor, wherein the second initialization voltage line may be connected to the third semiconductor layer through the connection electrode.

According to some embodiments, the display panel may further include a first initialization voltage supply line extending in a second direction perpendicular to the first direction in the peripheral area and supplying the first initialization voltage to the first initialization voltage line, and a second initialization voltage supply line extending in the second direction in the peripheral area and supplying the second initialization voltage to the second initialization voltage line.

According to some embodiments, the display panel may further include a scan driving circuit arranged in the peripheral area and configured to supply a scan signal to the first gate electrode of the first transistor and the second gate electrode of the second transistor, wherein the first initialization voltage supply line and the second initialization voltage supply line may overlap the scan driving circuit.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
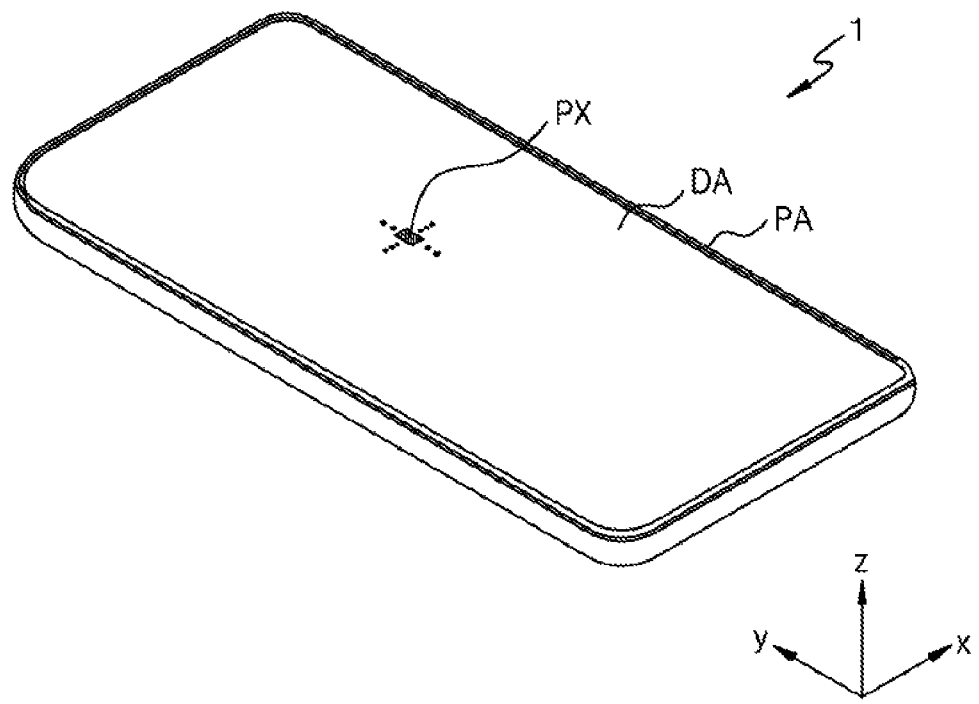
FIG. 1 is a perspective view schematically illustrating a display device according to some embodiments.

Reference will now be made in more detail to aspects of some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the disclosure may have diverse modified embodiments, certain embodiments are illustrated in the drawings and are described in the detailed description. Advantages and features of the disclosure, and implementation methods thereof will be clarified through following embodiments described with reference to the accompanying drawings. The disclosure may, however, be embodied in many different forms and should not be construed as limited to the embodiments set forth herein.

Reference will now be made in more detail to aspects of some embodiments, which are illustrated in the accompanying drawings, wherein like reference numerals refer to like elements throughout, and some repeated description thereof may be omitted.

It will be understood that when a layer, region, or element is referred to as being "formed on" another layer, region, or element, it can be directly or indirectly formed on the other layer, region, or element. That is, for example, intervening layers, regions, or elements may be present. Sizes of elements in the drawings may be exaggerated for convenience of explanation. In other words, because sizes and thicknesses of elements in the drawings are arbitrarily illustrated for convenience of description, the following embodiments are not limited thereto.

In the following embodiments, the term "in a plan view" means that an object is viewed from above, and the term "in a cross-sectional view" means that a vertical section of an object is viewed from the side. In the following embodiments, that a first element "overlapping" a second element means that the first element is located above or below the second element.

In the following embodiments, an x-axis, a y-axis, and a z-axis are not limited to three axes on an orthogonal coordinate system and may be widely understood. For example, the x-axis, the y-axis, and the z-axis may be perpendicular to one another or may represent different directions that are not perpendicular to one another.

Figure 2:
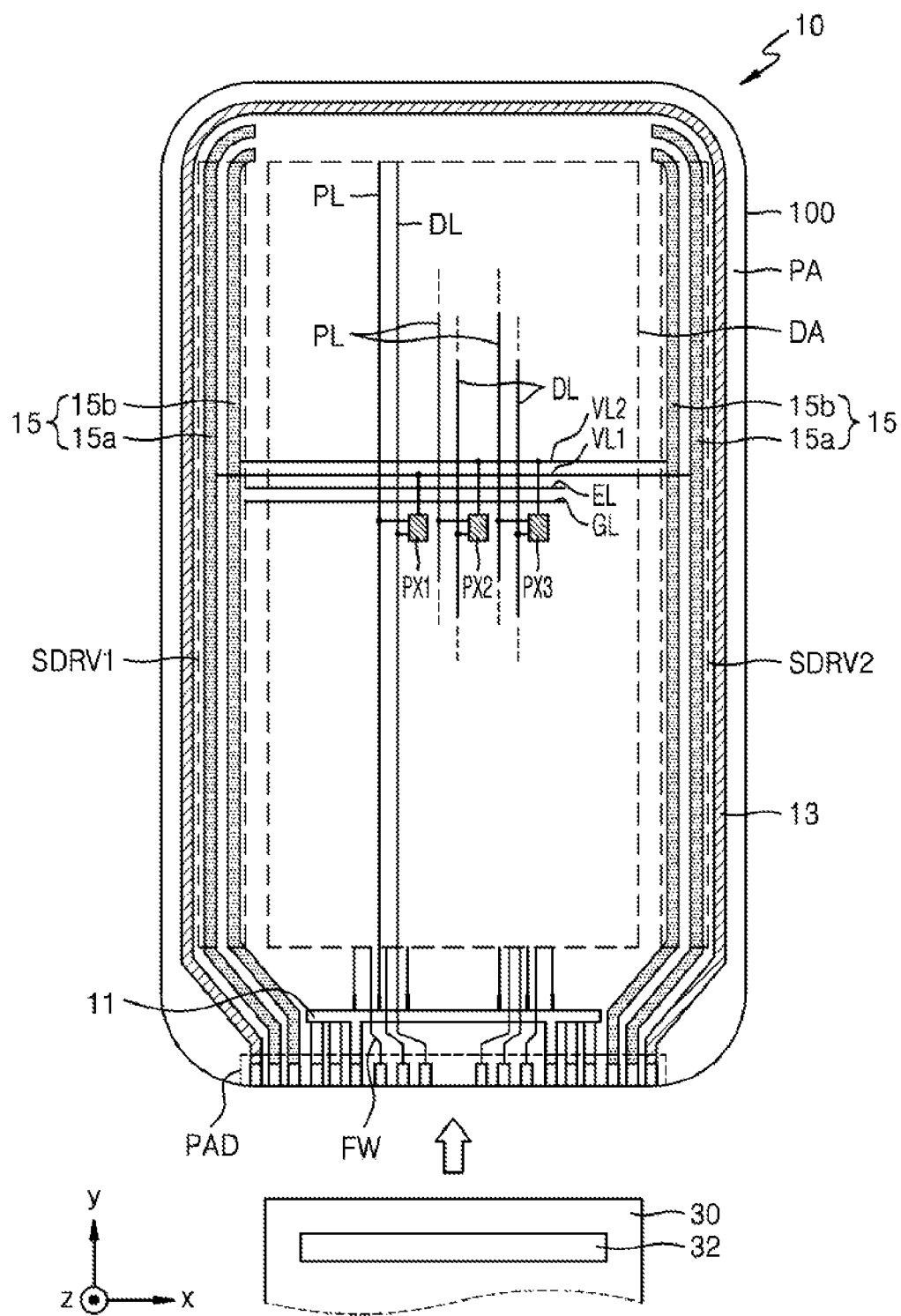
FIG. 2 is a plan view schematically illustrating a display panel according to some embodiments.
Figure 3:
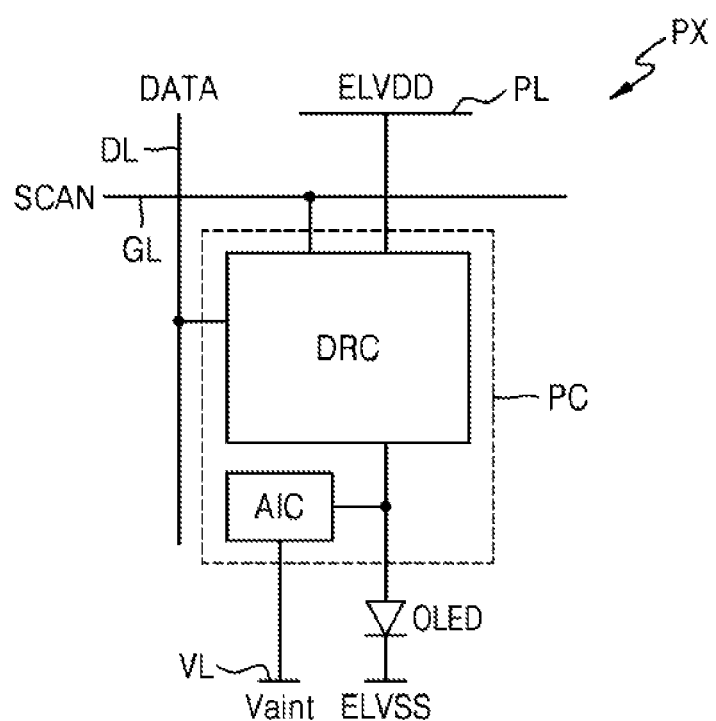
FIG. 3 is a view schematically illustrating a pixel according to some embodiments.
Figure 4:
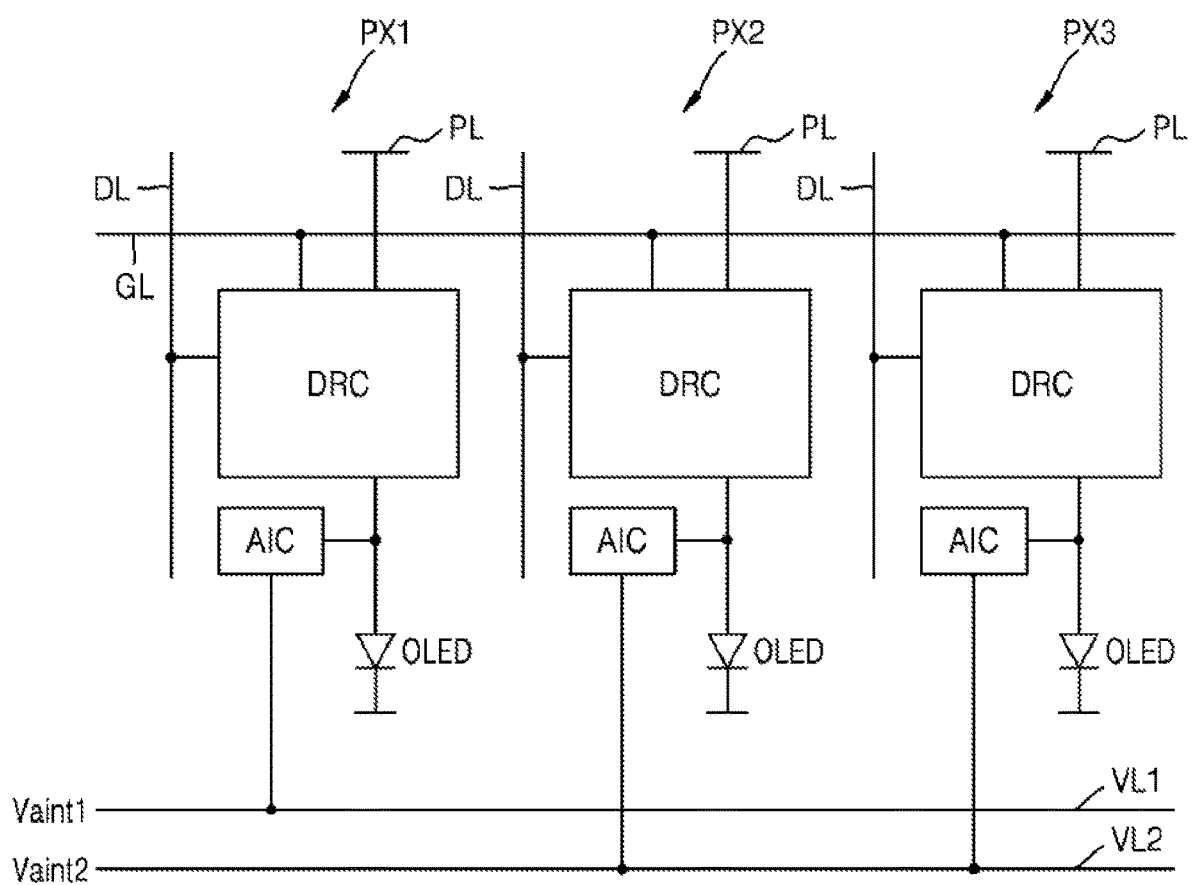
FIG. 4 is a view schematically illustrating a connection between a pixel and an initialization voltage line, according to some embodiments.

FIG. 1 is a perspective view schematically illustrating a display device according to some embodiments. FIG. 2 is a plan view schematically illustrating a display panel according to some embodiments. FIG. 3 is a view schematically illustrating a pixel according to some embodiments. FIG. 4 is a view schematically illustrating a connection between a pixel and an initialization voltage line, according to some embodiments.

A display device according to embodiments is a device that displays moving (e.g., video) images or still (static) images, and may be used as a display screen of various products such as a television, a laptop computer, a monitor, a billboard, and the Internet of Things (IOT), as well as portable electronic devices such as a mobile phone, a smartphone, a tablet personal computer (PC), a mobile communication terminal, an electronic notebook, an e-book, a portable multimedia player (PMP), a navigation, and an ultra-mobile PC (UMPC). In addition, the display device according to some embodiments may be used in a wearable device such as a smart watch, a watch phone, a spectacle-type display, and a head mounted display (HMD). Furthermore, the display device according to some embodiments may be used as a dashboard of a vehicle, a center information display (CID) placed on a center fascia or a dashboard of a vehicle, a room mirror display that replaces side mirrors of a vehicle, and a display on a rear surface of a front seat as entertainment for a rear passenger of a vehicle.

Referring to FIG. 1, a display device 1 may have an edge in a first direction and an edge in a second direction. The first direction and the second direction may be directions crossing each other. For example, the first direction and the second direction may be at an acute angle to each other. As another example, the first direction and the second direction may form an obtuse angle or may be orthogonal to each other. Hereinafter, a case in which the first direction and the second direction are orthogonal to each other will be described in detail. For example, the first direction may be an x-direction or a −x-direction, and the second direction may be a y-direction or a −y-direction. The third direction perpendicular to the first direction and the second direction may be a z direction or a −z direction.

The display device 1 may include a display area DA and a peripheral area PA outside (e.g., in a periphery, or outside a footprint, of) the display area DA. The display device 1 may provide a certain image using light emitted from a plurality of pixels PX arranged in the display area DA. The peripheral area PA is an area arranged outside the display area DA, and may be a kind of non-display area in which pixels are not arranged. The display area DA may be surrounded by the peripheral area PA.

Hereinafter, an organic light-emitting display will be described as an example of a display device according to some embodiments, but the display device according to embodiments of the present disclosure are not limited thereto. According to some embodiments, the display device of the disclosure may be an inorganic light-emitting display (or inorganic EL display device) or a display device such as a quantum dot light emitting display. For example, an emission layer of the display element included in the display device may include an organic material or an inorganic material. In addition, the display device may include an emission layer and quantum dots located on a path of light emitted from the emission layer.

Referring to FIG. 2, the display device 1 may include a display panel 10, and a cover window for protecting the display panel 10 may be further on the display panel 10.

Various components of the display panel 10 may be on a substrate 100. The substrate 100 may include the display area DA and the peripheral area PA surrounding (e.g., outside a footprint or in a periphery of) the display area DA.

A plurality of pixels PX may be arranged in the display area DA. Each pixel PX may include a display element. The display element may be connected to a pixel circuit that drives the pixel PX. The display element may include an organic light-emitting diode or a quantum dot organic light-emitting diode. Each pixel PX may emit, for example, red, green, blue, or white light from the organic light-emitting diode OLED. The plurality of pixels PX may include a first pixel PX1 that emits light in a first color, a second pixel PX2 that emits light in a second color, and a third pixel PX3 that emits light in a third color. For example, the first pixel PX1 may be a red pixel, the second pixel PX2 may be a green pixel, and the third pixel PX3 may be a blue pixel.

Referring to FIG. 3 together, each of the first pixel PX1, the second pixel PX2, and the third pixel PX3 may include a pixel circuit PC connected to a gate line GL and a data line DL, and an organic light-emitting diode OLED as a display element connected to the pixel circuit PC. The pixel circuit PC may include a driver DRC and an initialization unit AIC. The organic light-emitting diode OLED may include a pixel electrode (a first electrode or an anode) and an opposite electrode (a second electrode or a cathode), and the opposite electrode may receive a second power voltage ELVSS. The organic light-emitting diode OLED may display an image by receiving a driving current from the driver DRC and emitting light.

The driver DRC is connected to a first power voltage line PL, and may be activated by a scan signal SCAN supplied from the gate line GL to generate and output a driving current corresponding to a data signal DATA supplied from the data line DL. The organic light-emitting diode OLED may emit light with a brightness corresponding to the driving current transmitted from the driver DRC. The driver DRC may include a plurality of transistors and one or more capacitors. The initialization unit AIC may be connected to the organic light-emitting diode OLED and an initialization voltage line VL. The initialization unit AIC may transmit an initialization voltage Vaint from the initialization voltage line VL to the organic light-emitting diode OLED to initialize the organic light-emitting diode OLED. The configuration and structure of specific circuit elements of the driver DRC and the initialization unit AIC will be described in various embodiments below.

A brightness change may occur due to a voltage remaining in the organic light-emitting diode OLED, which may be more visually recognized in the case of a low grayscale display at a high temperature. For example, the organic light-emitting diode OLED may emit light with higher brightness than black brightness. According to some embodiments, by initializing the organic light-emitting diode OLED through the initialization unit AIC, a brightness change in the organic light-emitting diode OLED at a low gray level may be minimized or reduced.

Respective organic light-emitting diodes OLED of the first pixel PX1, the second pixel PX2, and the third pixel PX3 may have different material properties. Accordingly, when an initialization voltage is set according to the material properties of one color pixel, a color change may occur in other color pixels. According to some embodiments, the display device 1 may respectively set the initialization voltages applied to the first pixel PX1, the second pixel PX2, and the third pixel PX3 according to the material properties of the organic light-emitting diode OLED. For example, in the display device 1, an initialization voltage line connected to the first pixel PX1 and an initialization voltage line connected to the second pixel PX2 and the third pixel PX3 are separately provided so that different initialization voltages are applied, and thus, the display device 1 may improve a low grayscale brightness change and a color change due to the influence of materials of the organic light-emitting diode OLED.

According to some embodiments, the display device 1 may respectively set the initialization voltages applied to the first pixel PX1, the second pixel PX2, and the third pixel PX3 according to the temperature. For example, the display device 1 may set the initialization voltage applied to a first initialization voltage line connected to the first pixel PX1 at a high temperature differently from the initialization voltage applied to the first initialization voltage line at a normal temperature. The display device 1 may set the initialization voltage applied to a second initialization voltage line connected to the second pixel PX2 and the third pixel PX3 at a high temperature differently from the initialization voltage applied to the second initialization voltage line at a normal temperature. Accordingly, a low grayscale luminance change and a color change at a high temperature may be relatively improved.

When the pixel PX shown in FIG. 3 is the first pixel PX1, the initialization voltage line VL may be a first initialization voltage line VL1, and the initialization voltage Vaint may be a first initialization voltage Vaint1. When the pixel PX shown in FIG. 3 is the second pixel PX2 or the third pixel PX, the initialization voltage line VL may be a second initialization voltage line VL2, and the initialization voltage Vaint may be a second initialization voltage Vaint2. FIG. 4 illustrates an example in which the first pixel PX1 is connected to the first initialization voltage line VL1 that supplies the first initialization voltage Vaint1, and the second pixel PX2 and the third pixel PX3 are connected to the second initialization voltage line VL2 that supplies the second initialization voltage Vaint2.

In the peripheral area PA, various wires that transmit electrical signals to be applied to the display area DA, outer circuits electrically connected to pixel circuits, and pads to which a printed circuit board or a driver IC chip is attached may be located. For example, a first scan driving circuit SDRV1, a second scan driving circuit SDRV2, a terminal PAD, a first power voltage supply line 11, a second power voltage supply line 13, and an initialization voltage supply line 15 may be arranged in the peripheral area PA.

The first scan driving circuit SDRV1 may apply a scan signal that is a gate control signal to pixel circuits through the gate line GL. The first scan driving circuit SDRV1 may apply an emission control signal to the pixel circuits through an emission control line EL. The second scan driving circuit SDRV2 may be located opposite to the first scan driving circuit SDRV1 with respect to the display area DA and may be parallel to the first scan driving circuit SDRV1. Some of pixel circuits of the pixels PX of the display area DA may be electrically connected to the first scan driving circuit SDRV1, and the rest of the pixel circuits may be electrically connected to the second scan driving circuit SDRV2. The second scan driving circuit SDRV2 may be omitted.

The terminal PAD may be on one side of the substrate 100. The terminal PAD may be exposed without being covered by an insulating layer to be connected to a display circuit board 30. A display driver 32 may be on the display circuit board 30. The display driver 32 may be formed in the form of one or more integrated circuit chips and mounted on the display circuit board 30.

The display driver 32 may generate a control signal transmitted to the first scan driving circuit SDRV1 and the second scan driving circuit SDRV2. The display driver 32 may generate a data signal, and the generated data signal may be transmitted to the pixel circuits of the pixels PX through a fan-out line FW and a data line DL connected to the fan-out line FW.

The display driver 32 may supply a first power supply voltage ELVDD to a first power voltage supply line 11, and may supply the second power supply voltage ELVSS to a second power voltage supply line 13. The first power voltage ELVDD may be applied to the pixel circuits of the pixels PX through the first power voltage line PL connected to the first power voltage supply line 11, and the second power voltage ELVSS may be applied to opposite electrodes of display elements through the second power voltage supply line 13.

The first power voltage supply line 11 may be connected to the terminal PAD and may be provided to extend in the x-direction from a lower side of the display area DA. The second power voltage supply line 13 may be connected to the terminal PAD, and may partially surround the display area DA by having a loop shape with one side open.

The display driver 32 may supply an initialization voltage to the initialization voltage supply line 15. The initialization voltage supply line 15 may include a first initialization voltage supply line 15a and a second initialization voltage supply line 15b. Each of the first initialization voltage supply line 15a and the second initialization voltage supply lines 15b may be connected to the terminal PAD, and may be arranged to extend in the y-direction in a form to surround at least the left and right sides of the display area DA. The first initialization voltage supply line 15a and the second initialization voltage supply line 15b may overlap the first scan driving circuit SDRV1 and the second scan driving circuit SDRV2 and be apart from each other. The first initialization voltage supply line 15a may be connected to first initialization voltage lines VL1 of the display area DA. The second initialization voltage supply line 15b may be connected to second initialization voltage lines VL2 of the display area DA. The first initialization voltage Vaint1 may be applied to pixel circuits of first pixels PX1 through the first initialization voltage line VL1 connected to the first initialization voltage supply line 15a. The second initialization voltage Vaint2 may be applied to pixel circuits of second pixels PX2 and third pixels PX3 through the second initialization voltage line VL2 connected to the second initialization voltage supply line 15b. The display driver 32 may generate the first initialization voltage Vaint1 and the second initialization voltage Vaint2 differently according to the temperature and output them to the display panel 10.

Figure 5:
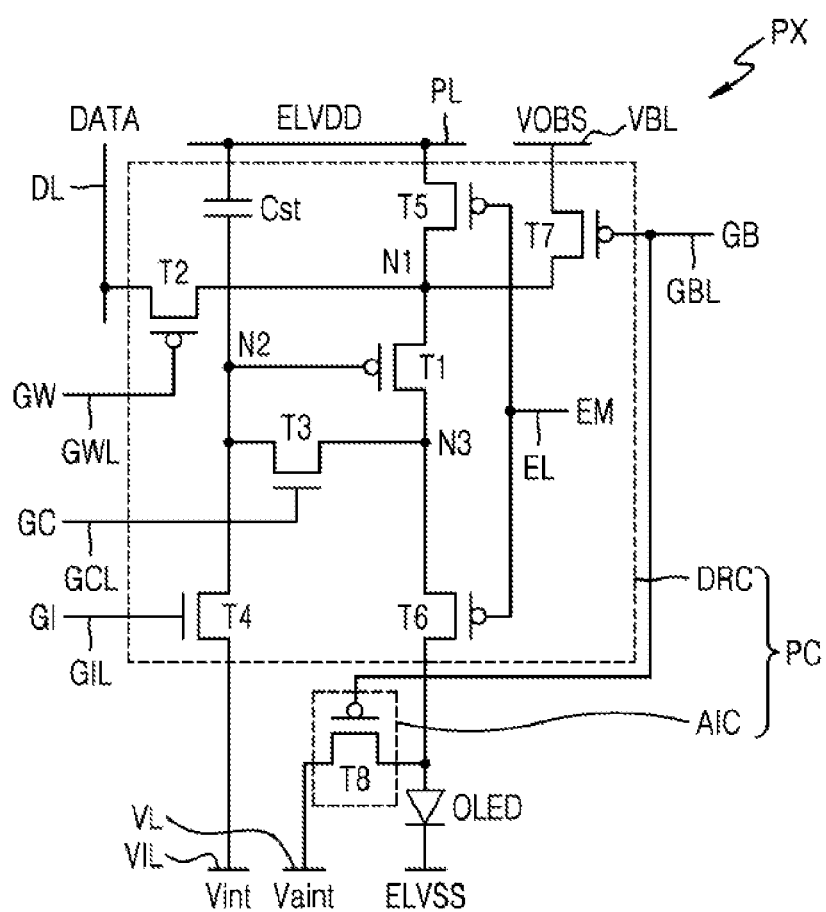
FIG. 5 is an equivalent circuit diagram of a pixel circuit according to some embodiments.

FIG. 5 is an equivalent circuit diagram of a pixel circuit according to some embodiments.

Referring to FIG. 5, the pixel circuit PC may include the driver DRC including first to seventh transistors T1, T2, T3, T4, T5, T6, and T7 and a capacitor Cst, and the initialization unit AIC including an initialization transistor T8. The pixel circuit PC may be connected to the data line DL, a first gate line GWL, a second gate line GIL, a third gate line GCL, a fourth gate line GBL, and the emission control line EL. In addition, the pixel circuit PC may be connected to the initialization voltage line VL, a node initialization voltage line VIL, and the first power voltage line PL. The pixel circuit PC may be connected to the organic light-emitting diode OLED as a display element.

In FIG. 5, the third transistor T3 and the fourth transistor T4 from among the first to seventh transistors T1 to T7 are N-type transistors, and the rest are P-type transistors. Depending on the type (N-type or P-type) and/or operating conditions of a transistor, a first terminal of the transistor is a source electrode or a drain electrode, and a second terminal may be a different electrode from the first terminal. For example, when the first terminal is a source electrode, the second terminal may be a drain electrode.

The first transistor T1 may be connected between the first power voltage line PL and the organic light-emitting diode OLED. The first transistor T1 may be connected between a first node N1 and a third node N3. The first transistor T1 may be connected to the first power voltage line PL via the fifth transistor T5, and may be electrically connected to the organic light-emitting diode OLED via the sixth transistor T6. The first transistor T1 may include a gate electrode connected to a second node N2, a first terminal connected to the first node N1, and a second terminal connected to the third node N3. The first power voltage line PL may transmit the first power voltage ELVDD to the first transistor T1. The first transistor T1 serves as a driving transistor, and may receive the data signal DATA according to a switching operation of the second transistor T2 to supply a driving current Ioled to the organic light-emitting diode OLED.

The second transistor T2 (data write transistor) may be connected between the data line DL and the first node N1. The second transistor T2 may be connected to the first power voltage line PL via the fifth transistor T5. The second transistor T2 may include a gate electrode connected to the first gate line GWL, a first terminal connected to the data line DL, and a second terminal connected to the first node N1. The second transistor T2 may be turned on according to a first scan signal GW to perform a switching operation of transmitting the data signal DATA transmitted to the data line DL to the first node N1.

The third transistor T3 (compensation transistor) may be connected between the second node N2 and the third node N3. The third transistor T3 may be electrically connected to the organic light-emitting diode OLED via the sixth transistor T6. The third transistor T3 may include a gate electrode connected to the third gate line GCL, a first terminal connected to the second node N2, and a second terminal connected to the third node N3. The third transistor T3 is turned on according to a third scan signal GC received through the third gate line GCL to diode-connect the first transistor T1 to compensate a threshold voltage of the first transistor T1.

The fourth transistor T4 (node initialization transistor) may be connected between the second node N2 and the node initialization voltage line VIL. The fourth transistor T4 may include a gate electrode connected to the second gate line GIL, a first terminal connected to the second node N2, and a second terminal connected to the node initialization voltage line VIL. The fourth transistor T4 may be turned on according to a second scan signal GI received through the second gate line GIL to transmit the initialization voltage Vint to a gate electrode of the first transistor T1 to initialize the gate electrode of the first transistor T1.

The fifth transistor T5 (first emission control transistor) may be connected between the first power voltage line PL and the first node N1. The sixth transistor T6 (second emission control transistor) may be connected between the third node N3 and the organic light-emitting diode OLED. The fifth transistor T5 may include a gate electrode connected to the emission control line EL, a first terminal connected to the first power voltage line PL, and a second terminal connected to the first node N1. The sixth transistor T6 may include a gate electrode connected to the emission control line EL, a first terminal connected to the third node N3, and a second terminal connected to a pixel electrode of the organic light-emitting diode OLED. The fifth transistor T5 and the sixth transistor T6 are simultaneously turned on according to an emission control signal EM received through the emission control line EL, and a driving current flows through the organic light-emitting diode OLED.

The seventh transistor T7 (bias transistor) may be connected between the first node N1 and a bias voltage line VBL. The seventh transistor T7 may include a gate electrode connected to the fourth gate line GBL, a first terminal connected to the bias voltage line VBL, and a second terminal connected to the first node N1. The seventh transistor T7 is turned on according to a fourth scan signal GB received through the fourth gate line GBL to apply a bias voltage VOBS to the a terminal of the first transistor T1 to preset a voltage suitable for the subsequent operation of the first transistor T1 to the first terminal.

The capacitor Cst may include a first electrode connected to the gate electrode of the first transistor T1 and a second electrode connected to the first power voltage line PL. The capacitor Cst may maintain a voltage applied to the gate electrode of the first transistor T1 by storing and maintaining a voltage corresponding to a difference between voltages at both ends of the first power voltage line PL and the gate electrode of the first transistor T1.

The initialization transistor T8 may be connected between the organic light-emitting diode OLED and the initialization voltage line VL. The initialization transistor T8 may include a gate electrode connected to the fourth gate line GBL, a first terminal connected to a second terminal of the sixth transistor T6 and the pixel electrode of the organic light-emitting diode OLED, and a second terminal connected to the initialization voltage line VL. The initialization transistor T8 may be turned on according to the fourth scan signal GB received through the fourth gate line GBL to transmit the initialization voltage Vaint to the pixel electrode of the organic light-emitting diode OLED to initialize the pixel electrode of the organic light-emitting diode OLED. The initialization transistor T8 may be turned on simultaneously with the seventh transistor T7 according to the fourth scan signal GB.

When the pixel PX shown in FIG. 5 is the first pixel PX1, the initialization voltage line VL may be the first initialization voltage line VL1, and the initialization voltage Vaint may be the first initialization voltage Vaint1. When the pixel PX shown in FIG. 5 is the second pixel PX2 or the third pixel PX, the initialization voltage line VL may be the second initialization voltage line VL2, and the initialization voltage Vaint may be the second initialization voltage Vaint2.

The organic light-emitting diode OLED may include a pixel electrode and an opposite electrode, and the opposite electrode may receive the second power voltage ELVSS. The organic light-emitting diode OLED receives a driving current from the first transistor T1 and emits light to display an image.

Figure 6:
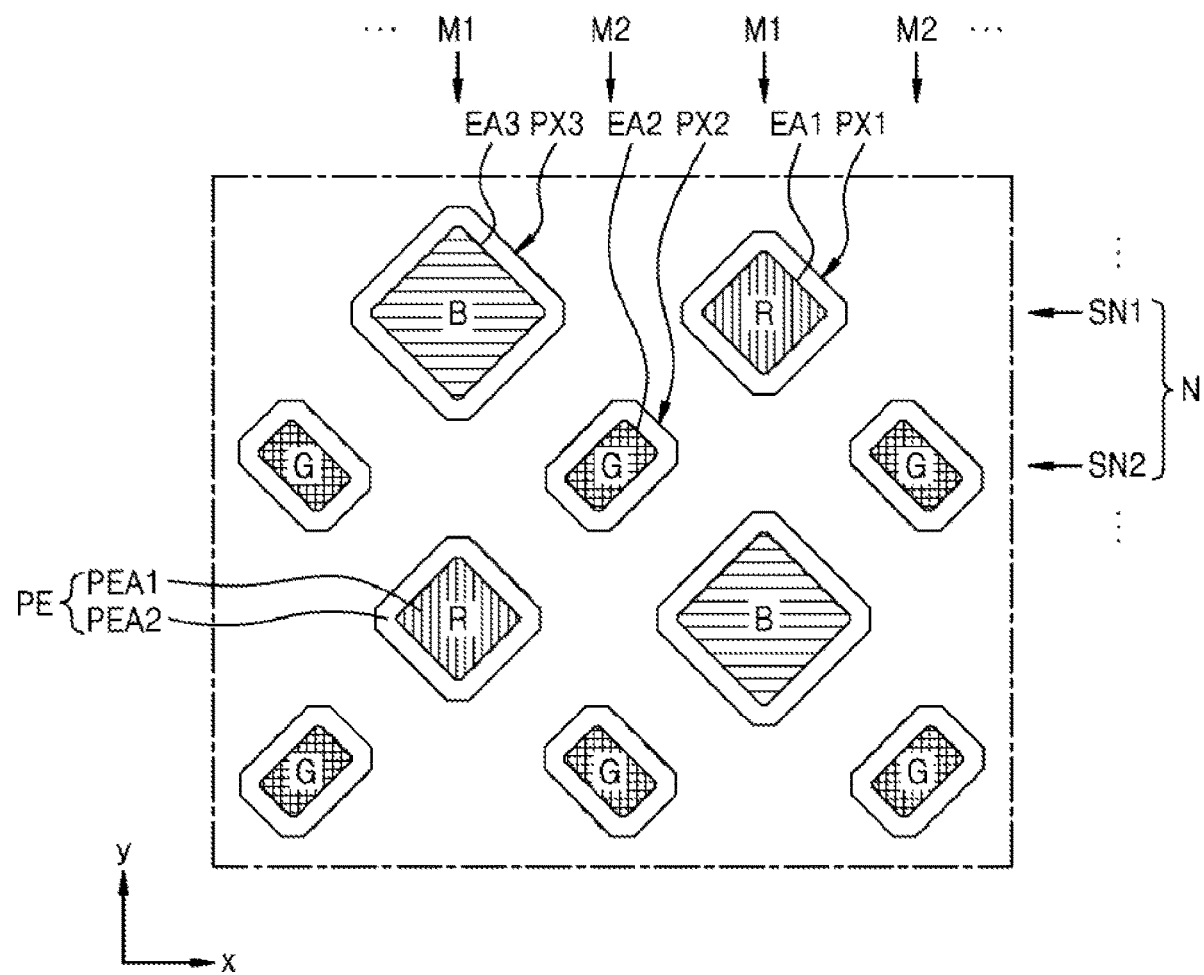
FIG. 6 is a schematic layout view illustrating a light emitting area of a plurality of pixels according to some embodiments.

FIG. 6 is a schematic layout view illustrating a light emitting area of a plurality of pixels according to some embodiments.

The plurality of pixels arranged in the display area DA may include a first pixel PX1, a second pixel PX2, and a third pixel PX3. The first pixel PX1, the second pixel PX2, and the third pixel PX3 may be repeatedly arranged in the x-direction and the y-direction according to a certain pattern. Each of the first pixel PX1, the second pixel PX2, and the third pixel PX3 may include a pixel circuit and the organic light-emitting diode OLED electrically connected to the pixel circuit. The organic light-emitting device OLED of each pixel may be on an upper layer of the pixel circuit. The organic light-emitting device OLED may be directly on top of the pixel circuit so as to overlap the pixel circuit, or may be offset from the pixel circuit to partially overlap a pixel circuit of another pixel which is arranged in an adjacent row or column.

FIG. 6 shows a pixel electrode PE and a light-emitting area of each of the first pixel PX1, the second pixel PX2, and the third pixel PX3. The light-emitting area is an area in which an emission layer of the organic light-emitting device OLED is arranged. The light-emitting area may be defined by an opening of a pixel-defining layer. This will be described later below. Each pixel electrode PE may include a first area PEA1 corresponding to the light-emitting area and a second area PEA2 surrounding the first area.

In a first column M1, a first light-emitting area EA1 of the first pixel PX1 and a third light-emitting area EA3 of the third pixel PX3 may be alternately arranged in the y-direction. In a second column M2, a second light emitting area EA2 of the second pixel PX2 may be repeatedly arranged in the y-direction. The first column M1 and the second column M2 alternate in the x-direction, arrangements of the first light emitting area EA1 of the first pixel PX1 and the third light emitting area EA3 of the third pixel PX3 of adjacent first columns M1 may be opposite to each other.

In a first sub-row SN1 of each row N, the first light-emitting area EA1 of the first pixel PX1 and the third light-emitting area EA3 of the third pixel PX3 are alternately arranged in the x-direction, and in a second sub-row SN2, the second light emitting area EA2 of the second pixel PX2 may be repeatedly arranged in the x-direction. That is, in each row N, the first light emitting area EA1 of the first pixel PX1, the second light emitting area EA2 of the second pixel PX2, the third light-emitting area EA3 of the third pixel PX3, and the second light-emitting area EA2 of the second pixel PX2 may be repeatedly arranged in a zigzag manner.

The first light-emitting area EA1 of the first pixel PX1, the second light-emitting area EA2 of the second pixel PX2, and the third light-emitting area EA3 of the third pixel PX3 have different areas. According to some embodiments, the third light-emitting area EA3 of the third pixel PX3 may be greater than the first light-emitting area EA1 of the first pixel PX1. In addition, the third light-emitting area EA3 of the third pixel PX3 may be greater than the second light-emitting area EA2 of the second pixel PX2. The first light-emitting area EA1 of the first pixel PX1 may be greater than the second light-emitting area EA2 of the second pixel PX2. According to some embodiments, the third light-emitting area EA3 of the third pixel PX3 may have the same area as the first light-emitting area EA1 of the first pixel PX1. However, the disclosure is not limited thereto. For example, the first light-emitting area EA1 of the first pixel PX1 may be greater than the second light-emitting area EA2 of the second pixel PX2 and the third light-emitting area EA3 of the third pixel PX3, and various embodiments are possible.

The first to third light-emitting areas EA1, EA2, and EA3 may have a polygonal shape such as a quadrangle, an octagon, etc., a circular shape, an elliptical shape, and the like, wherein the polygonal shape may include a shape in which corners (vertices) are rounded.

According to some embodiments, the first pixel PX1 may be a red pixel R that emits red light, the second pixel PX2 may be a green pixel G that emits green light, and the third pixel PX3 may be a blue pixel B that emits blue light.

Figure 7:
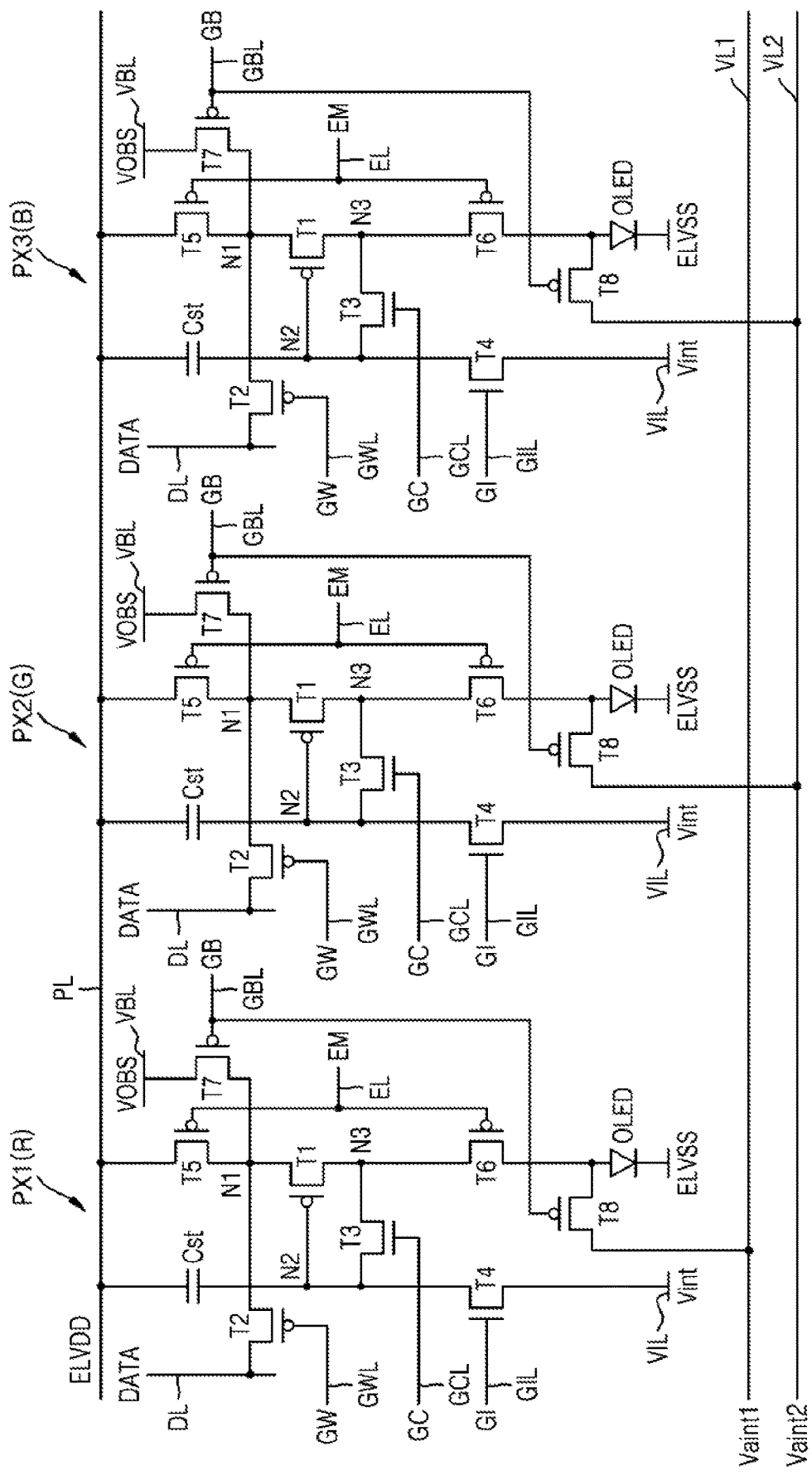
FIG. 7 is a view schematically illustrating a connection relationship between a pixel and an initialization voltage line, according to some embodiments.

FIG. 7 is a view schematically illustrating a connection relationship between a pixel and an initialization voltage line, according to some embodiments.

Referring to FIG. 7, the first pixel PX1, the second pixel PX2, and the third pixel PX3 arranged in the same row may share the first gate line GWL, the second gate line GIL, the third gate line GCL, the fourth gate line GBL, the emission control line EL, the bias voltage line VBL, and the node initialization voltage line VIL. According to some embodiments, different initialization voltages may be applied to the first pixel PX1, the second pixel PX2, and the third pixel PX3 in consideration of emission properties of the first pixel PX1, the second pixel PX2, and the third pixel PX3. For example, the first pixel PX1 may be connected to the first initialization voltage line VL1 so that the initialization transistor T8 may receive the first initialization voltage Vaint1 from the first initialization voltage line VL1. Each of the second and third pixels PX2 and PX3 is connected to the second initialization voltage line VL2, and the initialization transistor T8 may receive the second initialization voltage Vaint2 from the second initialization voltage line VL2.

Figure 8:
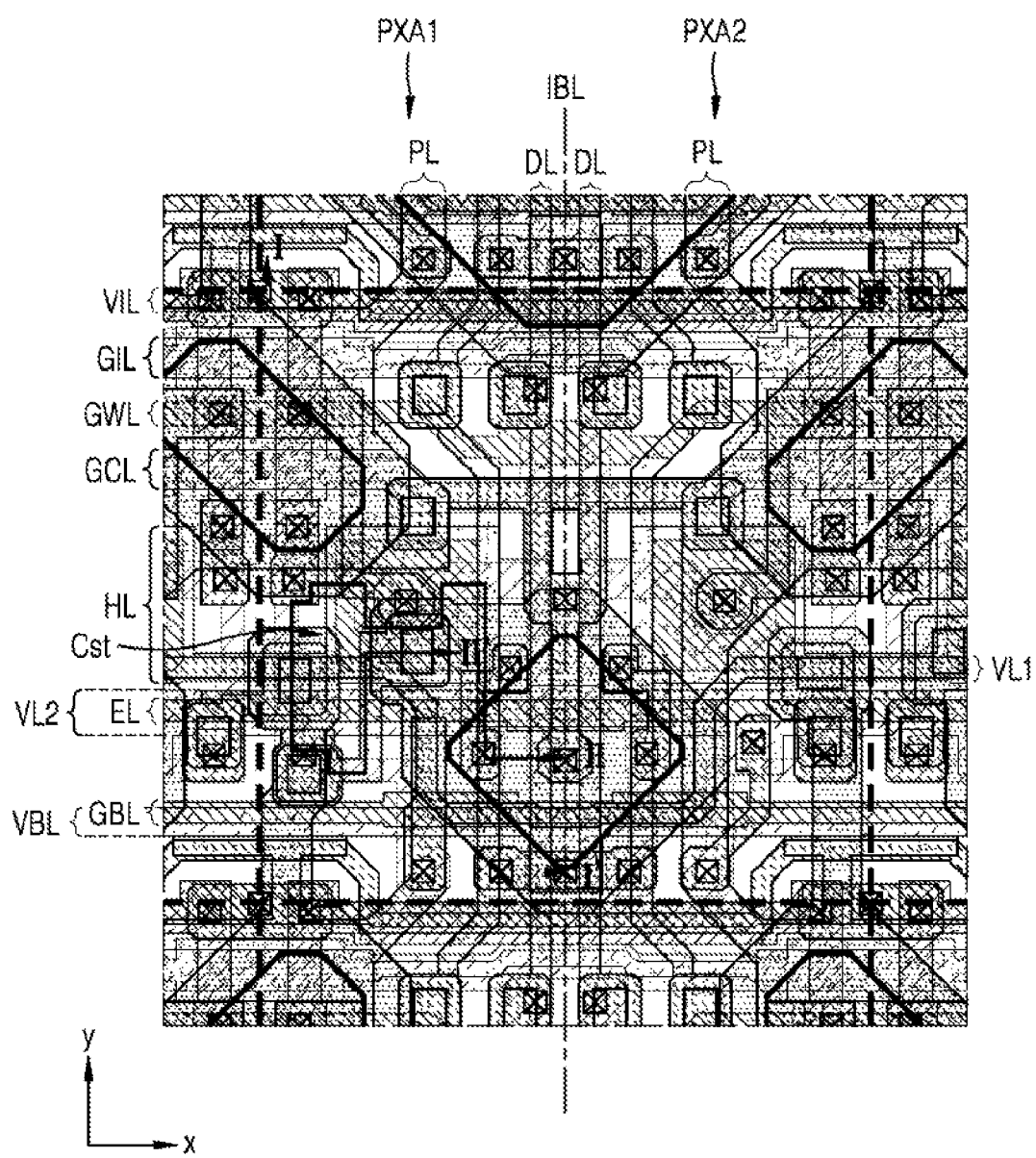
FIG. 8 is a layout schematically illustrating positions of elements constituting a pixel according to some embodiments.
Figure 9:
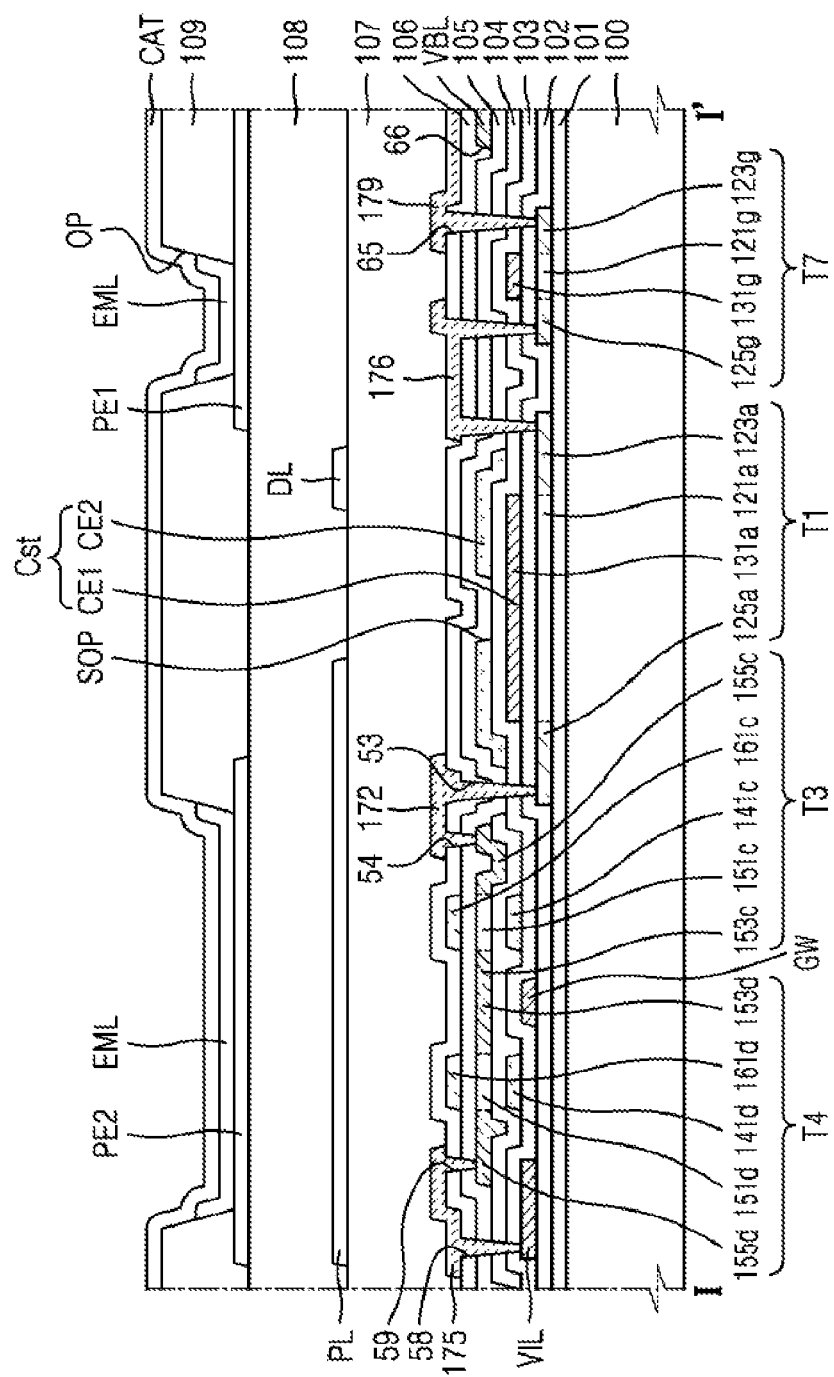
FIG. 9 is a cross-sectional view taken along the line II-II' of FIG. 8 according to some embodiments.
Figure 10:
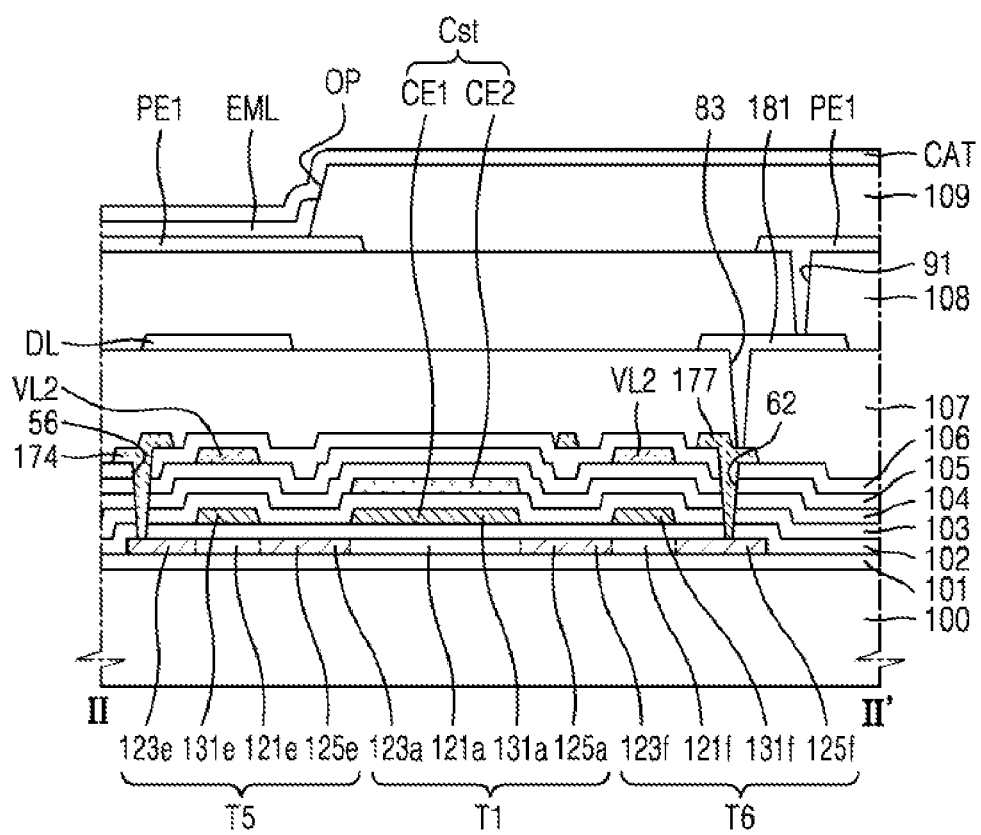
FIG. 10 is a cross-sectional view taken along II-II' of FIG. 8 according to some embodiments.
Figure 16:
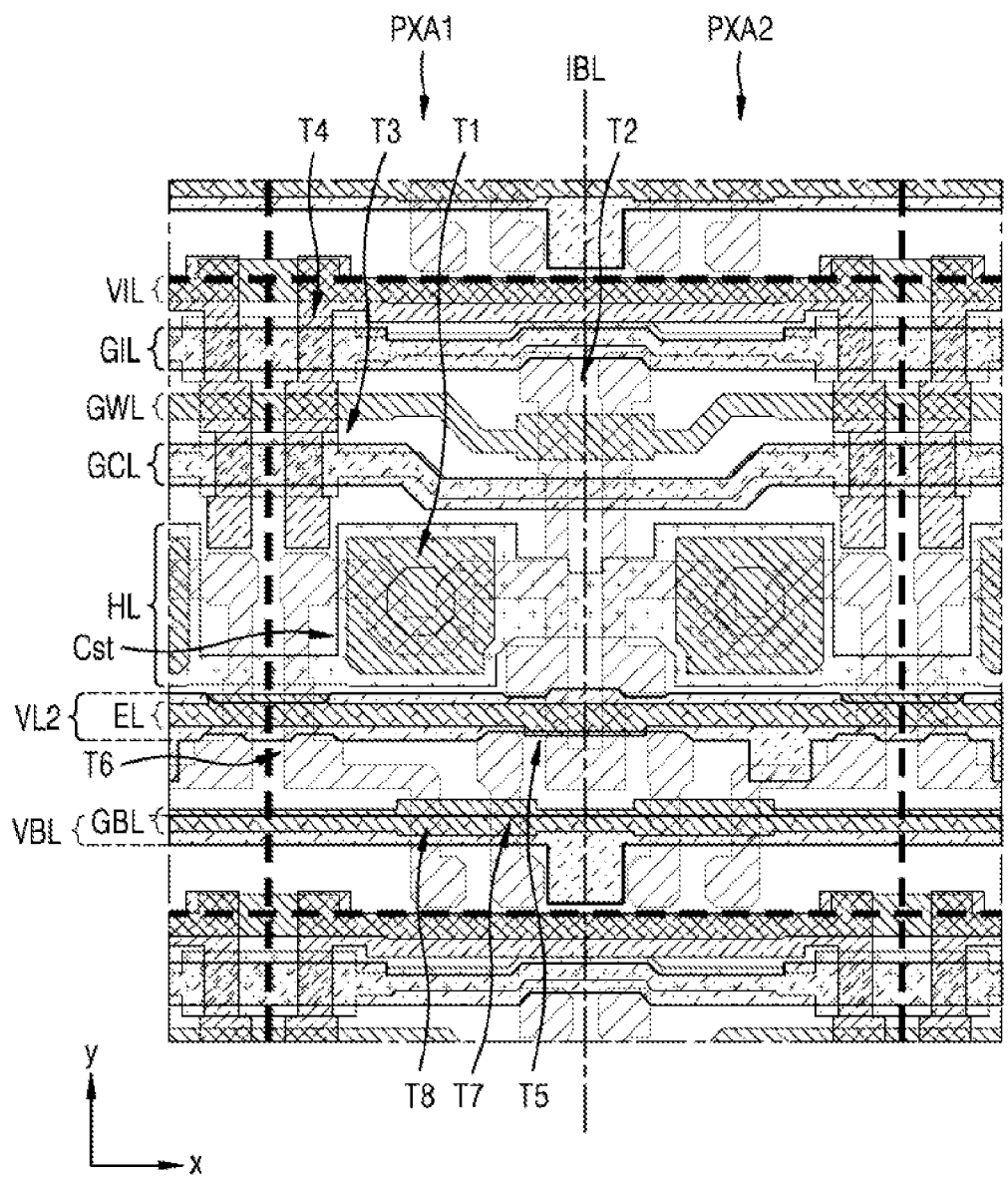
Figure 17:
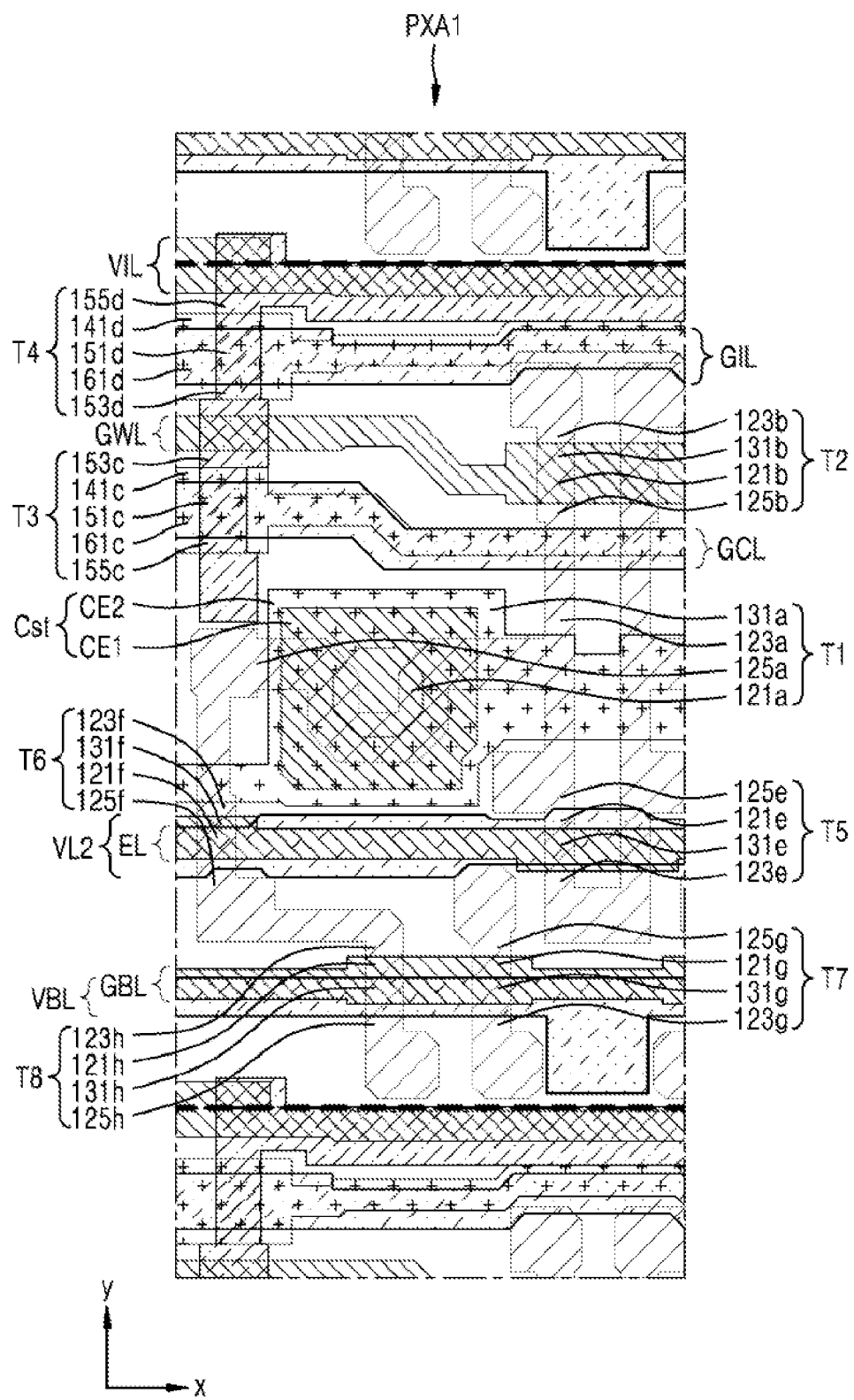

FIG. 8 is a layout schematically illustrating positions of elements constituting a pixel according to some embodiments. FIG. 9 is a cross-sectional view taken along line II' of FIG. 8. FIG. 10 is a cross-sectional view taken along II-II' of FIG. 8. FIGS. 11 to 25 are layer layouts of the elements of FIG. 8. FIG. 16 is a plan view in which the elements of FIGS. 11 to 15 are superimposed. FIG. 17 is a plan view of a portion of FIG. 16, illustrating the first to seventh transistors T1 to T7, the initialization transistor T8, and the capacitor Cst of a first pixel area PXA1.

According to the pixel arrangement shown in FIG. 6, in each row on the substrate 100, the first pixel area PXA1 in which a pixel circuit of the first pixel PX1 or the third pixel PX3 is arranged and a second pixel area PXA2 in which a pixel circuit of the second pixel PX2 is arranged in the x-direction may be repeated in the x-direction. Each of the first pixel PX1, the second pixel PX2, and the third pixel PX3 includes the initialization transistor T8, and thus the initialization transistor T8 of the first pixel PX1 or the third pixel PX3 is arranged in the first pixel area PXA1, and the initialization transistor T8 of the second pixel PX2 may be arranged in the second pixel area PXA2. The pixel circuit in the first pixel area PXA1 and the pixel circuit in the second pixel area PXA2 may be line-symmetric with respect to a boundary line IBL. Accordingly, the initialization transistor T8 in the first pixel area PXA1 and the initialization transistor T8 in the second pixel area PXA2 may be line-symmetric with respect to the boundary line IBL.

Hereinafter, an example in which the pixel circuit of the first pixel PX1 is arranged in the first pixel area PXA1 and the pixel circuit of the second pixel PX2 is arranged in the second pixel area PXA2 will be described. Because the same elements may be located on each layer of the first pixel area PXA1 and the second pixel area PXA2, for convenience of description, elements of the pixel circuit in the first pixel area PXA1 will be mainly described.

Figure 11:
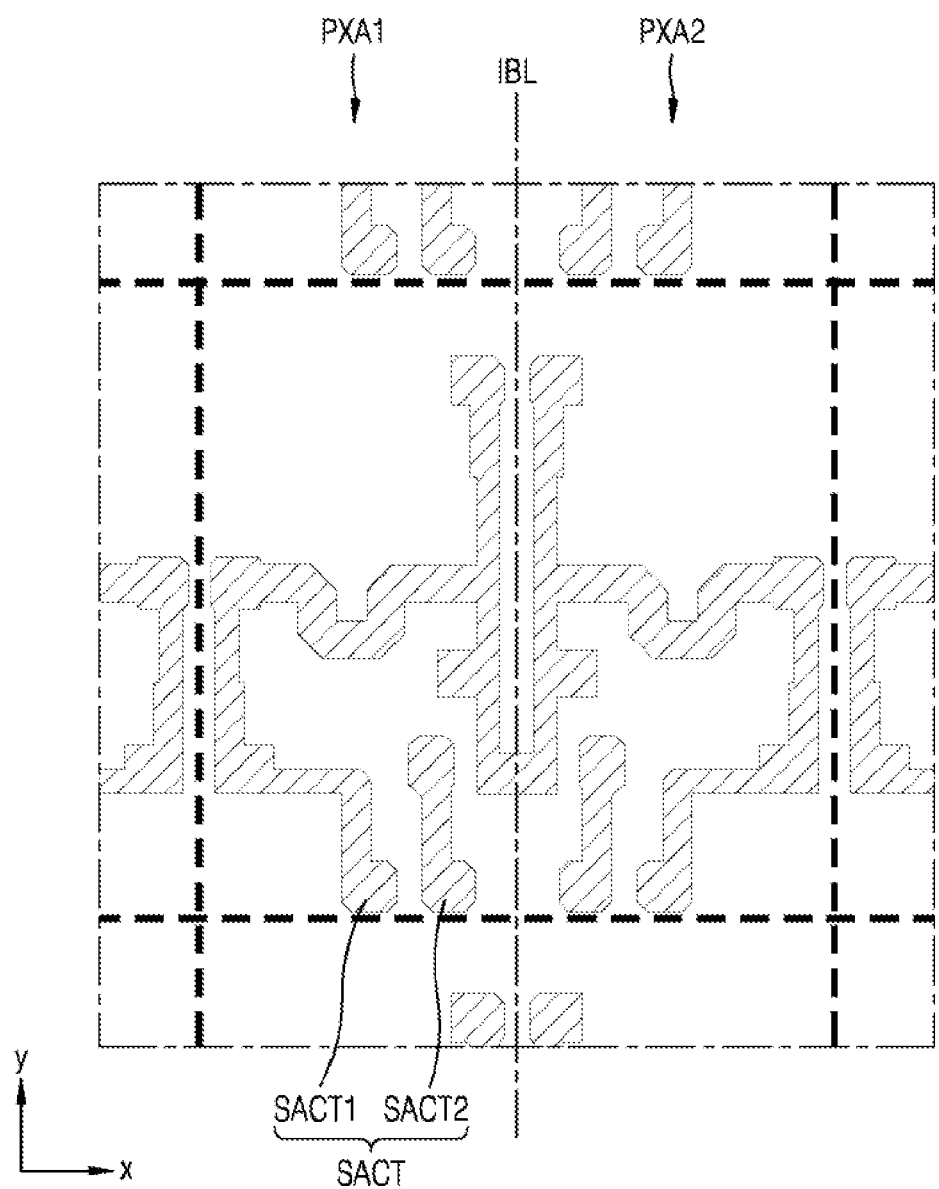
FIGS. 11 to 25 are layer layouts of the elements of FIG. 8 according to some embodiments.

As shown in FIGS. 9 to 11, a buffer layer 101 may be on the substrate 100, and a first semiconductor layer SACT may be on the buffer layer 101. The first semiconductor layer SACT may include a silicon semiconductor. The first semiconductor layer SACT may include a first sub-semiconductor layer SACT1 and a second sub-semiconductor layer SACT2 separated from the first sub-semiconductor layer SACT1. The first sub-semiconductor layer SACT1 of the first pixel area PXA1 may be integrally provided with the first sub-semiconductor layer SACT1 of the second pixel area PXA2. The second sub-semiconductor layer SACT2 may be electrically connected to the first sub-semiconductor layer SACT1 as described below.

The first sub-semiconductor layer SACT1 may have variously curved shapes. The first sub-semiconductor layer SACT1 may include a channel area of each of the first transistor T1, the second transistor T2, the fifth transistor T5, the sixth transistor T6, and the initialization transistor T8, and a source area and a drain area on both sides of the channel area. The second sub-semiconductor layer SACT2 may include a channel area, a source area, and a drain area of the seventh transistor T7.

Referring to FIG. 17, the first sub-semiconductor layer SACT1 may include a channel area 121a, a source area 123a, and a drain area 125a of the first transistor T1, a channel area 121b, a source area 123b, and a drain area 125b of the second transistor T2, a channel area 121e, a source area 123e, and a drain area 125e of the fifth transistor T5, a channel area 121f, a source area 123f, and a drain area 125f of the sixth transistor T6, and a channel area 121h, a source area 123h, and a drain area 125h of the initialization transistor T8. The second sub-semiconductor layer SACT2 may include the channel area 121g, the source area 123g, and a drain area 125g of the seventh transistor T7. The channel area 121a of the first transistor T1 has a curve so that a driving range of a gate voltage applied to a gate electrode may be widened. The shape of the channel area 121a of the first transistor T1 may be 'ㄷ', 'ㄹ', 'S', 'M', 'W', and the like.

Figure 12:
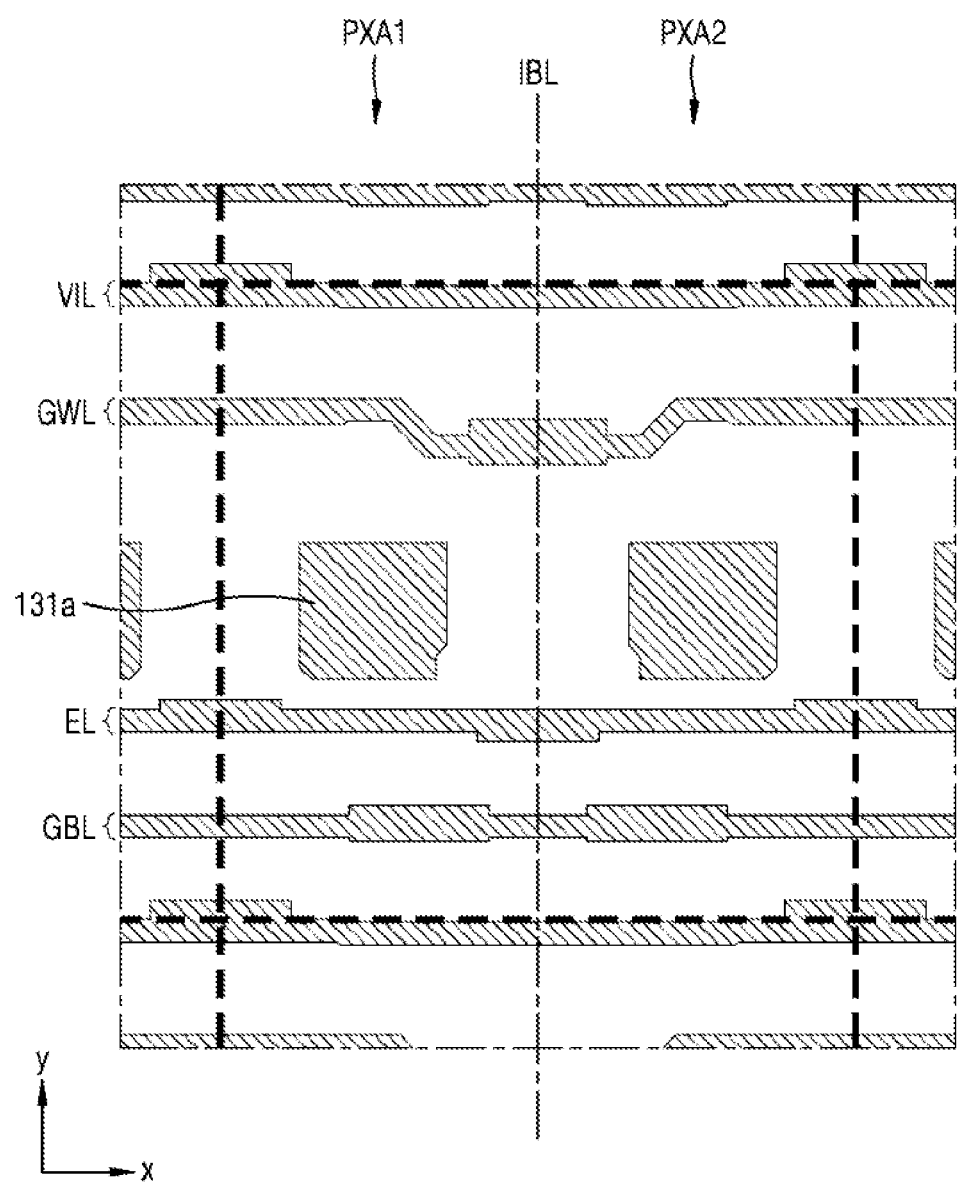

As shown in FIGS. 9, 10 and 12, a first insulating layer 102 may be on the buffer layer 101 to cover the first semiconductor layer SACT1, a gate electrode 131a of the first transistor T1 is on the first insulating layer 102 in the form of an island, and the node initialization voltage line VIL, the first gate line GWL, the emission control line EL, and the fourth gate line GBL may be formed to extend in the x-direction.

Referring to FIG. 17, the gate electrode 131a of the first transistor T1 may be a lower electrode CE1 that is a first electrode of the capacitor Cst. A gate electrode 131b of the second transistor T2 may be a portion of the first gate line GWL crossing (overlapping) the first sub-semiconductor layer SACT1. A gate electrode 131e of the fifth transistor T5 and a gate electrode 131f of the sixth transistor T6 may be portions of the emission control line EL crossing the first sub-semiconductor layer SACT1. A gate electrode 131g of the seventh transistor T7 may be a portion of the fourth gate line GBL crossing the second sub-semiconductor layer SACT2. A gate electrode 131h of the initialization transistor T8 may be a portion of the fourth gate line GBL crossing the first sub-semiconductor layer SACT1.

Figure 13:
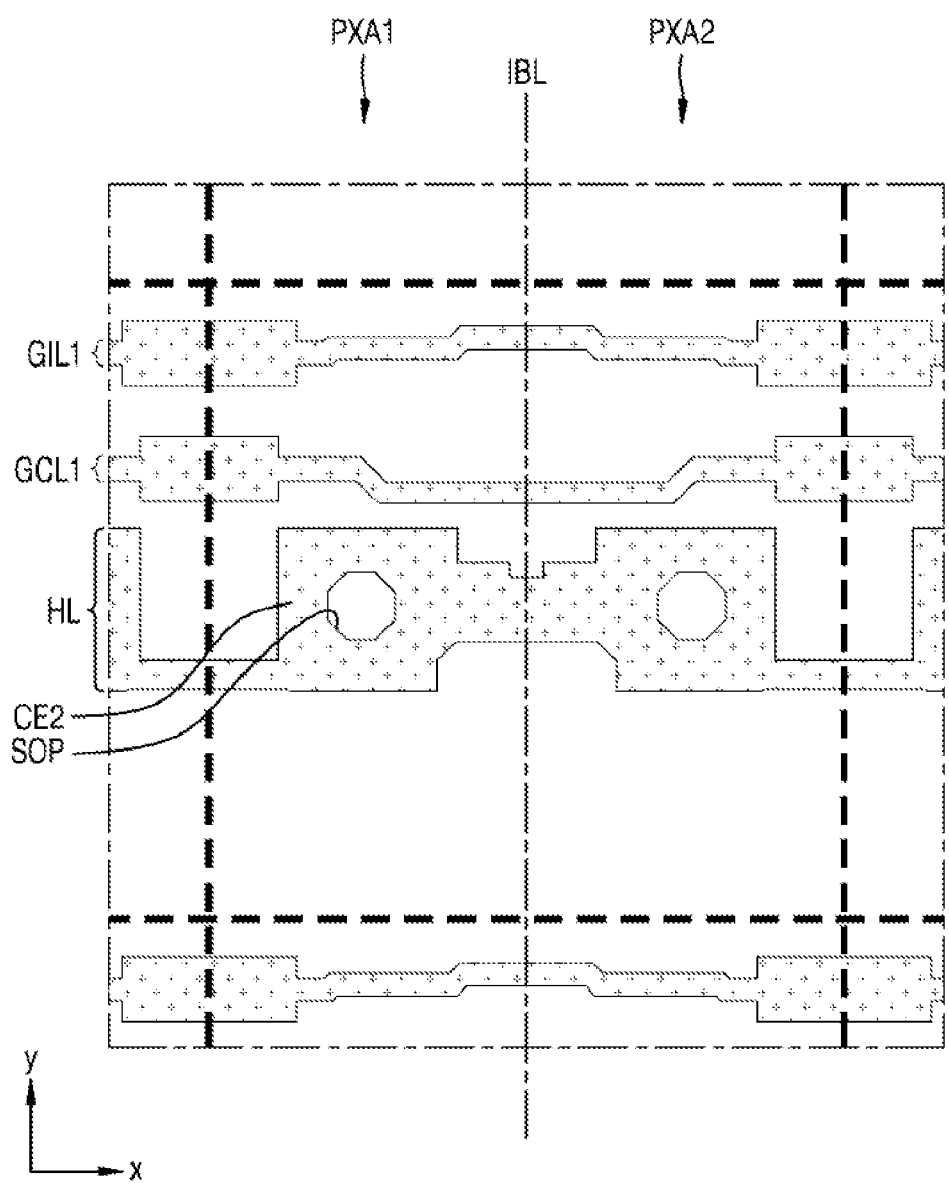

As shown in FIGS. 9, 10, and 13, a second insulating layer 103 may be on the first insulating layer 102, and an electrode voltage line HL, a lower gate line GIL1 of the second gate line GIL, and a lower gate line GCL1 of the third gate line GCL may be on the second insulating layer 103 to extend in the x-direction.

A portion of the electrode voltage line HL is an upper electrode CE2 that is a second electrode of the capacitor Cst, and may cover the lower electrode CE1 of the capacitor Cst. Upper electrodes CE2 of the capacitors Cst of pixel circuits in the same row may be connected to each other by the electrode voltage line HL. An opening SOP may be formed in the upper electrode CE2 of the capacitor Cst.

Figure 14:
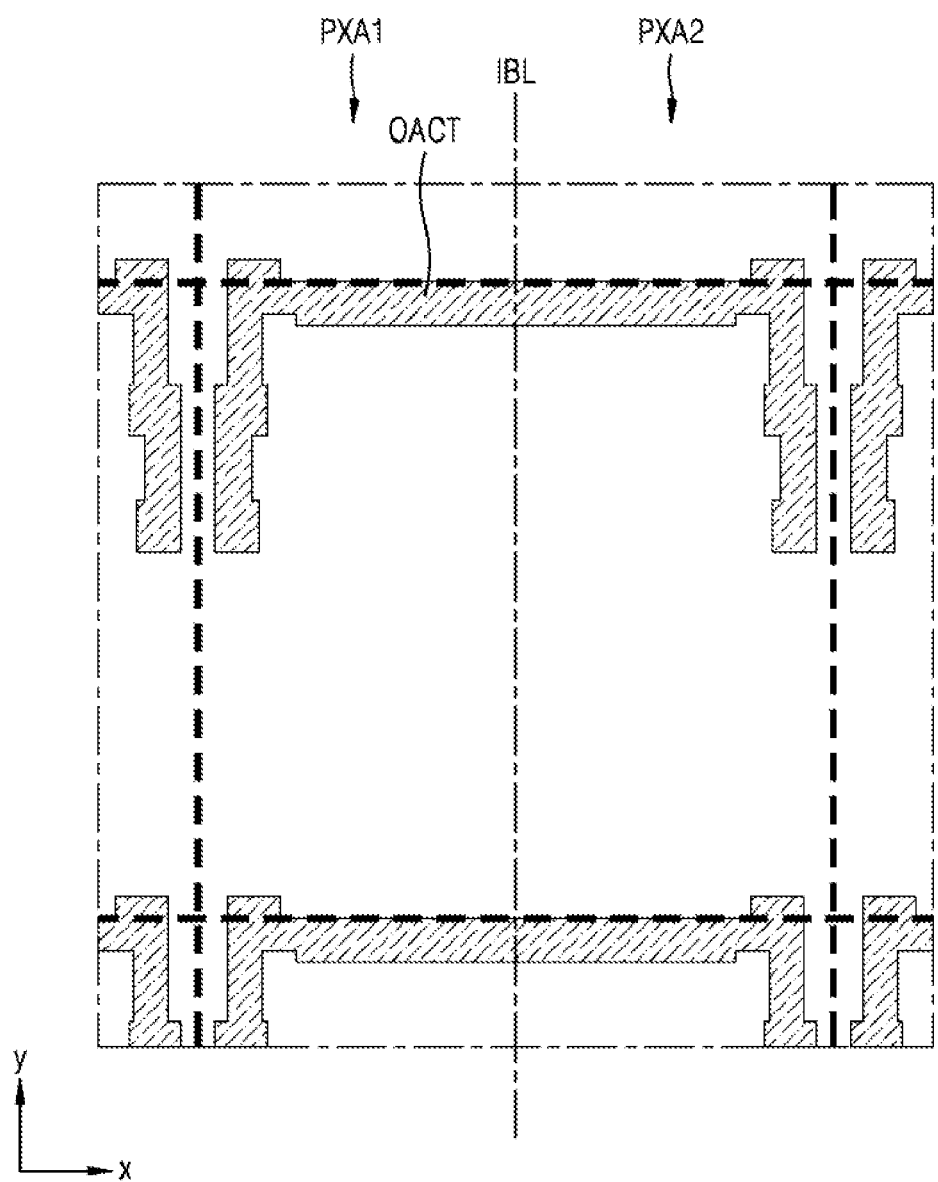

As shown in FIGS. 9, 10, and 14, a third insulating layer 104 may be on the second insulating layer 103, and a second semiconductor layer OACT may be on the third insulating layer 104. The second semiconductor layer OACT may include an oxide semiconductor. The second semiconductor layer OACT of the first pixel area PXA1 may be integrally provided by being connected to the second semiconductor layer OACT of the second pixel area PXA2. The second semiconductor layer OACT may include a channel area, a source area, and a drain area of each of the third transistor T3 and the fourth transistor T4.

Referring to FIG. 17, the second semiconductor layer OACT may include a channel area 151c, a source area 153c, and a drain area 155c of the third transistor T3, and a channel area 151d, a source area 153d, and a drain area 155d of the fourth transistor T4.

That is, a channel area, a source area, and a drain area of each of the first to seventh transistors T1 to T7 and the initialization transistor T8 may be understood as partial areas of a semiconductor layer. The source area and the drain area of the semiconductor layer may correspond to a first terminal (or second terminal) and a second terminal (or first terminal) of the transistor illustrated in FIG. 5, respectively. The source area or the drain area may be a source electrode or a drain electrode of a transistor in some cases. For example, a source electrode and a drain electrode of the first transistor T1 may respectively correspond to the source area 123a and the drain area 125a doped with impurities near the channel area 121a.

Figure 15:
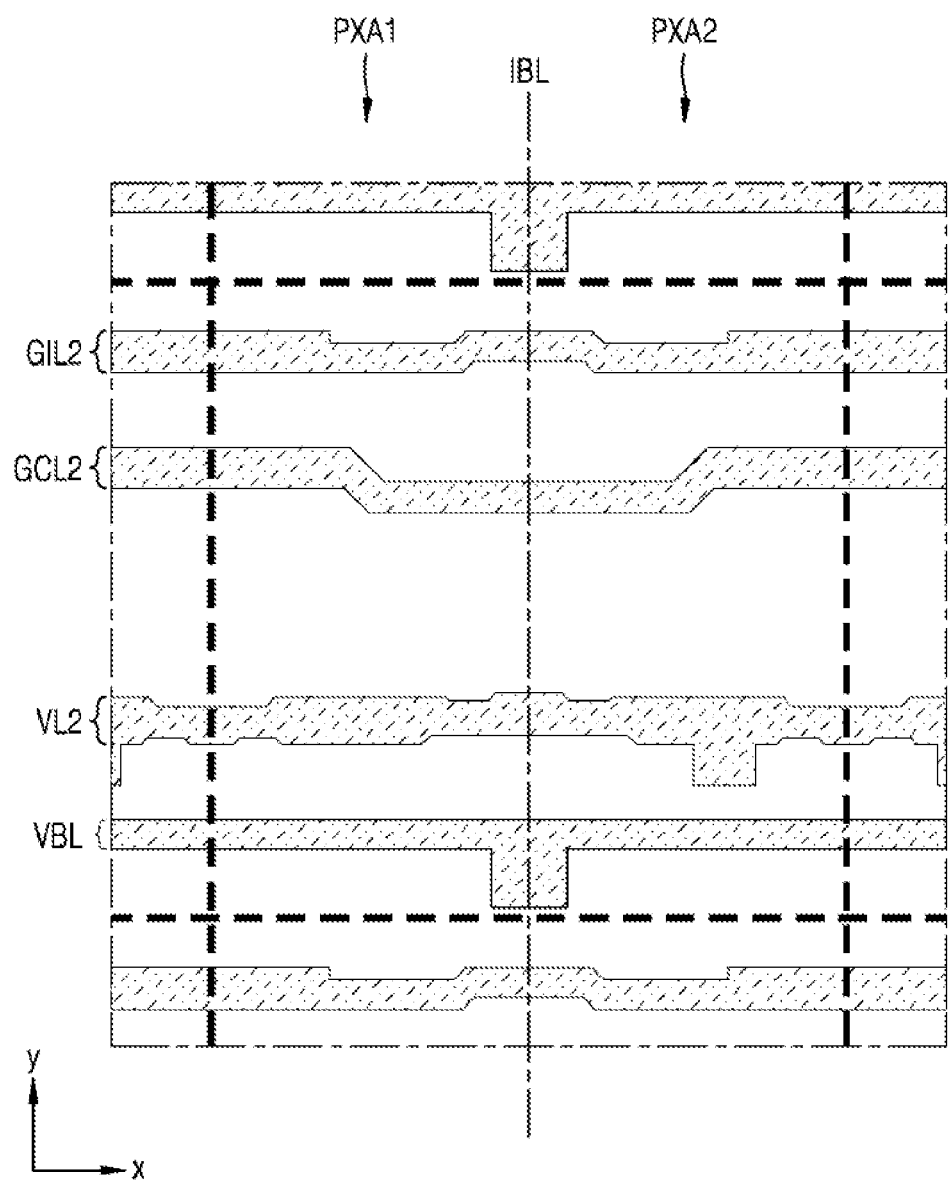

As shown in FIGS. 9, 10, and 15, a fourth insulating layer 105 may be on the third insulating layer 104, and an upper gate line GIL2 of the second gate line GIL, an upper gate line GCL2 of the third gate line GCL, the second initialization voltage line VL2, and the bias voltage line VBL may be on the fourth insulating layer 105 to extend in the x-direction.

Referring to FIG. 17, a gate electrode of the third transistor T3 may be a portion of the third gate line GCL crossing (overlapping) the second semiconductor layer OACT. The gate electrode of the third transistor T3 may include a lower gate electrode 141c that is a portion of the lower gate line GCL1 of the third gate line GCL and an upper gate electrode 161c that is a portion of the upper gate line GCL2. The gate electrode of the fourth transistor T4 may include a lower gate electrode 141d that is a portion of the lower gate line GIL1 of the second gate line GIL and an upper gate electrode 161d that is a portion of the upper gate line GIL2. That is, the third transistor T3 and the fourth transistor T4 may have a double gate structure in which control electrodes are respectively provided on upper and lower portions of the second semiconductor layer OACT.

The second initialization voltage line VL2 may overlap the emission control line EL. The bias voltage line VBL may overlap the fourth gate line GBL.

Figure 18:
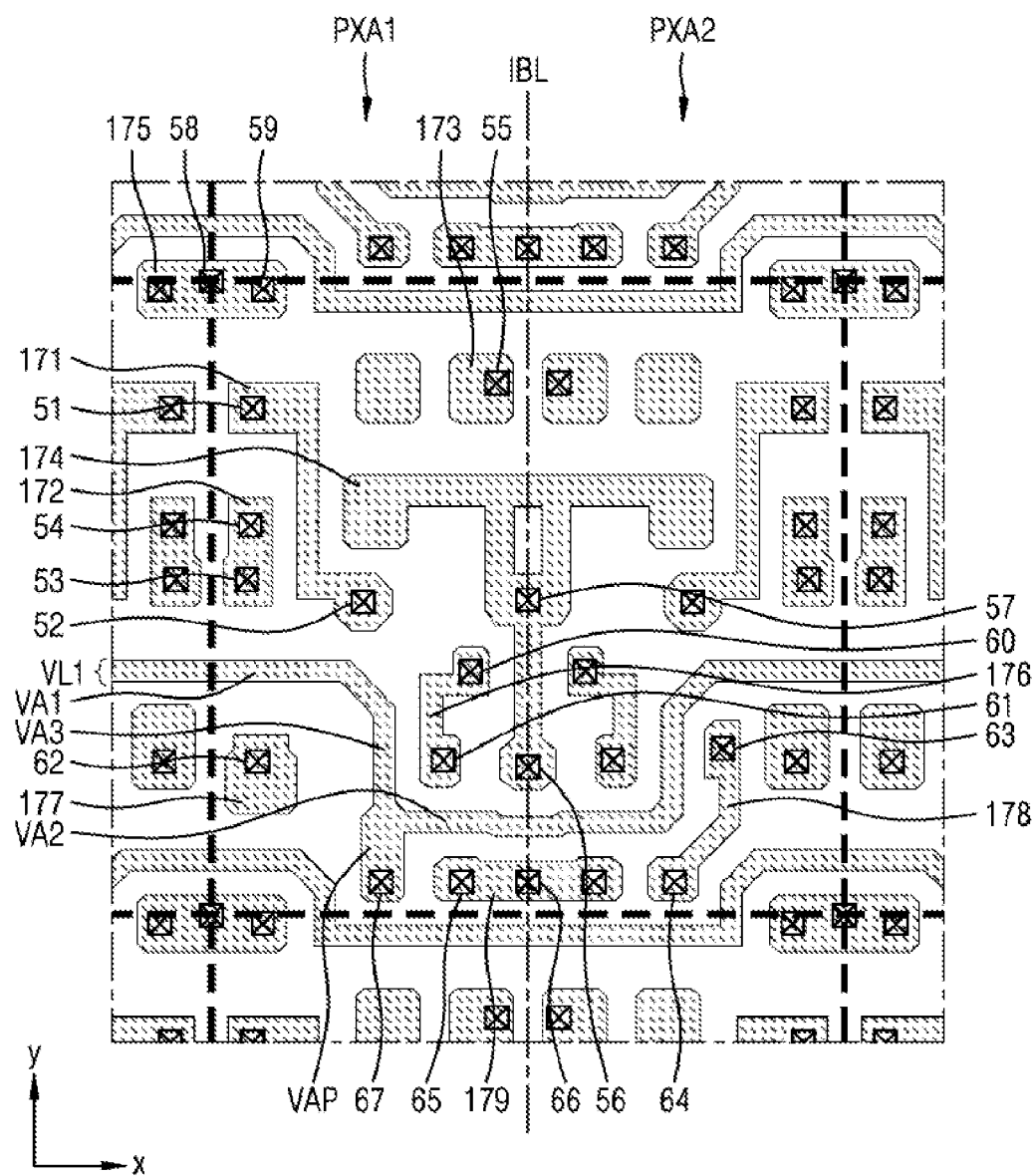

As shown in FIGS. 9, 10, and 18, a fifth insulating layer 106 may be on the fourth insulating layer 105, and the first initialization voltage line VL1 may be on the fifth insulating layer 106 to extend in the x-direction. In addition, connection electrodes 171 to 179 may be on the fourth insulating layer 105.

Figure 19:
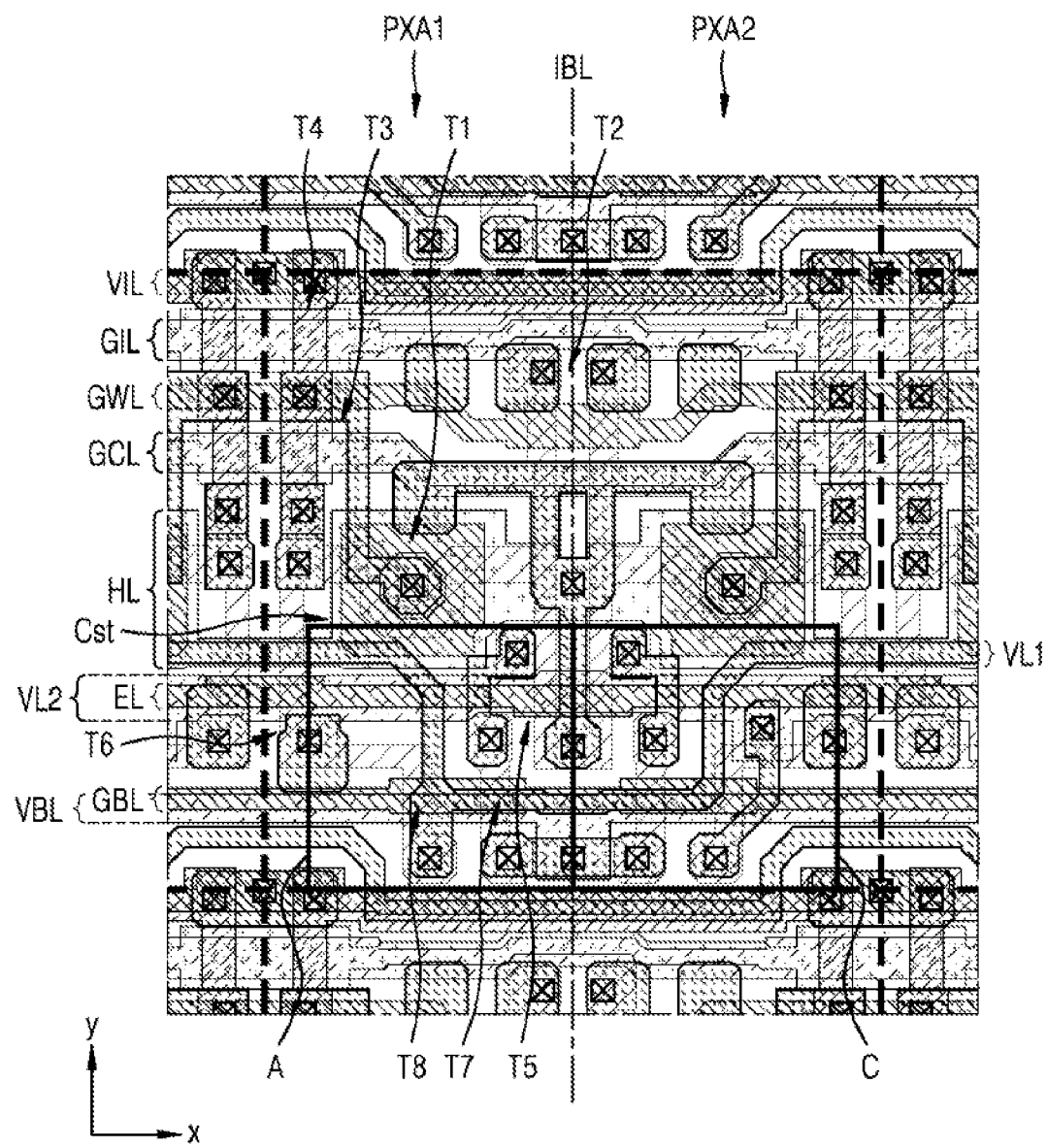
Figure 20:
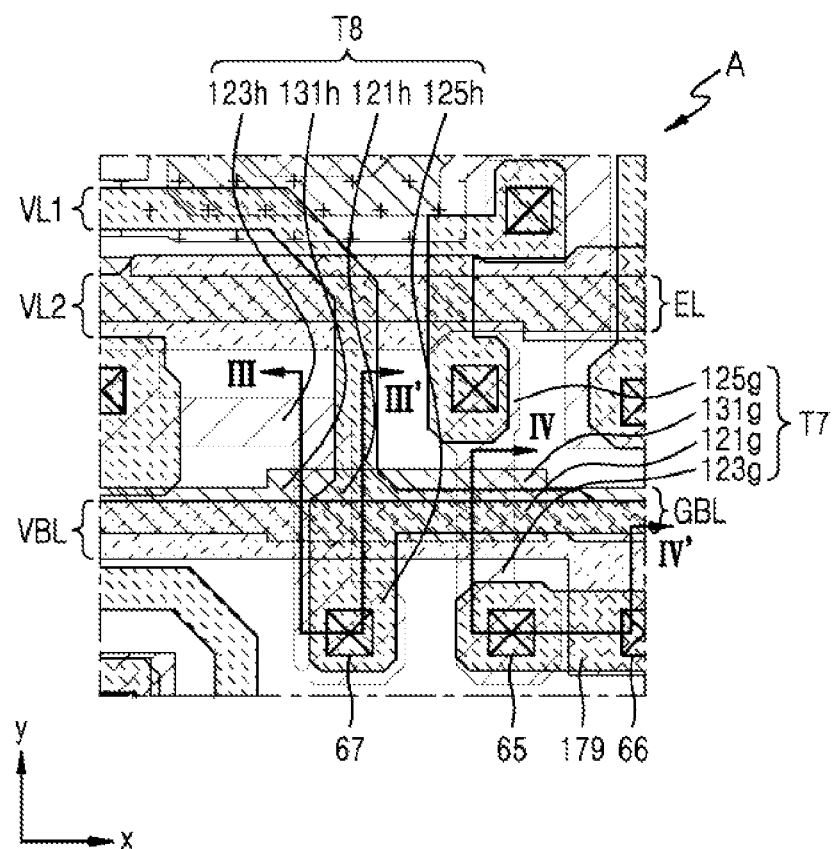
Figure 21:
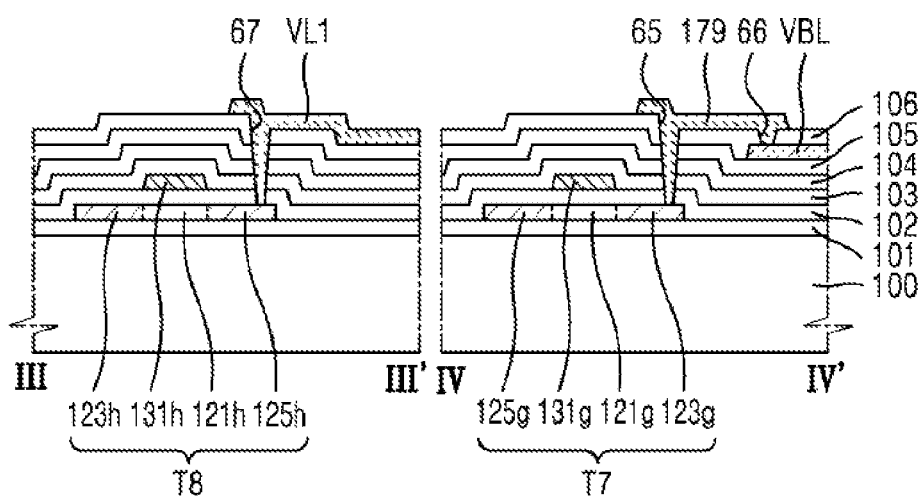
Figure 22:
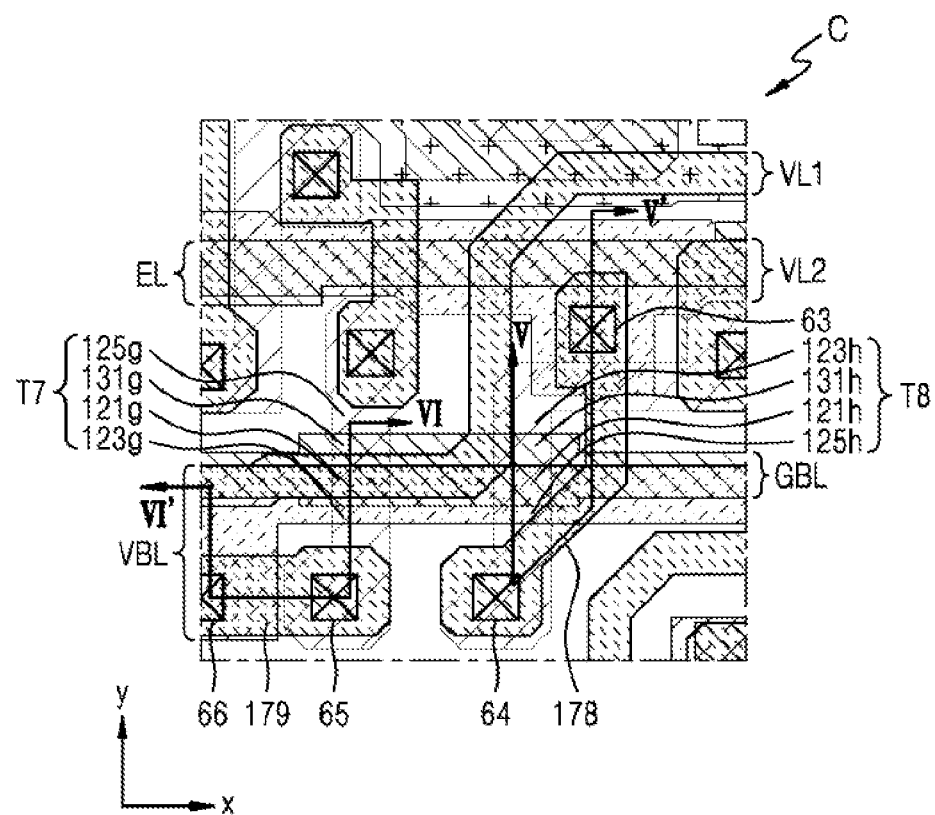
Figure 23:
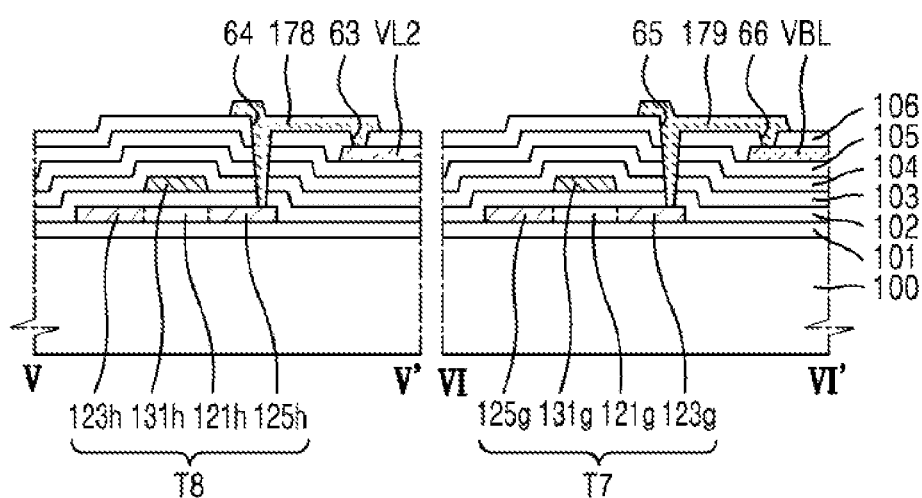

FIG. 19 is a plan view in which the elements of FIGS. 11 to 15 and 18 overlapping each other. FIG. 20 is an enlarged view of portion A of FIG. 19. FIG. 21 is a cross-sectional view taken along lines III-Ill' and IV-IV' of FIG. 20. FIG. 22 is an enlarged view of portion B of FIG. 19. FIG. 23 is a cross-sectional view taken along lines V-V and VI-VI' of FIG. 22. Hereinafter, it will be described with reference to FIGS. 18 to 23 together.

The first initialization voltage line VL1 may be electrically connected to the drain area 125h of the initialization transistor T8 in the first pixel area PXA1 in which the pixel circuit of the first pixel PX1 is arranged. The first initialization voltage line VL1 may be electrically connected to the drain area 125h of the initialization transistor T8 of the first pixel PX1 through a contact hole 67 penetrating the first to fourth insulating layers 102 to 105.

The first initialization voltage line VL1 has a curve and may extend in the x-direction in a zigzag shape. The first initialization voltage line VL1 may include a first portion VA1 and a second portion VA2 extending in the x-direction and a third portion VA3 extending in the y-direction and connecting the first portion VA1 to the second portion VA2. The first portion VA1 and the second portion VA2 may be apart from each other in the y-direction, and the light emission control line EL and the second initialization voltage line VL2 may be between the first portion VA1 and the second portion VA2 in a plan view. The first portion VA1 may partially overlap the first electrode CE1 and the second electrode CE2 of the capacitor Cst. The second portion VA2 may partially overlap the fourth gate line GBL and the bias voltage line VBL. The third portion VA3 may cross the second initialization voltage line VL2 and a portion may overlap the second initialization voltage line VL2.

The first initialization voltage line VL1 may further include a fourth portion VAP protruding from the second portion VA2 or the third portion VA3 at a position where the second portion VA2 and the third portion VA3 contact each other. The fourth portion VAP may be provided only in the first pixel area PXA1 in which the first pixel PX1 is arranged from among the first pixel areas PXA1. The fourth portion VAP overlaps a semiconductor layer (e.g., the drain area 125h of the initialization transistor T8) of the initialization transistor T8 of the first pixel PX1 and may directly contact the semiconductor layer through the contact hole 67.

One end of the connection electrode 171 may contact the second semiconductor layer OACT through a contact hole 51 to be electrically connected to the second semiconductor layer OACT. Referring to FIG. 18, one end of the connection electrode 171 may be electrically connected to the source area 153c of the third transistor T3 and the drain area 155d of the fourth transistor T4 through the contact hole 51 penetrating the fourth and fifth insulating layers 105 and 106. The other end of the connection electrode 171 may be electrically connected to the gate electrode 131a of the first transistor T1 through a contact hole 52 penetrating the second to fifth insulating layers 103 to 106. The contact hole 52 may be apart from an edge of the opening SOP in the opening SOP of the second electrode CE2 of the capacitor Cst, and the connection electrode 171 may be electrically insulated from the second electrode CE2.

The connection electrode 172 may be electrically connected to the drain area 125a of the first transistor T1 and the source area 123f of the sixth transistor T6 through a contact hole 53 penetrating the first to fifth insulating layers 102 to 106. The connection electrode 172 may be electrically connected to the drain area 155c of the third transistor T3 through a contact hole 54 penetrating the fourth and fifth insulating layers 105 and 106.

The connection electrode 173 may be electrically connected to the source area 123b of the second transistor T2 through a contact hole 55 penetrating the first to fifth insulating layers 102 to 106.

The connection electrode 174 may be electrically connected to the source area 123e of the fifth transistor T5 through a contact hole 56 penetrating the first to fifth insulating layers 102 to 106. The connection electrode 174 may be electrically connected to the electrode voltage line HL through a contact hole 57 penetrating the third to fifth insulating layers 104 to 106.

The connection electrode 175 may be electrically connected to the node initialization voltage line VIL through a contact hole 58 penetrating the second to fifth insulating layers 103 to 106. The connection electrode 175 may be electrically connected to the drain area 155d of the fourth transistor T4 through a contact hole 59 penetrating the fourth and fifth insulating layers 105 and 106.

The connection electrode 176 may be electrically connected to the source area 123a of the first transistor T1 and the drain area 125e of the fifth transistor T5 through a contact hole 60 penetrating the first to fifth insulating layers 102 to 106. The connection electrode 176 may be electrically connected to the drain area 125g of the seventh transistor T7 through a contact hole 61 penetrating the first to fifth insulating layers 102 to 106.

The connection electrode 177 may be electrically connected to the drain area 125f of the sixth transistor T6 through a contact hole 62 penetrating the first to fifth insulating layers 102 to 106.

The connection electrode 178 may be arranged in the second pixel area PXA2 in which the pixel circuit of the second pixel PX2 is arranged, and the first pixel area PXA1 in which the pixel circuit of the third pixel PX3 from among the first pixel areas PXA1 is arranged. The connection electrode 178 may be electrically connected to the drain area 125h of the initialization transistor T8 of the second pixel PX2 and the third pixel PX3 through contact hole 64 penetrating the first to fourth insulating layers 102 to 105. The connection electrode 178 may be electrically connected to the second initialization voltage line VL2 through a contact hole 63 penetrating the fifth insulating layer 106. The connection electrode 178 overlaps a semiconductor layer of the initialization transistor T8 and may directly contact the semiconductor layer through the contact hole 64, and overlaps the second initialization voltage line VL2 and may directly contact the second initialization voltage line VL2 through the contact hole 63.

The connection electrode 179 may be electrically connected to the source area 123g of the seventh transistor T7 through a contact hole 65 penetrating the first to fifth insulating layers 102 to 106. The connection electrode 179 may be electrically connected to the bias voltage line VBL through a contact hole 66 penetrating the fifth insulating layer 106.

Figure 24:
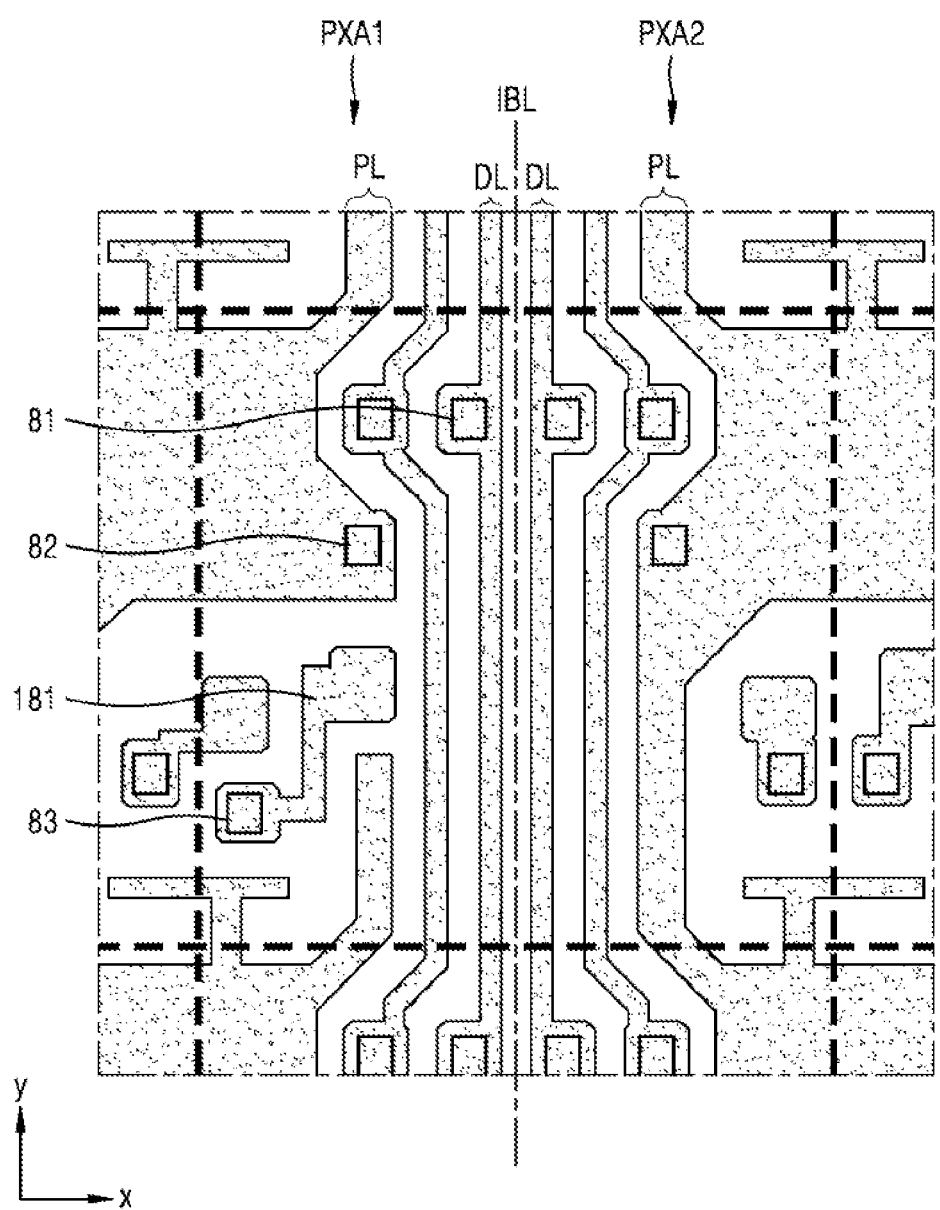

As shown in FIGS. 9, 10, and 24, a sixth insulating layer 107 may be on the fifth insulating layer 106, a connection electrode 181 may be on the sixth insulating layer 107, and the data line DL and the first power voltage line PL may extend in the y-direction. Various conductive layers may be further arranged on the sixth insulating layer 107.

The data line DL may be electrically connected to the connection electrode 173 through a contact hole 81 penetrating the sixth insulating layer 107, and may be electrically connected to the source area 123b of the second transistor T2.

The first power voltage line PL may be electrically connected to the connection electrode 174 through a contact hole 82 penetrating the sixth insulating layer 107. As a result, the first power voltage line PL extending in the y-direction may have a mesh structure by being connected to the electrode voltage line HL extending in the x-direction. According to some embodiments, as shown in FIG. 24, the first power voltage line PL may be cut off in some pixel areas of the display area DA. This is merely an example, and the first power voltage line PL may extend in the y-direction without a break in the display area DA.

The connection electrode 181 may be electrically connected to the connection electrode 172 through a contact hole 83 penetrating the sixth insulating layer 107, and may be electrically connected to the source area 123f of the sixth transistor T6.

Figure 25:
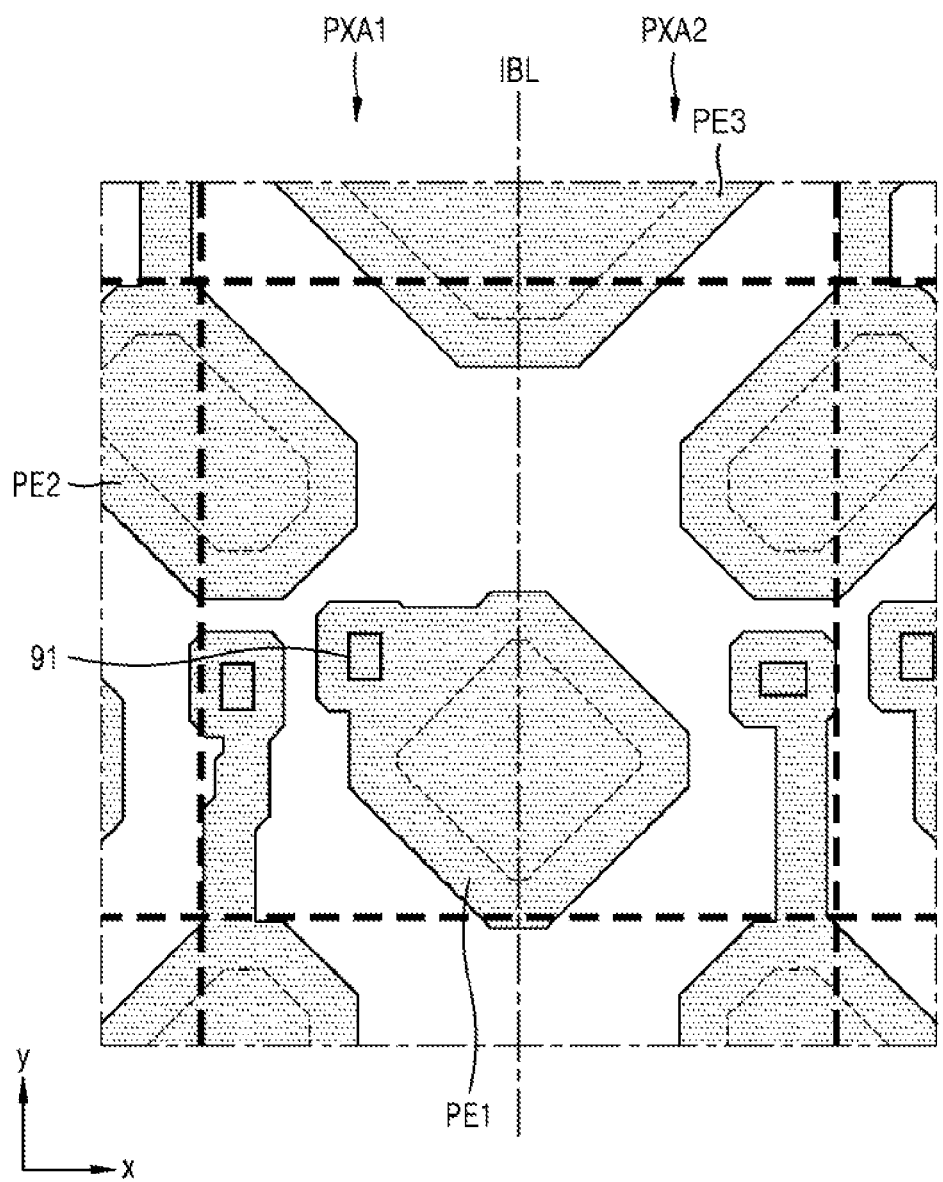

As shown in FIGS. 9, 10, and 25, a seventh insulating layer 108 may be on the sixth insulating layer 107, and a pixel electrode may be on the seventh insulating layer 108. FIG. 25 shows a pixel electrode PE1 of the first pixel PX1, a pixel electrode PE2 of the second pixel PX2, and a pixel electrode PE3 of the third pixel PX3. Each of the pixel electrodes PE1, PE2, and PE3 may include a first area corresponding to a light-emitting area and a second area surrounding the first area.

The pixel electrode PE1 is electrically connected to the connection electrode 181 through a contact hole 91 penetrating the seventh insulating layer 108, and may be electrically connected to the first transistor T1 through the sixth transistor T6. The contact hole 91 may overlap the second area of the pixel electrode PE1.

An eighth insulating layer 109 serving as a pixel-defining layer may be on the pixel electrode PE1. The eighth insulating layer 109 defines a pixel by having an opening OP corresponding to the light-emitting area of each pixel. An emission layer EML may be arranged in the opening OP of the eighth insulating layer 109, and an opposite electrode CAT may be on the emission layer EML. The pixel electrode PE1, the emission layer EML, and the opposite electrode CAT may constitute an organic light-emitting diode. The opposite electrode CAT may be integrally formed in a plurality of organic light-emitting diodes to correspond to a plurality of pixel electrodes. According to some embodiments, at least one functional layer may be further located on an upper layer and/or a lower layer of the emission layer EML.

Figure 26:
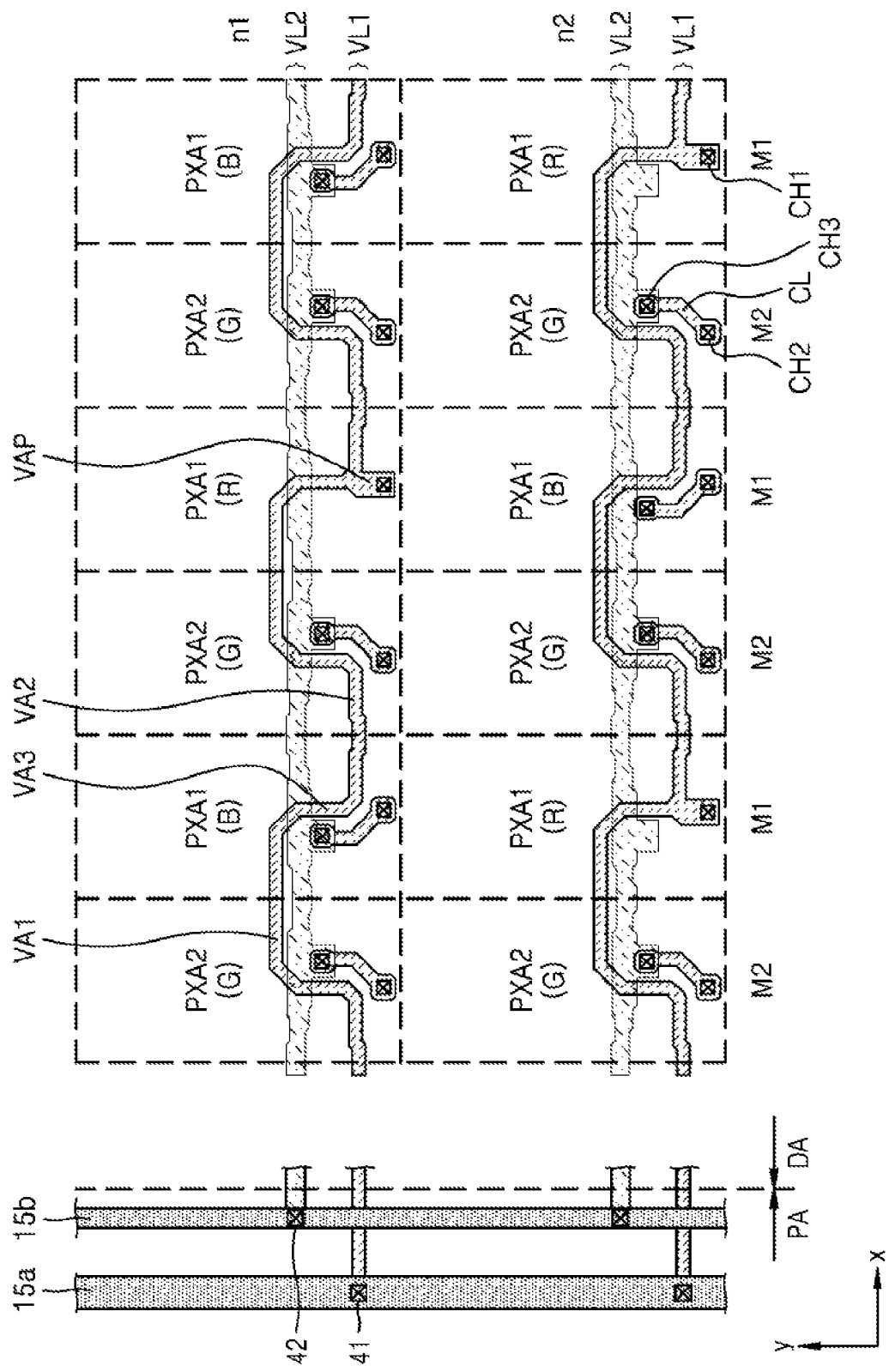
FIG. 26 is a view illustrating an arrangement of a first initialization voltage line and a second initialization voltage line in a display area according to some embodiments.

FIG. 26 is a view illustrating an arrangement of the first initialization voltage line VL1 and the second initialization voltage line VL2 in a display area according to some embodiments.

Referring to FIG. 26, a circuit of the first pixel PX1 or the third pixel PX3 may be arranged in the first pixel area PXA1 according to the pixel arrangement of FIG. 6 in the display area DA, and a pixel circuit of the second pixel PX2 may be arranged in the second pixel area PXA2. That is, the initialization transistor T8 of the first pixel PX1 or the initialization transistor T8 of the third pixel PX3 may be arranged in the first pixel area PXA1, and the initialization transistor T8 of the second pixel PX2 may be arranged in the second pixel area PXA2. The first pixel PX1 may be the red pixel R, the second pixel PX2 may be the green pixel G, and the third pixel PX3 may be the blue pixel B. The first column M1 in which the pixel circuit of the first pixel PX1 and the pixel circuit of the third pixel PX3 are alternately arranged in the y-direction and the second column M2 in which the pixel circuits of the second pixels PX2 are repeatedly arranged in the y-direction may be alternated in the x-direction.

In each row, the first initialization voltage line VL1 and the second initialization voltage line VL2 may be respectively located on different layers. For example, as shown in FIG. 21, the first initialization voltage line VL1 may be on the fifth insulating layer 106, and as shown in FIG. 23, the second initialization voltage line VL2 may be on the fourth insulating layer 105. The second initialization voltage line VL2 may be on a layer between the gate electrode 131h of the initialization transistor T8 and the first initialization voltage line VL1. According to some embodiments, the second initialization voltage line VL2 may be on the same layer as that of an upper electrode of the capacitor Cst.

The first initialization voltage line VL1 may extend in the x-direction in a zigzag form in which the first portion VA1, the third portion VA3, and the second portion VA2 are sequentially repeated. The first initialization voltage line VL1 may include the fourth portion VAP electrically connected to the initialization transistor T8 in the first pixel area PXA1 in which the initialization transistor T8 of the first pixel PX1 is arranged. The fourth portion VAP of the first initialization voltage line VL1 may overlap the semiconductor layer of the initialization transistor T8, and may directly contact the semiconductor layer of the initialization transistor T8 through a contact hole CH1 (e.g., the contact hole 67 of FIG. 20).

The first initialization voltage line VL1 may be electrically connected to the first initialization voltage supply line 15a of the peripheral area PA. For example, in the peripheral area PA, the first initialization voltage supply line 15a is located on the sixth insulating layer 107, and may be electrically connected to the first initialization voltage line VL1 extending from the display area DA through a contact hole 41 penetrating the sixth insulating layer 107.

The second initialization voltage line VL2 may be electrically connected to the initialization transistor T8 through the connection electrode CL in a pixel area in which a connection electrode CL (e.g., the connection electrode 178 of FIG. 22) is arranged, for example, in each of the second pixel area PXA2 in which the initialization transistor T8 of the second pixel PX2 is arranged and the first pixel area PXA1 in which the initialization transistor T8 of the third pixel PX3 is arranged. The connection electrode CL may be electrically connected to the semiconductor layer of the initialization transistor T8 through the contact hole CH2 (e.g., the contact hole 63 of FIG. 22), and may be electrically connected to the second initialization voltage line VL2 through a contact hole CH3 (e.g., the contact hole 64 of FIG. 22).

The second initialization voltage line VL2 may be electrically connected to the second initialization voltage supply line 15b of the peripheral area PA. For example, in the peripheral area PA, the second initialization voltage supply line 15b may be on the same layer as that of the data line DL, that is, on the sixth insulating layer 107, and may be electrically connected to the second initialization voltage line VL2 extending from the display area DA through a contact hole 42 penetrating the third to sixth insulating layers 104 to 107. A width of the first initialization voltage supply line 15a may be greater than a width of the second initialization voltage supply line 15b.

In each row N1 and N2, a pair of the first pixel area PXA1 in which the fourth portion VAP of the first initialization voltage line VL1 is connected to the initialization transistor T8 and the second pixel area PXA2 in which the second initialization voltage line VL2 is connected to the initialization transistor T8 through the connection electrode CL, and a pair of the first pixel area PXA1 in which the second initialization voltage line VL2 is connected to the initialization transistor T8 through the connection electrode CL and the second pixel area PXA2 may alternate.

In the first column M1, the first pixel area PXA1 in which the fourth portion VAP of the first initialization voltage line VL1 is connected to the initialization transistor T8 and the first pixel area PXA1 in which the second initialization voltage line VL2 is connected to the initialization transistor T8 through the connection electrode CL may alternate. In the second column M2, the second pixel area PXA2 in which the second initialization voltage line VL2 is connected to the initialization transistor T8 through the connection electrode CL may be repeated.

According to some embodiments, the initialization transistor T8 of the first pixel PX1 which is the red pixel R is connected to the first initialization voltage line VL1, the initialization transistor T8 of the second pixel PX2 which is the green pixel G and the initialization transistor T8 of the third pixel PX3 which is the blue pixel B are connected to the second initialization voltage line VL2. The pixel electrode of the organic light-emitting diode OLED of the first pixel PX1 may be electrically connected to the first initialization voltage line VL1 via the initialization transistor T8 to receive the first initialization voltage Vaint1, and the pixel electrode of the organic light-emitting diode OLED of the second pixel PX2 and the pixel electrode of the organic light-emitting diode OLED of the third pixel PX3 may be electrically connected to the second initialization voltage line VL2 via the initialization transistor T8 to receive the second initialization voltage Vaint2. However, the embodiments according to the present disclosure are not limited thereto.

Figure 27:
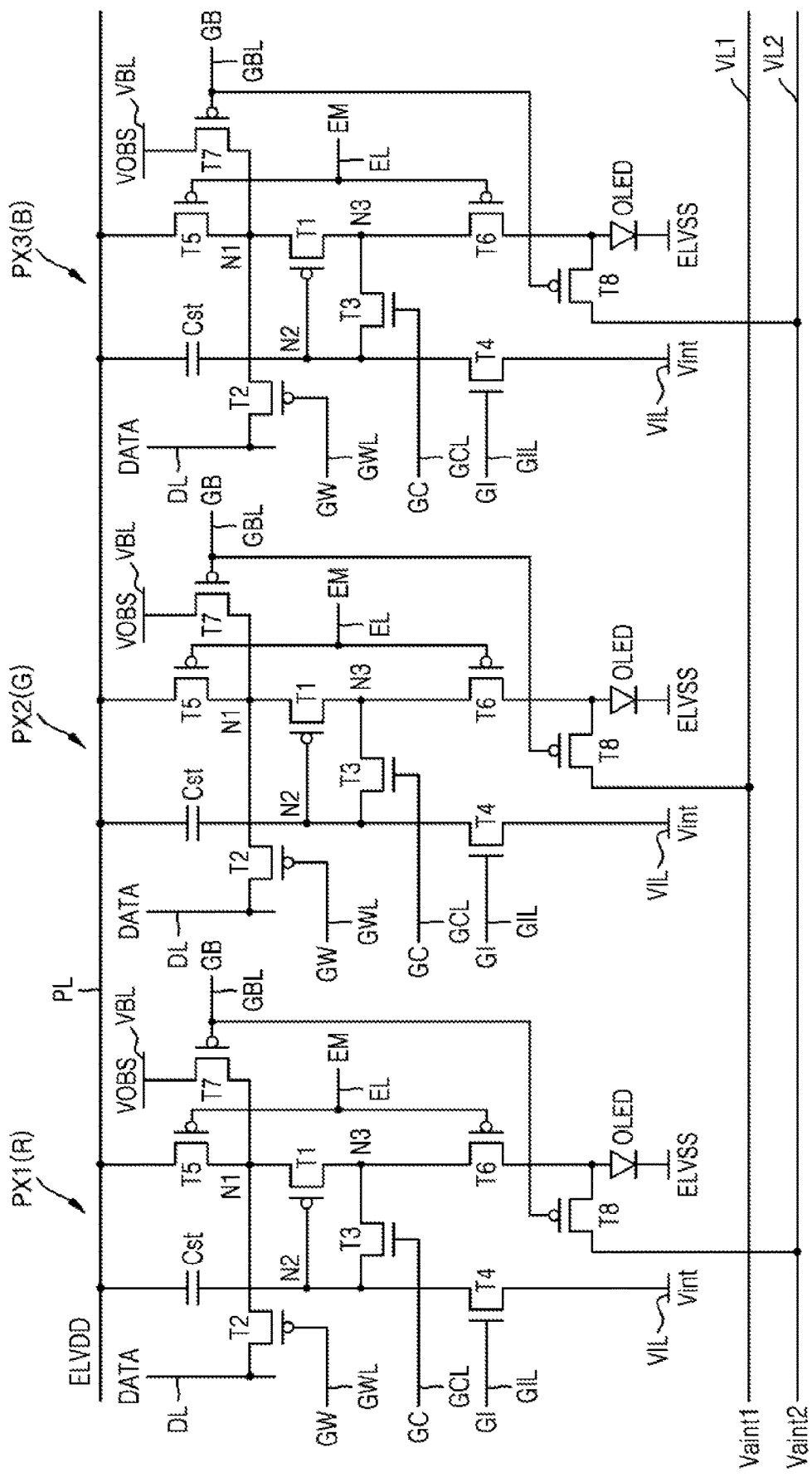
FIGS. 27 to 29 are views schematically illustrating a connection relationship between a pixel and an initialization voltage line, according to some embodiments.
Figure 28:
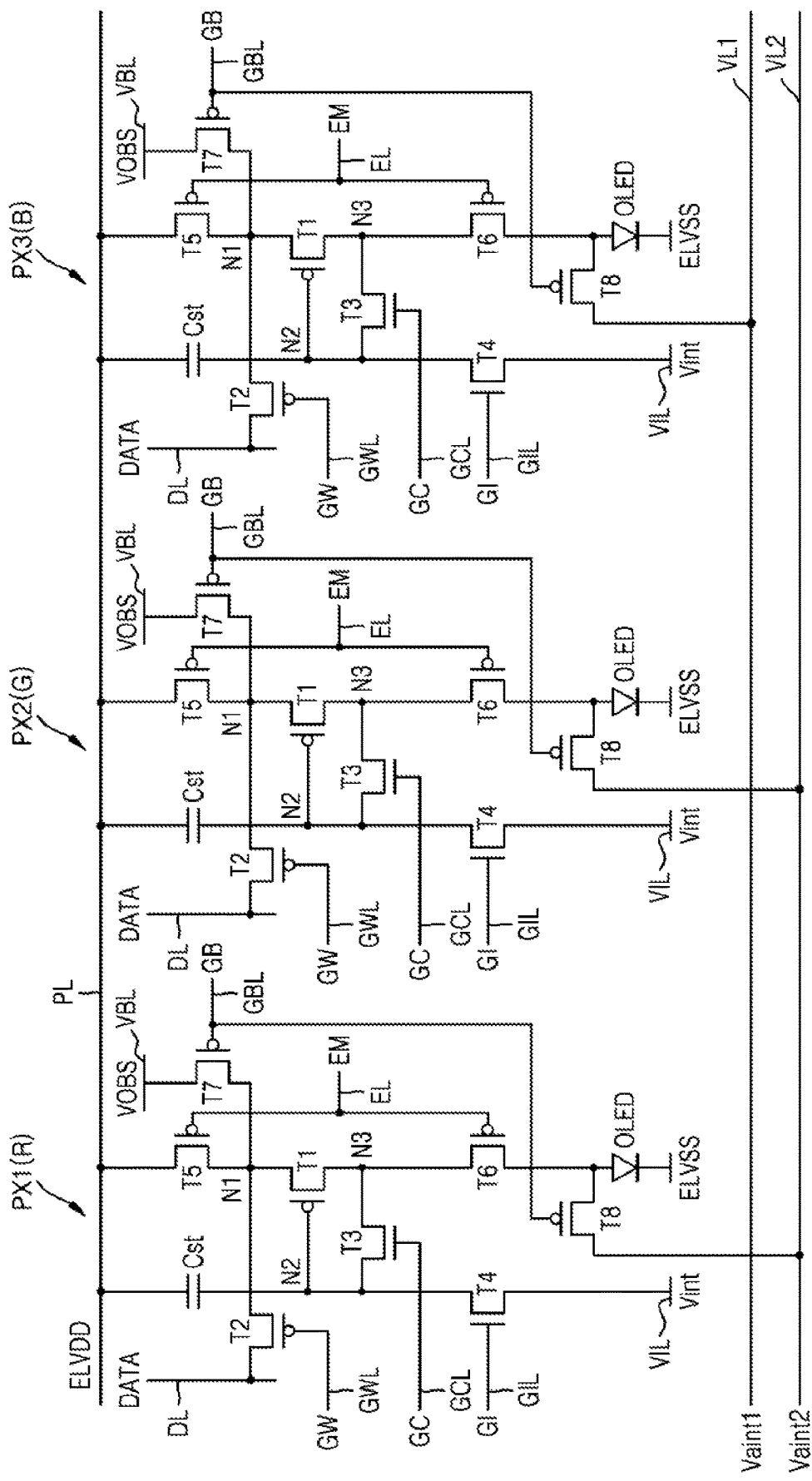
Figure 29:
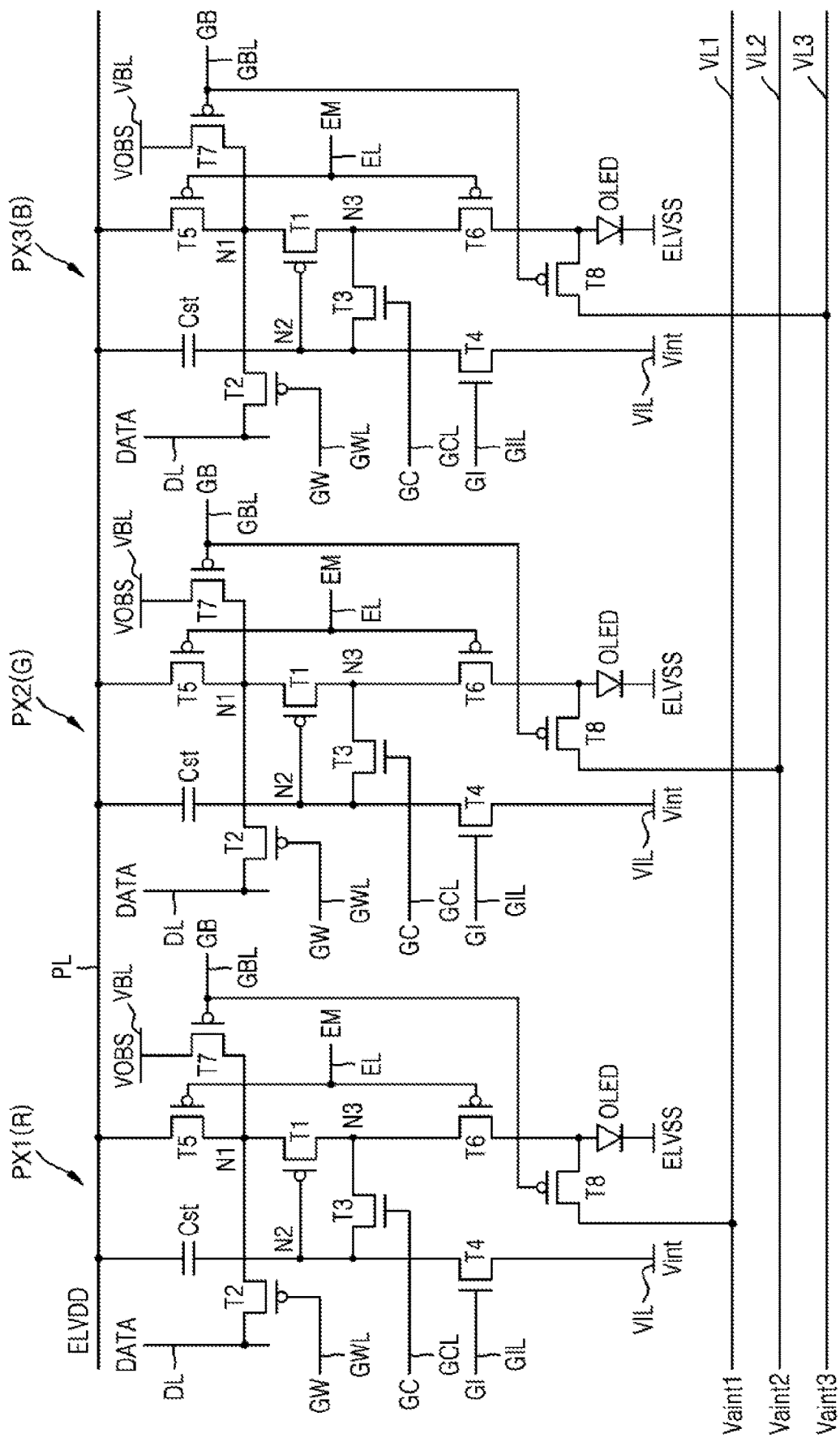

FIGS. 27 to 29 are views schematically illustrating a connection relationship between a pixel and an initialization voltage line, according to some embodiments.

According to some embodiments, as shown in FIG. 27, the pixel circuit of the second pixel PX2 that is the green pixel G may be connected to the first initialization voltage line VL1, and the pixel circuit of the first pixel PX1 that is the red pixel R and the pixel circuit of the third pixel PX3 that is the blue pixel B may be connected to the second initialization voltage line VL2. The pixel electrode of the organic light-emitting diode OLED of the second pixel PX2 may be electrically connected to the first initialization voltage line VL1 via the initialization transistor T8 to receive the first initialization voltage Vaint1, and the pixel electrode of the organic light-emitting diode OLED of the first pixel PX1 and the pixel electrode of the organic light-emitting diode OLED of the third pixel PX3 may be electrically connected to the second initialization voltage line VL2 via the initialization transistor T8 to receive the second initialization voltage Vaint2.

According to some embodiments, as shown in FIG. 28, the pixel circuit of the third pixel PX3 that is the blue pixel B may be connected to the first initialization voltage line VL1, and the pixel circuit of the first pixel PX1 that is the red pixel R and the pixel circuit of the second pixel PX2 that is the green pixel G may be connected to the second initialization voltage line VL2. The pixel electrode of the organic light-emitting diode OLED of the third pixel PX3 may be electrically connected to the first initialization voltage line VL1 via the initialization transistor T8 to receive the first initialization voltage Vaint1. The pixel electrode of the organic light-emitting diode OLED of the first pixel PX1 and the pixel electrode of the organic light-emitting diode OLED of the second pixel PX2 may be electrically connected to the second initialization voltage line VL2 via the initialization transistor T8 to receive the second initialization voltage Vaint2.

According to some embodiments, as shown in FIG. 29, the pixel circuit of the second pixel PX2 that is the red pixel R may be connected to the first initialization voltage line VL1, the pixel circuit of the second pixel PX2 that is the green pixel G may be connected to the second initialization voltage line VL2, and the pixel circuit of the third pixel PX3 that is the blue pixel B may be connected to a third initialization voltage line VL3.

The first initialization voltage line VL1, the second initialization voltage line VL2, and the third initialization voltage line VL3 may be on different layers, respectively. For example, the second initialization voltage line VL2 may be between the second insulating layer 103 and the third insulating layer 104, the third initialization voltage line VL3 may be between the fourth insulating layer 105 and the fifth insulating layer 106, and the first initialization voltage line VL1 may be between the fifth insulating layer 106 and the sixth insulating layer 107. In this case, the second initialization voltage line VL2 and the third initialization voltage line VL3 may be arranged to overlap the emission control line EL.

The pixel electrode of the organic light-emitting diode OLED of the first pixel PX1 may be electrically connected to the first initialization voltage line VL1 via the initialization transistor T8 to receive the first initialization voltage Vaint1. The pixel electrode of the organic light-emitting diode OLED of the second pixel PX2 may be electrically connected to the second initialization voltage line VL2 via the initialization transistor T8 to receive the second initialization voltage Vaint2. The pixel electrode of the organic light-emitting diode OLED of the third pixel PX3 may be electrically connected to the third initialization voltage line VL3 via the initialization transistor T8 to receive a third initialization voltage Vaint3.

Figure 30:
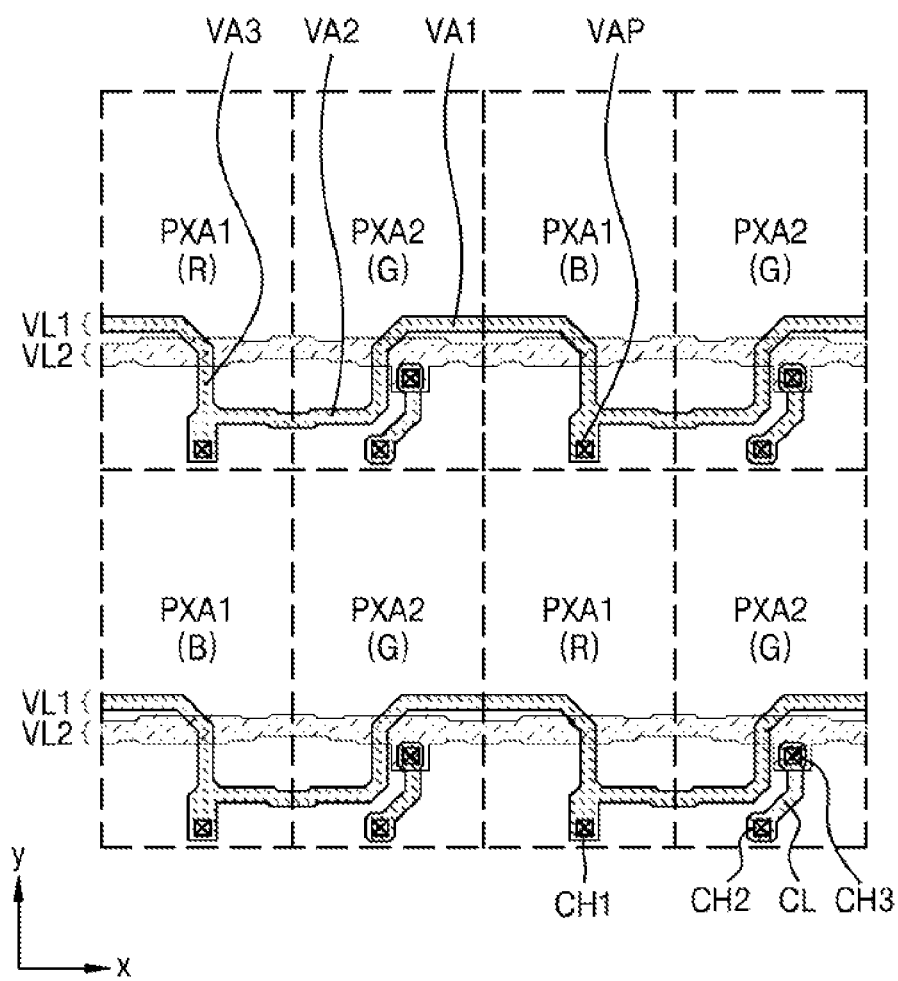
FIG. 30 is a view illustrating an arrangement of a first initialization voltage line and a second initialization voltage line in a display area according to some embodiments.

FIG. 30 is a view illustrating an arrangement of the first initialization voltage line VL1 and the second initialization voltage line VL2 in a display area according to some embodiments. FIG. 30, illustrates embodiments in which the initialization transistor T8 of the second pixel PX2 that is the green pixel G may be connected to the second initialization voltage line VL2, and the initialization transistor T8 of the first pixel PX1 that is the red pixel R and the initialization transistor T8 of the third pixel PX3 that is the blue pixel B may be connected to the first initialization voltage line VL1.

The embodiments illustrated with respect to FIG. 30 are different from the embodiments illustrated with respect to FIG. 26 in that a pixel to which the first initialization voltage line VL1 and the second initialization voltage line VL2 are connected is different from the embodiments shown with respect to FIG. 26, and the arrangement of other elements is similar. For example, the first initialization voltage line VL1 may be between the fifth insulating layer 106 and the sixth insulating layer 107, and the second initialization voltage line VL2 may overlap the emission control line EL and may be between the fourth insulating layer 105 and the fifth insulating layer 106.

The first initialization voltage line VL1 may extend in the x-direction in a zigzag shape. The first initialization voltage line VL1 may include the fourth portion VAP electrically connected to the initialization transistor T8 in the first pixel area PXA1 in which the initialization transistor T8 of the first pixel PX1 is arranged and in the first pixel area PXA1 in which the initialization transistor T8 of the third pixel PX3 is arranged, respectively. The fourth portion VAP of the first initialization voltage line VL1 may overlap the semiconductor layer of the initialization transistor T8, and may directly contact the semiconductor layer of the initialization transistor T8 through the contact hole CH1. The first initialization voltage line VL1 may receive the first initialization voltage Vaint1 from the first initialization voltage supply line 15a of the peripheral area PA and may transmit the first initialization voltage Vaint1 to the pixel electrode of the organic light-emitting diode OLED through the initialization transistor T8.

The second initialization voltage line VL2 may be electrically connected to the initialization transistor T8 through the connection electrode CL in the second pixel area PXA2 in which the initialization transistor T8 of the second pixel PX2 is arranged. The second initialization voltage line VL2 may receive the second initialization voltage Vaint2 from the second initialization voltage supply line 15b of the peripheral area PA and may transmit the second initialization voltage Vaint2 to the pixel electrode of the organic light-emitting diode OLED through the initialization transistor T8 connected to the connection electrode CL.

In each row, the first pixel area PXA1 in which the fourth portion VAP of the first initialization voltage line VL1 is connected to the initialization transistor T8 and the second pixel area PXA2 in which the second initialization voltage line VL2 is connected to the initialization transistor T8 through the connection electrode CL may alternate. In the first column M1, the first pixel area PXA1 in which the fourth portion VAP of the first initialization voltage line VL1 is connected to the initialization transistor T8 may be repeated. In the second column M2, the second pixel area PXA2 in which the second initialization voltage line VL2 is connected to the initialization transistor T8 through the connection electrode CL may be repeated.

Figure 31:
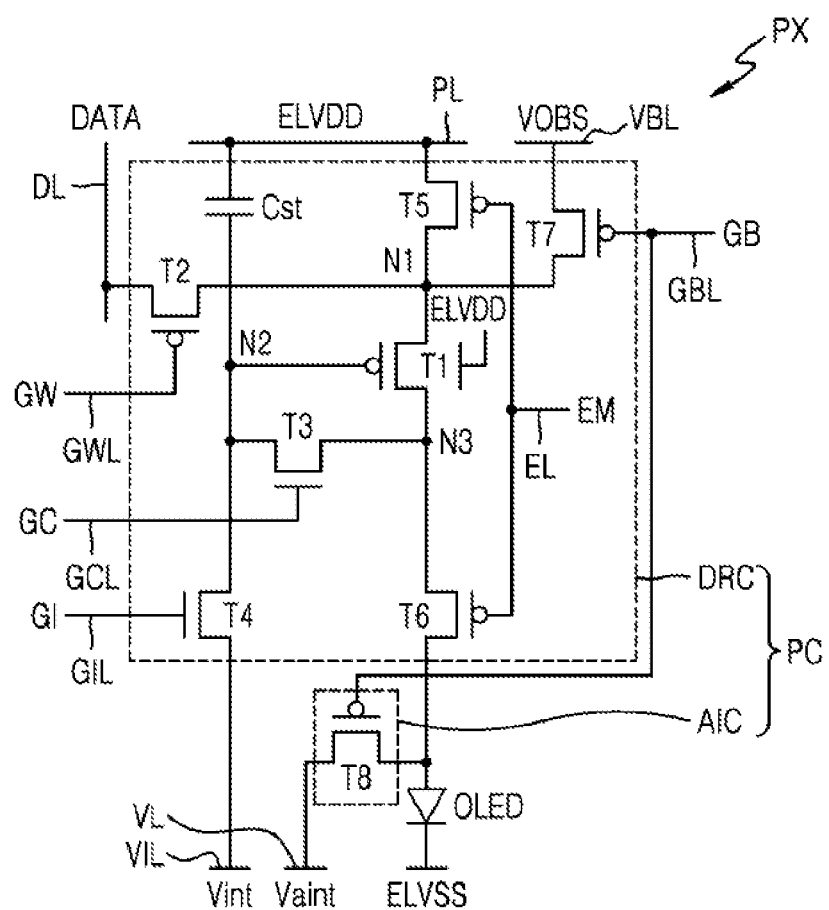
FIG. 31 is an equivalent circuit diagram of a pixel circuit according to some embodiments.
Figure 32:
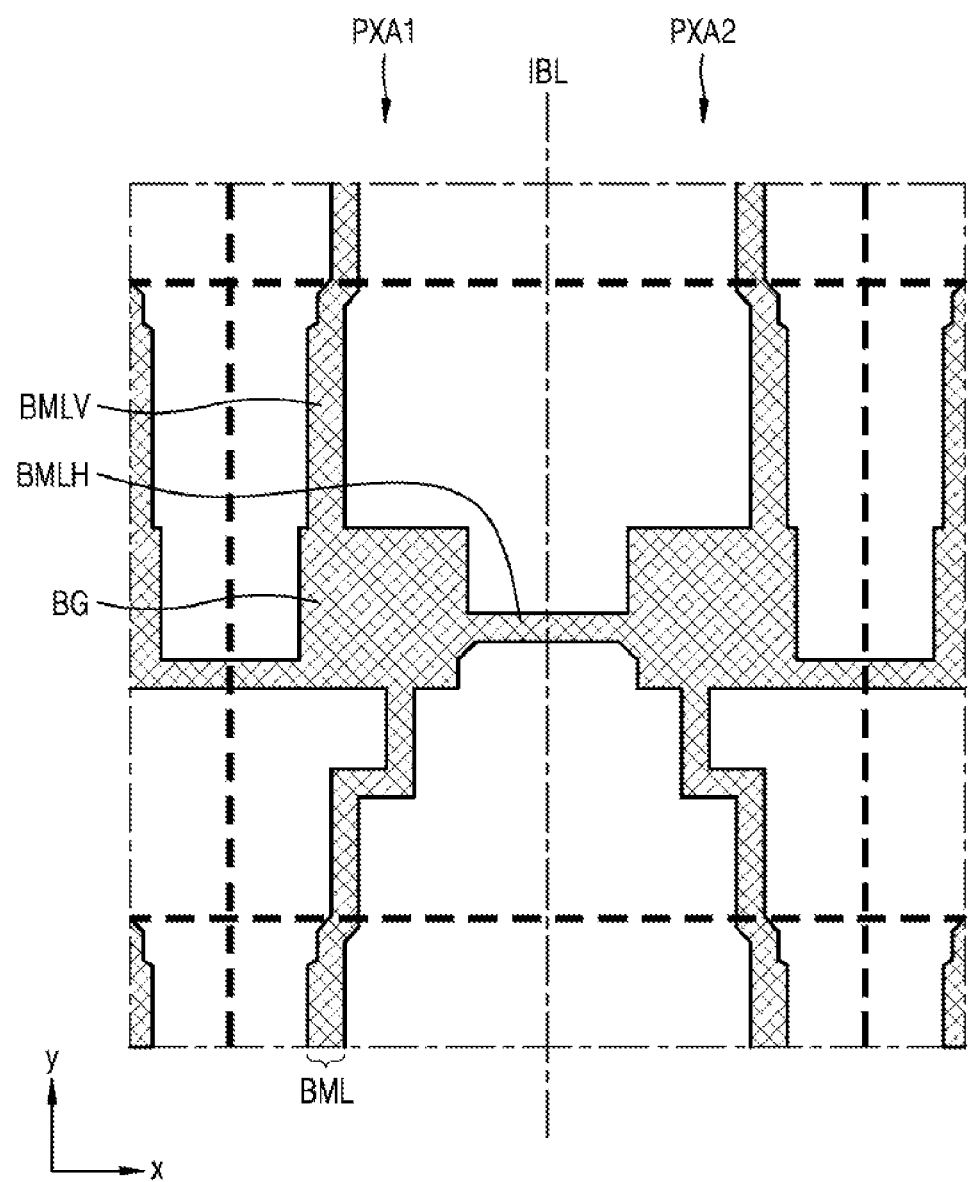
FIGS. 32 and 33 are views illustrating an arrangement of elements corresponding to the pixel circuit of FIG. 31 according to some embodiments.
Figure 33:
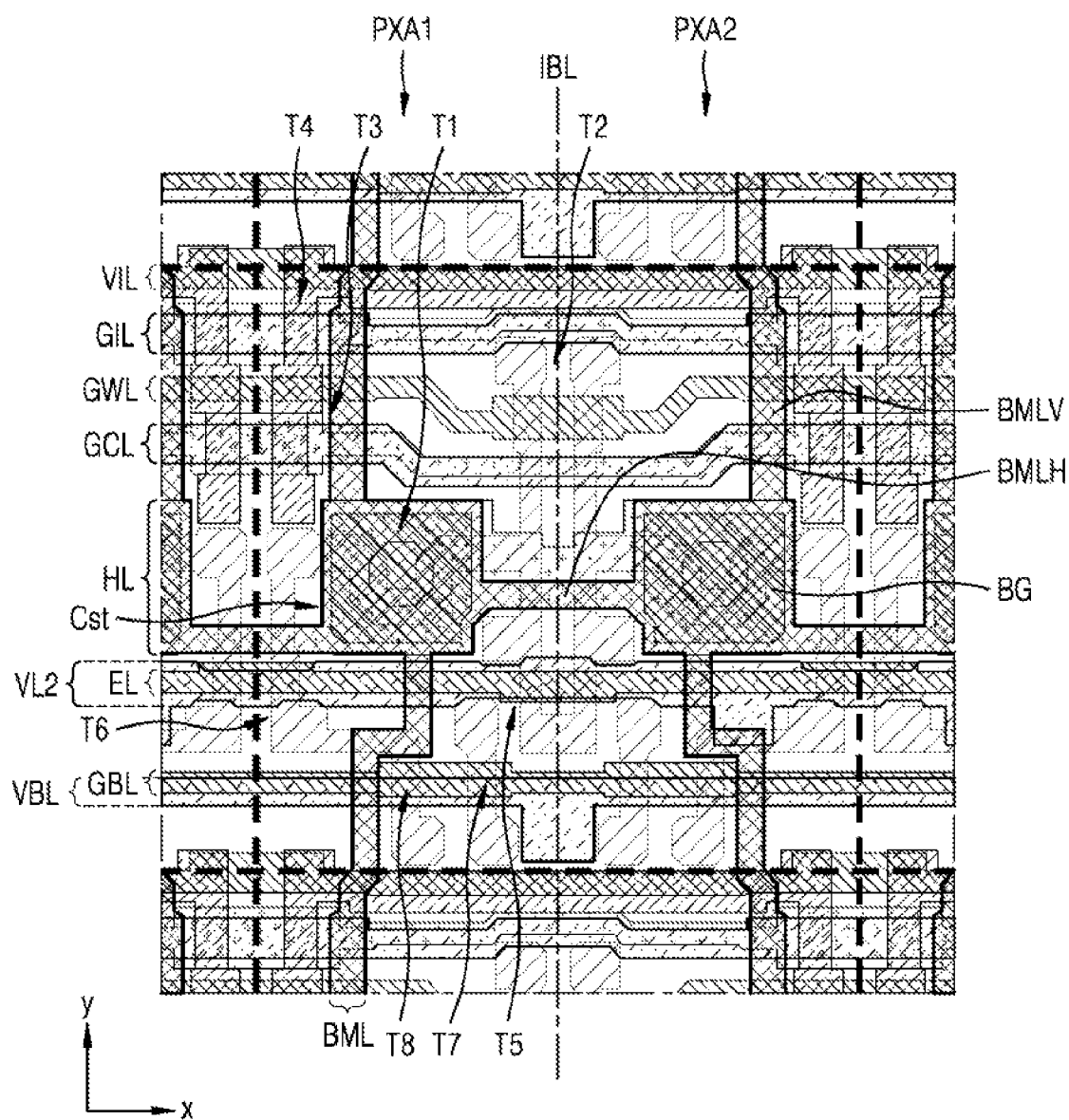

FIG. 31 is an equivalent circuit diagram of a pixel circuit according to some embodiments. FIGS. 32 and 33 are views illustrating an arrangement of elements corresponding to the pixel circuit of FIG. 31.

Referring to FIG. 31, in a driving circuit unit DRC of the pixel circuit PC, the first transistor T1 may include a gate electrode connected to the second node N2 and a gate electrode to which the first power voltage ELVDD is applied. Other configurations are the same as that of the pixel circuit shown in FIG. 5.

Referring to FIG. 32, a conductive layer BML may be between the substrate 100 and the buffer layer 101 or between the buffer layer 101 and the first semiconductor layer SACT in a mesh structure extending in the x and y-directions. The conductive layer BML may include a lower gate electrode BG, which is an area corresponding to the gate electrode 131a of the first transistor T1 in each pixel area, a horizontal portion BMLH extending in the x-direction, and a vertical portion BMLV extending in the y-direction. The lower gate electrode BG may face the gate electrode 131a with a semiconductor layer therebetween. The conductive layer BML may receive the first power voltage ELVDD. As shown in FIG. 33, an insulating layer may be on the conductive layer BML, and elements may be on the insulating layer as shown in FIGS. 11 to 18.

The pixel circuit PC according to some embodiments is not limited to the number of the transistors and capacitors and circuit designs described with reference to FIGS. 5 and 31, and the number and circuit designs may vary. For example, transistors of a pixel circuit including the initialization transistor T8 may be P-type transistors or N-type transistors, wherein transistors and/or capacitors and/or other electrical components may be omitted and/or added.

FIGS. 34 to 43 are equivalent circuit diagrams of a pixel circuit according to some embodiments. Hereinafter, differences from the pixel circuit of FIG. 5 or the pixel circuit of FIG. 31 will be mainly described, and other descriptions of the same configuration may be omitted.

Figure 34:
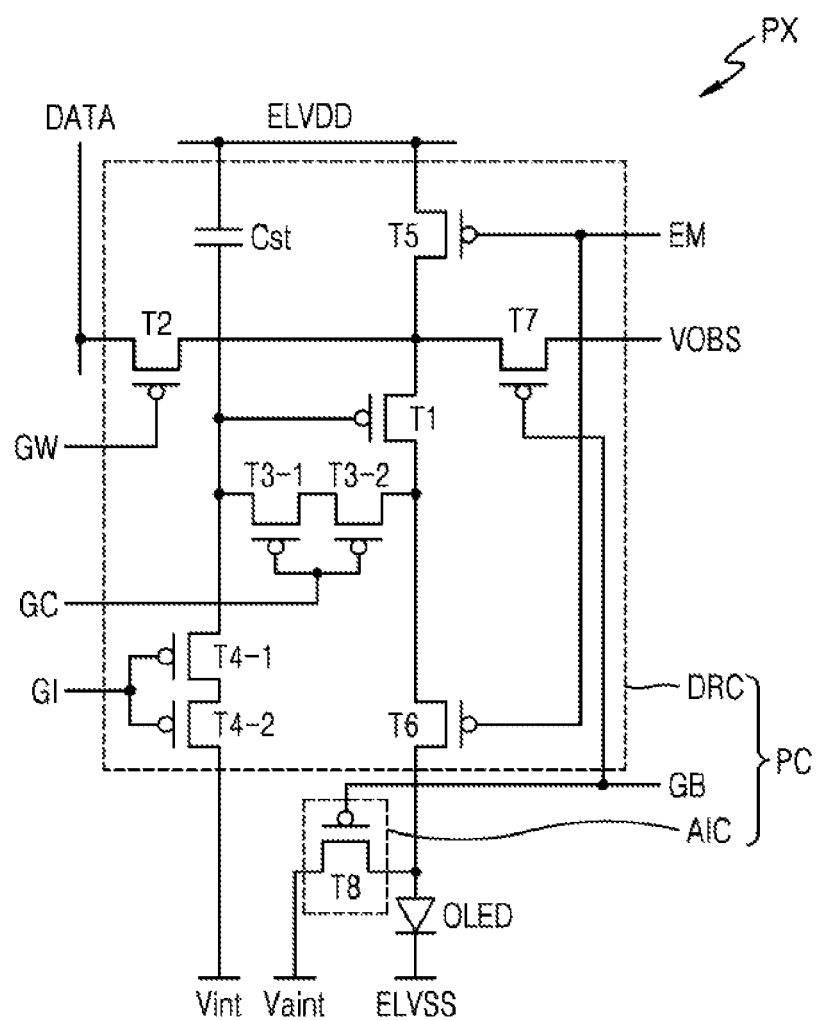
FIGS. 34 to 43 are equivalent circuit diagrams of a pixel circuit according to some embodiments.

The pixel circuit PC shown in FIG. 34 is a modified example of the pixel circuit PC shown in FIG. 5. In the pixel circuit PC shown in FIG. 34, the third transistor T3 and the fourth transistor T4 may be P-type transistors, the third transistor T3 may include a 3rd-1st transistor T3-1 and a 3rd-2nd transistor T3-2 connected in series, and the fourth transistor T4 may include a 4th-1st transistor T4-1 and a 4th-2nd transistor T4-2 connected in series. Other element configurations are the same as that of the pixel circuit of FIG. 5.

Figure 35:
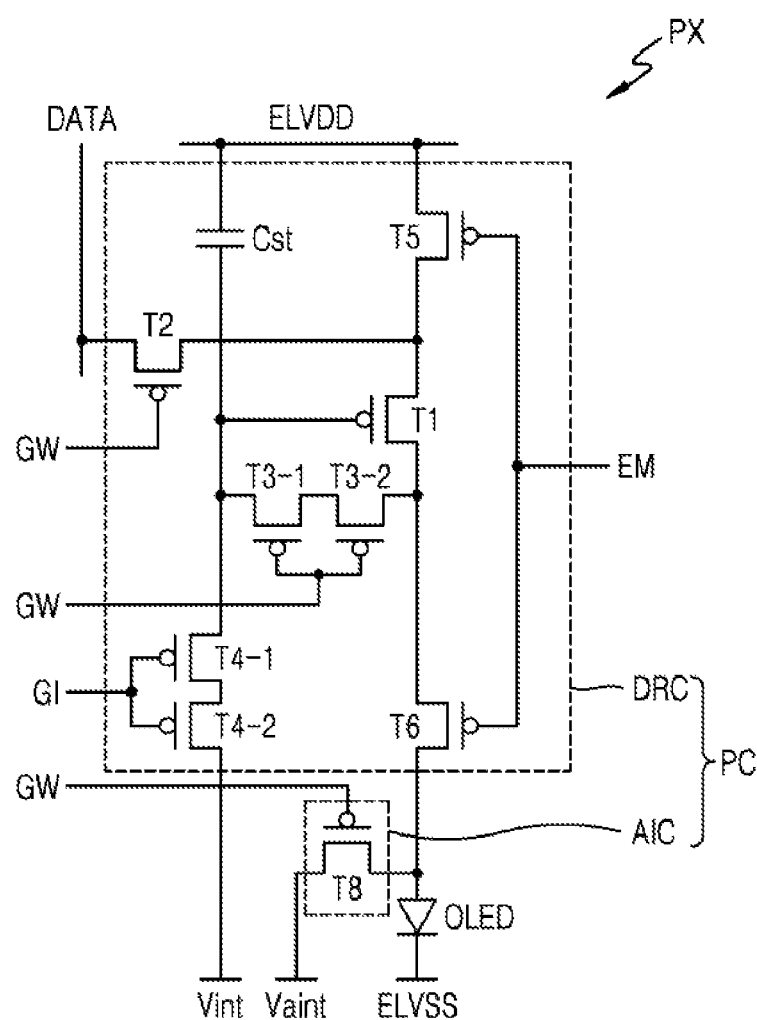

The pixel circuit PC shown in FIG. 35 is a modified example of the pixel circuit PC shown in FIG. 5. In the pixel circuit PC shown in FIG. 35, the seventh transistor T7 may be omitted and the third transistor T3 and the fourth transistor T4 may be P-type transistors, the third transistor T3 may include a 3rd-1st transistor T3-1 and a 3rd-2nd transistor T3-2 connected in series, and the fourth transistor T4 may include a 4th-1st transistor T4-1 and a 4th-2nd transistor T4-2 connected in series. A gate electrode of the third transistor T3 and a gate electrode of the initialization transistor T8 may be connected to a first gate line and controlled by the first scan signal GW. Other element configurations are the same as that of the pixel circuit of FIG. 5.

Figure 36:
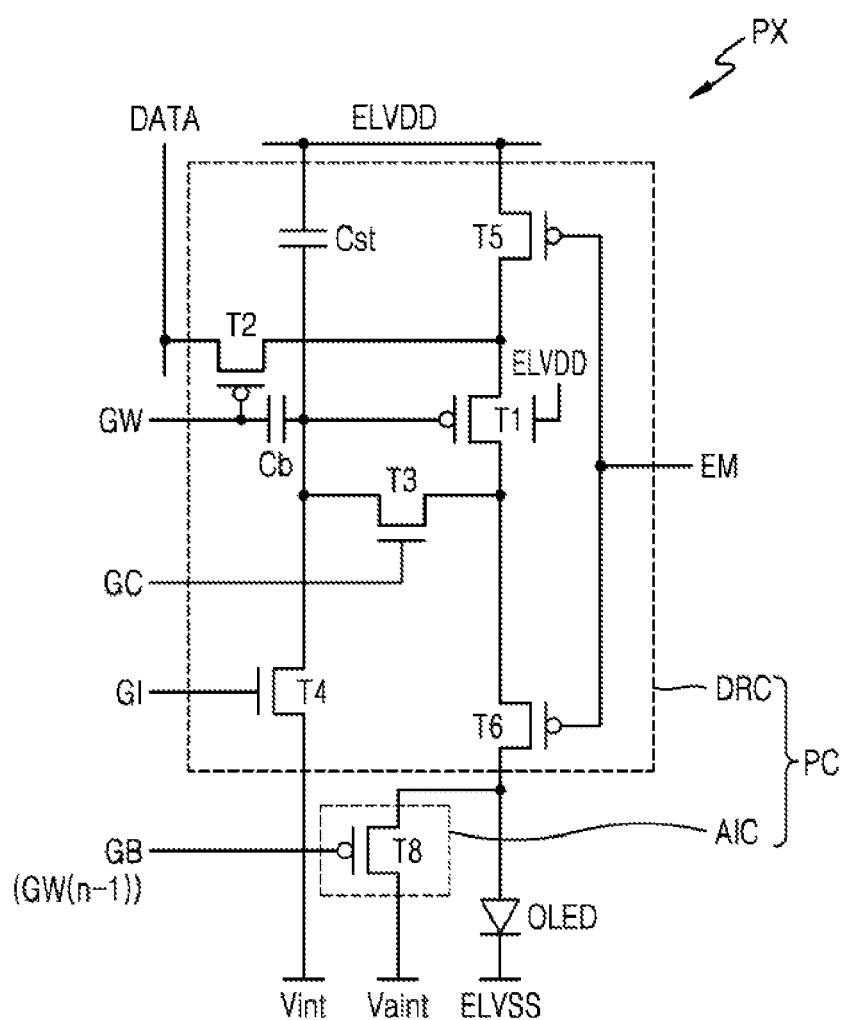

The pixel circuit PC shown in FIG. 36 is a modified example of the pixel circuit PC shown in FIG. 31, In the pixel circuit PC shown in FIG. 36, the seventh transistor T7 may be omitted, and a capacitor Cb may be added between a gate electrode of the first transistor T1 and a gate electrode of the second transistor T2 in the pixel circuit PC shown in FIG. 31. The fourth scan signal GB supplied to the gate electrode of the initialization transistor T8 may be a first scan signal GW(n−1) of the previous row. Other element configurations are the same as that of the pixel circuit of FIG. 31.

Figure 37:
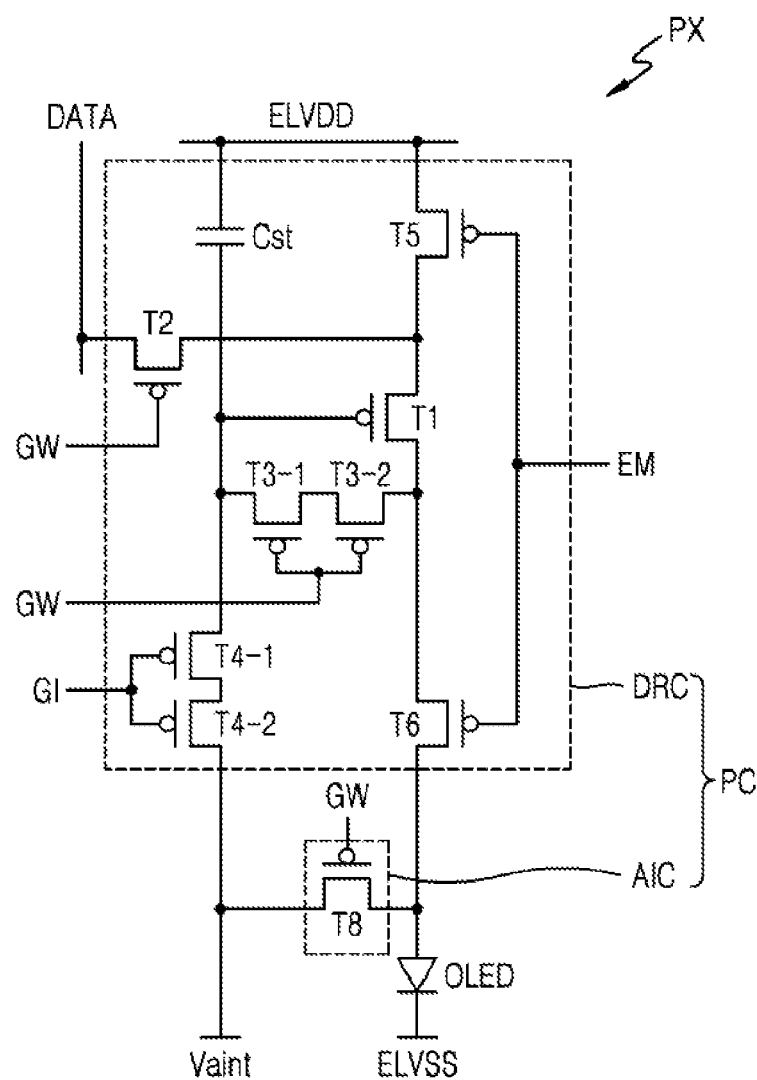

The pixel circuit PC shown in FIG. 37 is a modified example of the pixel circuit PC shown in FIG. 5, In the pixel circuit PC shown in FIG. 37, the seventh transistor T7 may be omitted and the third transistor T3 and the fourth transistor T4 may be P-type transistors, the third transistor T3 may include a 3rd-1st transistor T3-1 and a 3rd-2nd transistor T3-2 connected in series, and the fourth transistor T4 may include a 4th-1st transistor T4-1 and a 4th-2nd transistor T4-2 connected in series. The gate electrode of the third transistor T3 and the gate electrode of the initialization transistor T8 may be connected to a first gate line and controlled by the first scan signal GW. The fourth transistor T4 and the initialization transistor T8 may be connected to the same initialization voltage line VL, and the fourth transistor T4 may transmit an initialization signal Vaint to the gate electrode of the first transistor T1, and the initialization transistor T8 may transmit the initialization signal Vaint to a pixel electrode of the organic light-emitting diode OLED. Other element configurations are the same as that of the pixel circuit of FIG. 5.

Figure 38:
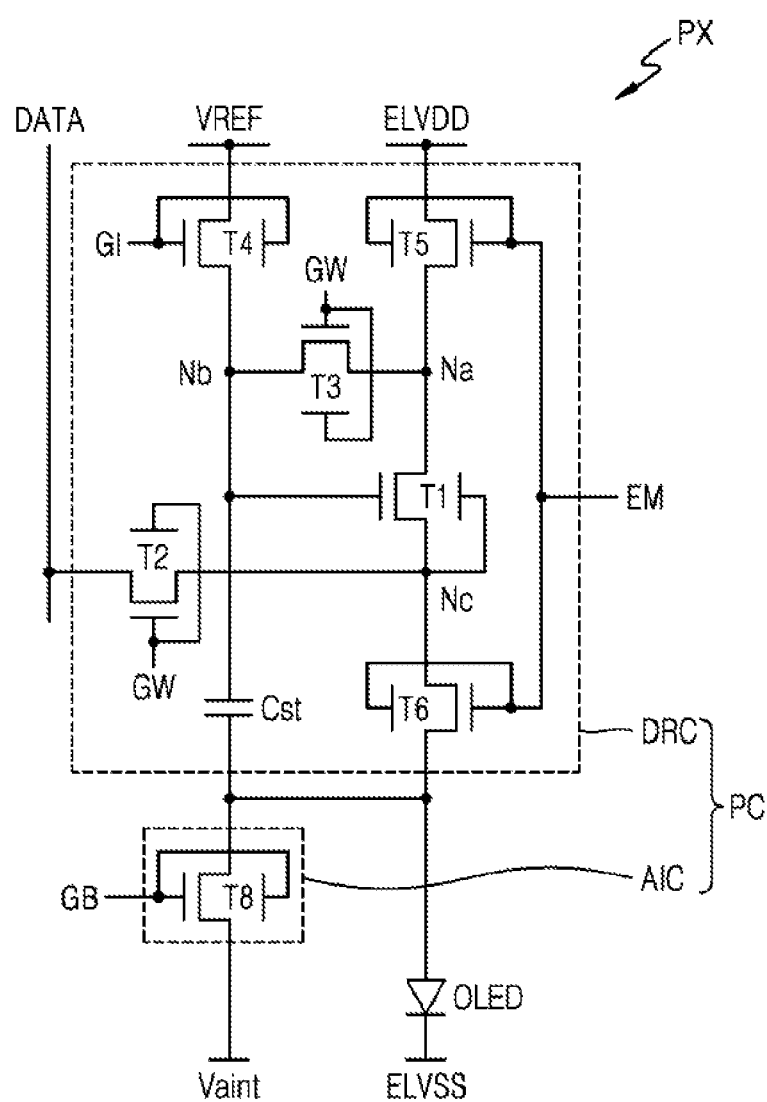

The pixel circuit PC shown in FIG. 38 is an example of the pixel circuit PC shown in FIG. 5, In the pixel circuit PC shown in FIG. 38, the seventh transistor T7 may be omitted and the first to sixth transistors T1 to T6 and the initialization transistor T8 may be N-type transistors. A node Na may be a node in which a first terminal of the first transistor T1 is connected to a second terminal of the fifth transistor T5. A node Nb may be a node to which the gate electrode of the first transistor T1, a second terminal of the third transistor T3, and a second terminal of the fourth transistor T4 are connected to each other. A node Nc may be a node to which a second terminal of the first transistor T1, a second terminal of the second transistor T2, and a first terminal of the sixth transistor T6 are connected to each other.

Each of the first to sixth transistors T1 to T6 and the initialization transistor T8 may further include a lower gate electrode. The lower gate electrode of the first transistor T1 may be connected to the node Nc and connected to the second terminal thereof. The lower gate electrode of each of the second to sixth transistors T1 to T6 and the initialization transistor T8 may be connected to the gate electrode thereof. A first terminal of the second transistor T2 may be connected to a data line, and a second terminal may be connected to the node Nc. A first terminal of the third transistor T3 may be connected to the node Na, and a second terminal may be connected to the node Nb. A first terminal of the fourth transistor T4 may be connected to a voltage line supplying a reference voltage VREF, and a second terminal may be connected to the node Nb. A first terminal of the fifth transistor T5 may be connected to a first power voltage line supplying the first power voltage ELVDD, and a second terminal may be connected to the node Na. The first terminal of the sixth transistor T6 may be connected to the node Nc, and a second terminal may be connected to the pixel electrode of the organic light-emitting diode OLED. A first terminal of the initialization transistor T8 may be connected to an initialization voltage line, and a second terminal may be connected to one electrode of the capacitor Cst and the pixel electrode of the organic light-emitting diode OLED. The capacitor Cst may be connected between the node Nb and the pixel electrode of the organic light-emitting diode OLED. The gate electrode of the third transistor T3 and the gate electrode of the second transistor T2 may be connected to the first gate line and controlled by the first scan signal GW.

Figure 39:
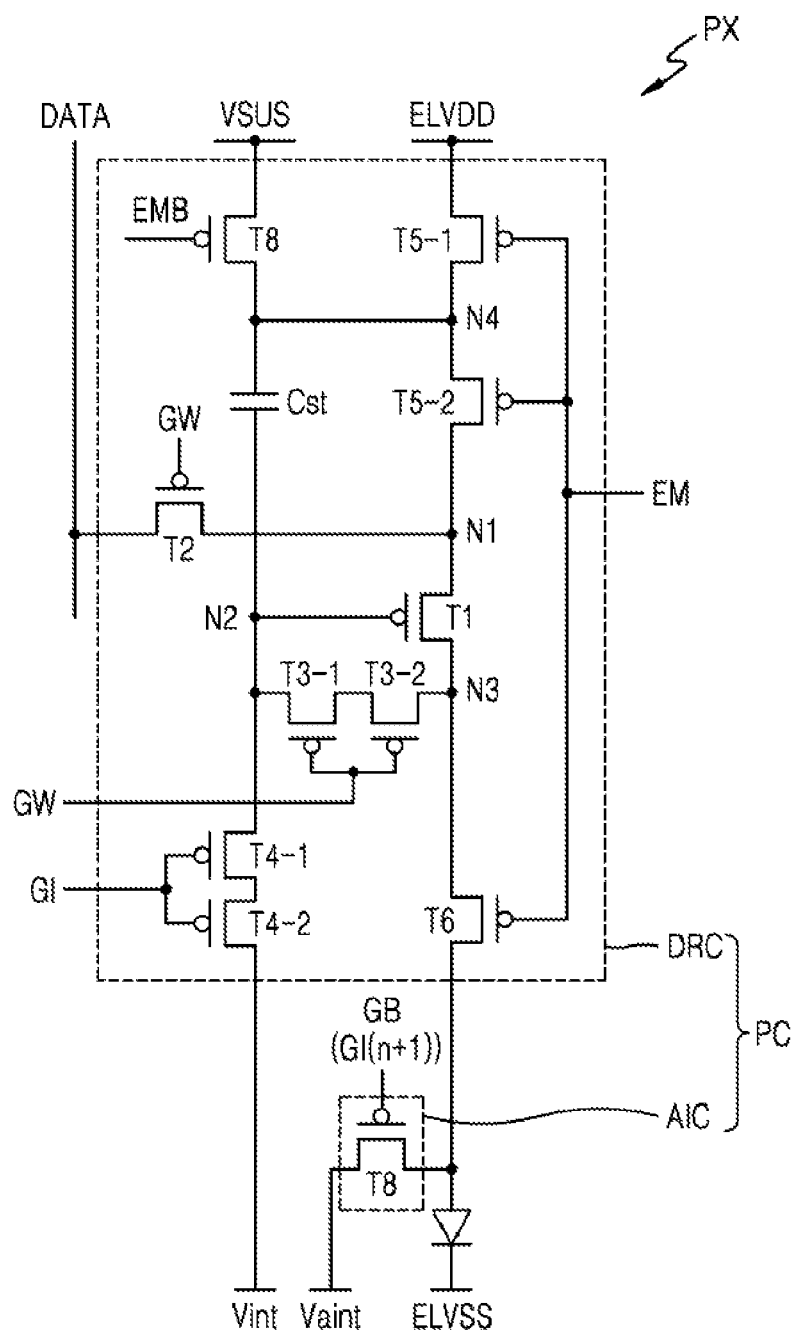

The pixel circuit PC shown in FIG. 39 is a modified example of the pixel circuit PC shown in FIG. 5, In the pixel circuit PC shown in FIG. 39, the seventh transistor T7 may be omitted, the third transistor T3 and the fourth transistor T4 may be P-type transistors, the third transistor T3 may include a 3rd-1st transistor T3-1 and a 3rd-2nd transistor T3-2 connected in series, the fourth transistor T4 may include a 4th-1st transistor T4-1 and the 4th-2nd transistor T4-2 connected in series, the fifth transistor T5 may include a 5th-1st transistor T5-1 and a 5th-2nd transistor T5-2 connected in series, and an eighth transistor T8 may be added. The eighth transistor T8 may be connected between an intermediate node N4 of the 5th-1st transistor T5-1 and the 5th-2nd transistor T5-2 and a voltage line supplying a maintaining voltage VSUS. A gate electrode of the eighth transistor T8 may be controlled by an inverted signal EMB of the emission control signal EM. The capacitor Cst may be connected between the intermediate node N4 and the gate electrode of the first transistor T1. The gate electrode of the third transistor T3 and the gate electrode of the second transistor T2 may be connected to the first gate line and controlled by the first scan signal GW. The fourth scan signal GB supplied to the gate electrode of the initialization transistor T8 may be a second scan signal GI(n+1) of the next row. Other element configurations are the same as that of the pixel circuit of FIG. 5.

Figure 40:
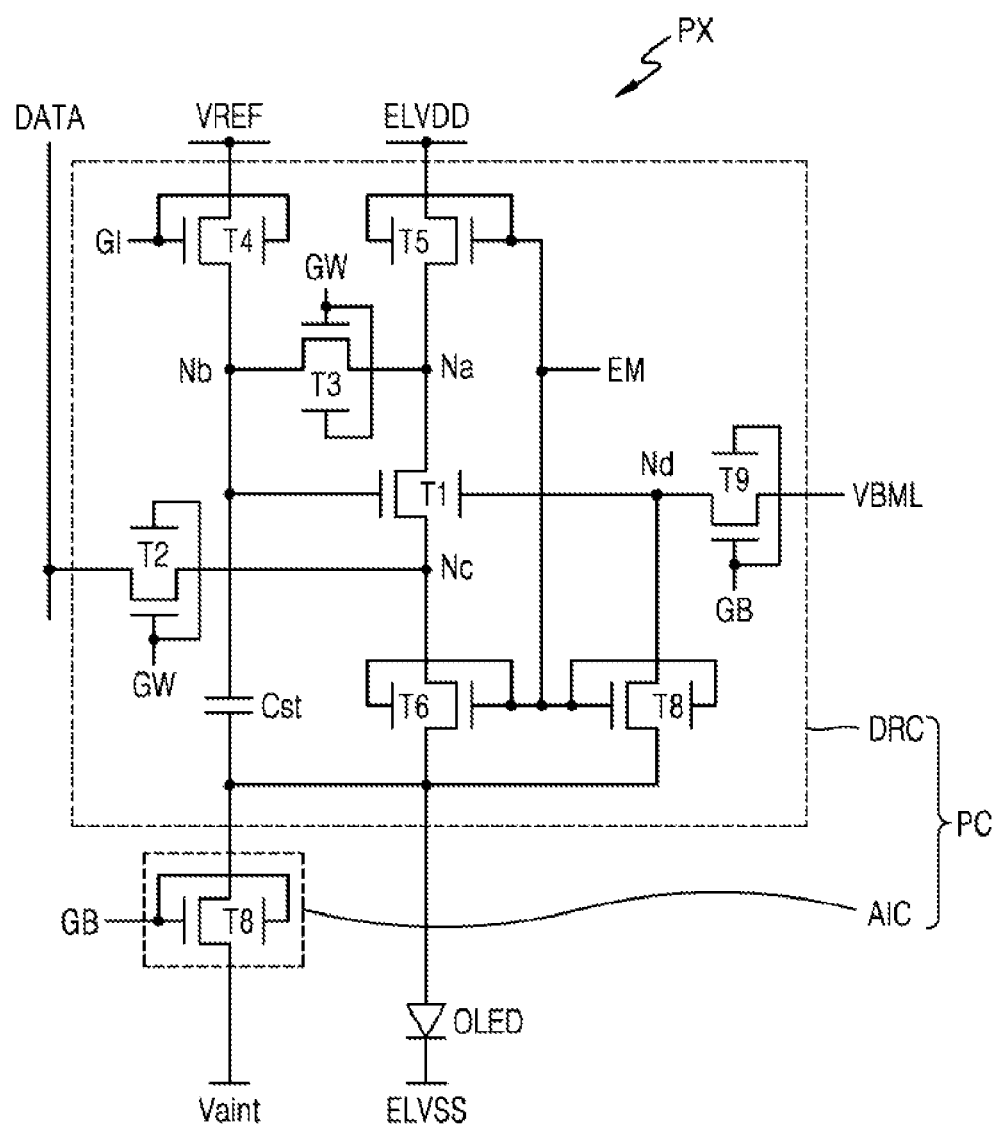
Figure 41:
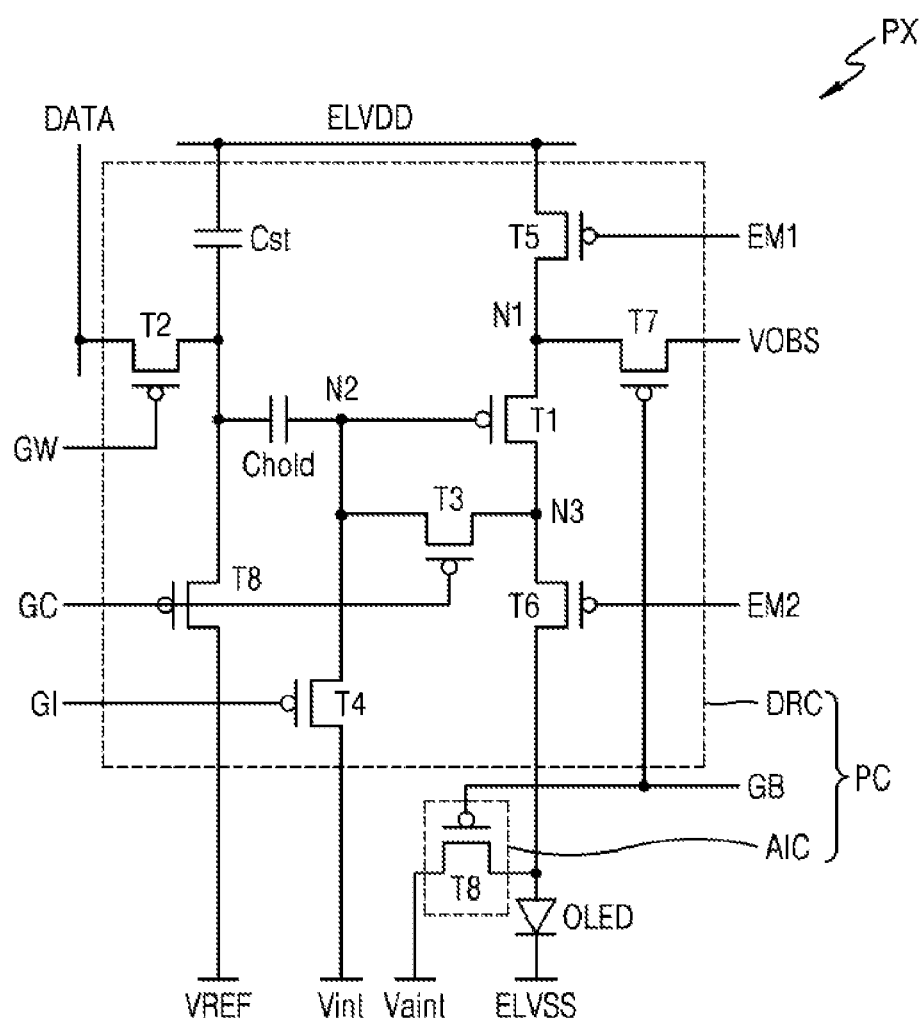

The pixel circuit PC shown in FIG. 40 is an example of the pixel circuit PC shown in FIG. 38, In the pixel circuit PC shown in FIG. 40, the eighth transistor T8 and a ninth transistor T9 may be added to the pixel circuit PC shown in FIG. 38. Each of the eighth transistor T8 and the ninth transistor T9 may further include a lower gate electrode connected to the gate electrode thereof. The eighth transistor T8 may be connected between a node Nd to which the lower gate electrode of the first transistor T1 is connected and the pixel electrode of the organic light-emitting diode OLED. The gate electrode of the eighth transistor T8 may be connected to an emission control line that supplies the emission control signal EM. The ninth transistor T9 may be connected between the node Nd to which the lower gate electrode of the first transistor T1 is connected and a voltage line supplying a control voltage VBML. The gate electrode of the ninth transistor T9 may be controlled by the fourth scan signal GB supplied to the gate electrode of the initialization transistor T8.

The pixel circuit PC shown in FIG. 36 is an example of the pixel circuit PC shown in FIG. 5. In the pixel circuit PC shown in FIG. 41, the eighth transistor T8 and a capacitor Chod may be added and the third transistor T3 and the fourth transistor T4 may be P-type transistors. An emission control signal EM1 applied to the gate electrode of the fifth transistor T5 and an emission control signal EM2 applied to the gate electrode of the sixth transistor T6 may have different values. The capacitor Chod may be connected between the second terminal of the second transistor T2 and the gate electrode of the first transistor T1, and the capacitor Cst may be connected between the first power voltage line and the second terminal of the second transistor T2. The eighth transistor T8 may be connected between a voltage line to which the reference voltage VREF is applied and the second terminal of the second transistor T2. The gate electrode of the eighth transistor T8 may be controlled by the third scan signal GC applied from a third gate line.

Figure 42:
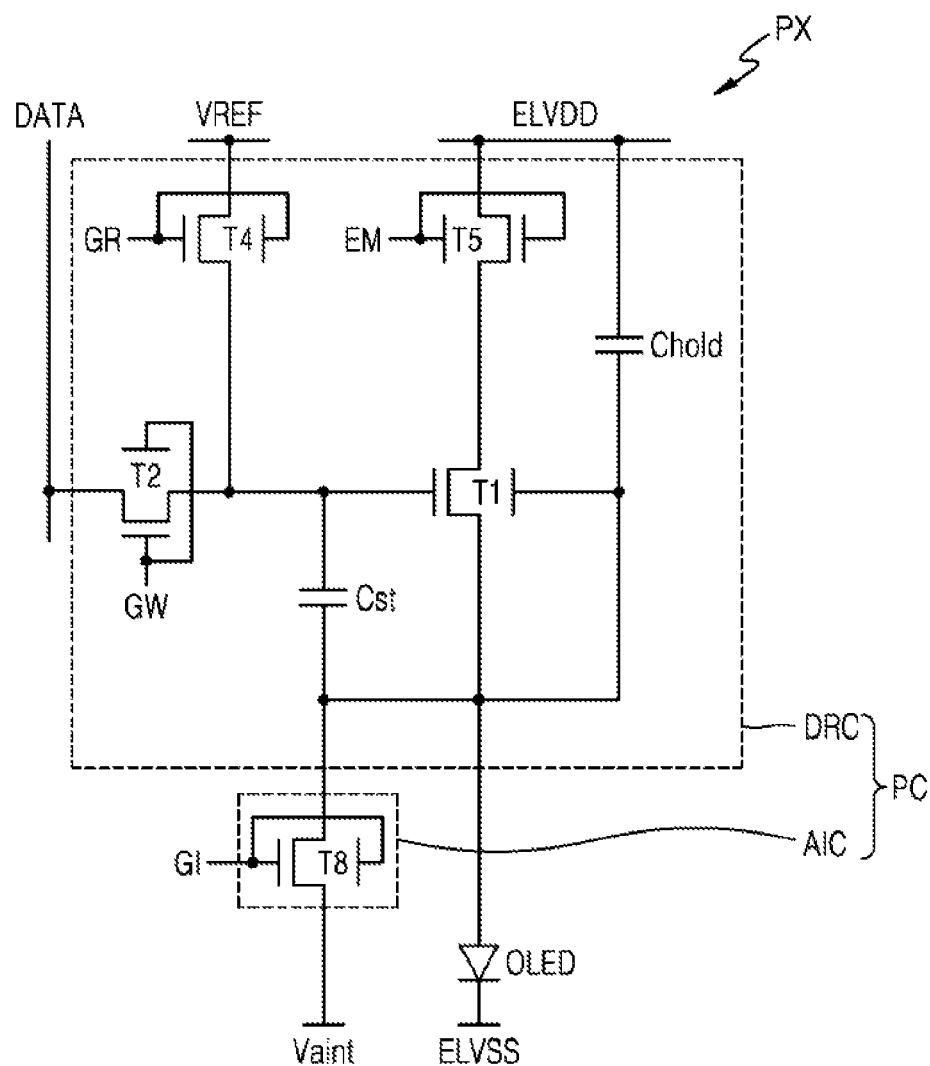

The pixel circuit PC shown in FIG. 42 is a modified example of the pixel circuit PC shown in FIG. 38, In the pixel circuit PC shown in FIG. 42, the third transistor T3 and the sixth transistor T6 may be omitted, a capacitor Chold may be added, the second transistor T2 may be connected between the data line and the gate electrode of the first transistor T1, and the gate electrode of the initialization transistor T8 may be controlled by the second scan signal GI. The capacitor Chold may be connected between the first power voltage line and the pixel electrode of the organic light-emitting diode OLED. The gate electrode of the fourth transistor T4 may be controlled by a fifth scan signal GR.

Figure 43:
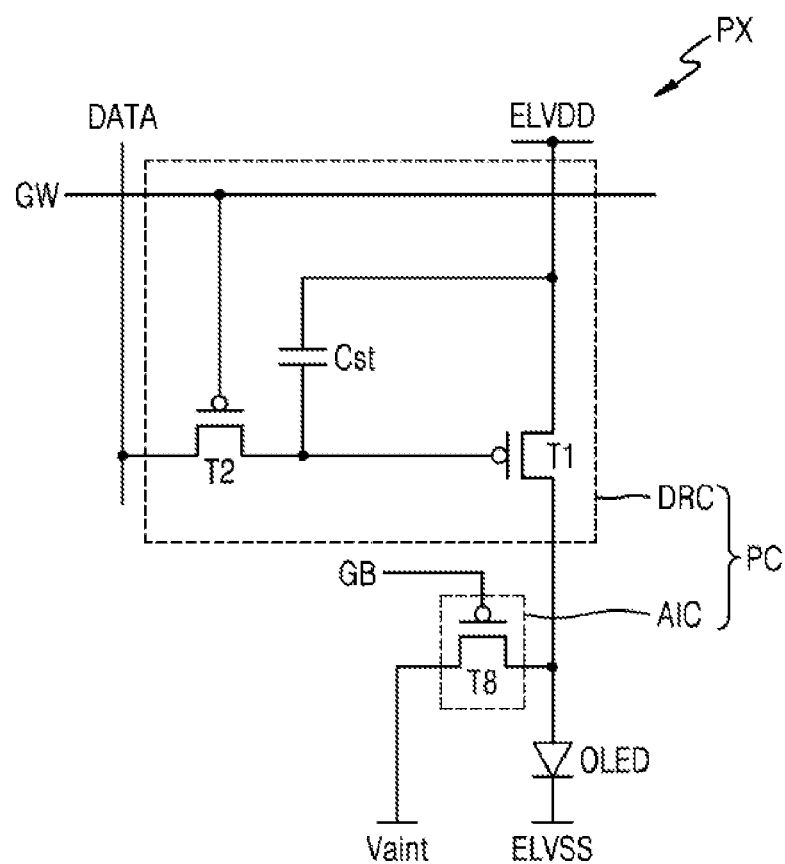

The pixel circuit PC shown in FIG. 43 is a modified example of the pixel circuit PC shown in FIG. 5. In the pixel circuit PC shown in FIG. 43, the driving circuit unit DRC may include the first transistor T1, the second transistor T2, and the capacitor Cst. The second transistor T2 may be connected between the data line and the gate electrode of the first transistor T1, and the capacitor Cst may be connected between the first power voltage line and the gate electrode of the first transistor T1.

Figure 44:
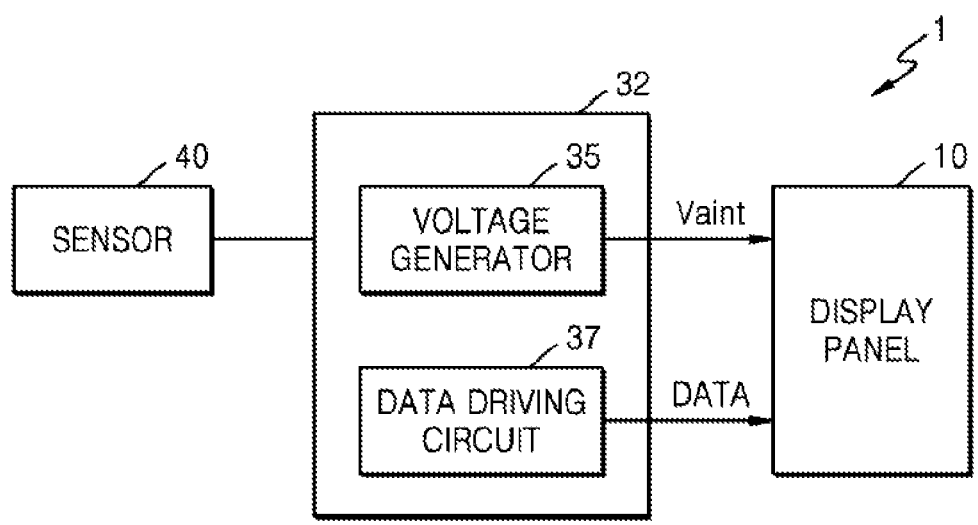
FIG. 44 is a view schematically illustrating an operation of transmitting an initialization voltage according to temperature to a display panel, according to some embodiments.

FIG. 44 is a view schematically illustrating an operation of transmitting an initialization voltage according to temperature to a display panel according to some embodiments.

Referring to FIG. 44, the display device 1 may include the display panel 10, the display driver 32, and a sensor 40.

The sensor 40 may be built into the display device 1. The sensor 40 may include at least one of an illuminance sensor for detecting external illuminance, an optical sensor for detecting the amount of light, or a temperature sensor for detecting an external temperature or the temperature of the display device 1.

The display driver 32 may include the voltage generator 35 and a data driving circuit 37.

The data driving circuit 37 may generate the data signal DATA and transmit the data signal DATA to data lines DL of the display panel 10.

The voltage generator 35 may determine the temperature based on detection information received from the sensor 40. The voltage generator 35 may generate the initialization voltage Vaint differently according to temperature and output the initialization voltage Vaint to the display panel 10. The voltage generator 35 may determine that a temperature higher than a reference temperature is a high temperature, and a temperature below the reference temperature may be determined as a normal temperature. When it is determined that the temperature is high, the voltage generator 35 may generate and output the first initialization voltage Vaint1 and the second initialization voltage Vaint2 corresponding to the high temperature, and when it is determined that the temperature is normal, the voltage generator 35 may generate and output the first initialization voltage Vaint1 and the second initialization voltage Vaint2 corresponding to the normal temperature.

According to some embodiments, the voltage generator 35 may generate and output the first initialization voltage Vaint1 and the second initialization voltage Vaint2 differently according to the temperature of the display device 1. For example, at least one of the first initialization voltage Vaint1 or the second initialization voltage Vaint2 output by the voltage generator 35 may have different values at a first temperature (high temperature) and a second temperature (normal temperature). The first initialization voltage Vaint1 may be different at the first temperature and the second temperature and the second initialization voltage Vaint2 may be same at the first temperature and the second temperature. The second initialization voltage Vaint2 may be different at the first temperature and the second temperature and the first initialization voltage Vaint1 may be same at the first temperature and the second temperature. Each of the first initialization voltage Vaint1 and the second initialization voltage Vaint2 may be different at the first temperature and the second temperature.

The display driver 32 may include a memory, and the voltage generator 35 may determine whether the temperature corresponding to the detection information received from the sensor 40 is a high temperature or a normal temperature by using a lookup table indicating a relationship between detection information and temperatures, stored in advance in the memory.

The initialization voltage Vaint at a high temperature and the initialization voltage Vaint at a normal temperature may be pre-stored for each color pixel in the memory. According to some embodiments, the initialization voltage Vaint for each of a plurality of temperatures may be previously stored for each color pixel in the memory. The voltage generator 35 may generate the first initialization voltage Vaint1 and the second initialization voltage Vaint2 for each color pixel selected according to the temperature of the display device 1 from the memory, and may output the first initialization voltage Vaint1 and the second initialization voltage Vaint2 to the first initialization voltage supply line 15a and the second initialization voltage supply line 15b of the display panel 10, respectively.

Meanwhile, according to some embodiments of the disclosure, a pixel arrangement may be an arrangement of light-emitting areas. The pixel arrangement according to some embodiments is not limited to thereto. For example, the disclosure may be applied to a pixel array having a stripe arrangement, a mosaic arrangement, and a delta arrangement. Furthermore, the disclosure may also be applied to a pixel array structure further including a white pixel that emits white light.

By applying different initialization voltages to one electrode of each organic light-emitting diode of pixels emitting light of different colors, embodiments may improve or prevent the problem of deterioration of image quality properties due to different electrical properties due to differences in material properties of organic light-emitting diodes.

Some embodiments according to the present disclosure may include a display panel having relatively improved image quality properties by compensating for electrical properties of an organic light-emitting diode for each pixel emitting light of different colors, and a display device having the display panel. However, the scope of embodiments the disclosure are not limited by these characteristics.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims, and their equivalents.

What is claimed is:

1. A display panel including a display area and a peripheral area outside the display area, the display panel comprising:
   a first initialization voltage line extending in a first direction in the display area and configured to transmit a first initialization voltage;
   a second initialization voltage line extending in the first direction in the display area and configured to transmit a second initialization voltage;
   a first transistor in a first pixel area of the display area and including a first semiconductor layer connected to the first initialization voltage line, and a first gate electrode;
   a second transistor in a second pixel area adjacent to the first pixel area, the second transistor including a second semiconductor layer connected to the second initialization voltage line, and a second gate electrode; and
   a first connection electrode in the second pixel area,
   wherein the first initialization voltage line and the second initialization voltage line are on different layers from each other, and the first initialization voltage line and the first connection electrode are on a same layer, wherein the first initialization voltage line extends in a zigzag shape and directly contacts the first semiconductor layer through a contact hole, and the second initialization voltage line extends in a straight line shape and is connected to the second semiconductor layer by using the first connection electrode, and wherein the first transistor transmits the first initialization voltage to a pixel electrode of a first light-emitting diode configured to emit light of a first color, and the second transistor transmits the second initialization voltage to a pixel electrode of a second light-emitting diode configured to emit light of a second color.

2. The display panel of claim 1, wherein the first transistor and the second transistor are line-symmetric with respect to a boundary line in a second direction perpendicular to the first direction.

3. The display panel of claim 1, wherein, in a plan view, the first initialization voltage line includes a first portion and a second portion, which are parallel to the second initialization voltage line, and a third portion crossing the second initialization voltage line and connecting the first portion to the second portion, in each row.

4. The display panel of claim 3, wherein the first initialization voltage line comprising a fourth portion protruding from a position where the second portion and the third portion contact each other in the first pixel area of the display area.

5. The display panel of claim 1, wherein the second initialization voltage line is on a layer between a second gate electrode of the second transistor and the first initialization voltage line.

6. The display panel of claim 1, further comprising a third transistor in a third pixel area adjacent to the second pixel area, the third transistor including a third semiconductor layer connected to the second initialization voltage line, and a third gate electrode, wherein the second initialization voltage line is connected to the third semiconductor layer through a second connection electrode, and wherein the third transistor transmits the second initialization voltage to a pixel electrode of a third light-emitting diode configured to emit light of a third color.

7. The display panel of claim 1, further comprising:
a first initialization voltage supply line extending in a second direction perpendicular to the first direction in the peripheral area, and configured to supply the first initialization voltage to the first initialization voltage line; and
a second initialization voltage supply line extending in the second direction in the peripheral area, and configured to supply the second initialization voltage to the second initialization voltage line.

8. The display panel of claim 7, further comprising a scan driving circuit in the peripheral area and configured to supply a scan signal to the first gate electrode of the first transistor and the second gate electrode of the second transistor, wherein the first initialization voltage supply line and the second initialization voltage supply line overlap the scan driving circuit.

9. The display panel of claim 1, wherein, in at least one of the first initialization voltage or the second initialization voltage, a value at a temperature higher than a reference temperature is different from a value at a temperature below the reference temperature.

10. A display panel including a display area and a peripheral area outside the display area, the display panel comprising:
a first initialization voltage line extending in a first direction in the display area and configured to transmit a first initialization voltage;
a second initialization voltage line extending in the first direction in the display area and configured to transmit a second initialization voltage, wherein, in a plan view, the first initialization voltage line comprises a first portion and a second portion in a same row of pixel areas, which are parallel to the second initialization voltage line, the first initialization voltage line further comprising a third portion crossing the second initialization voltage line and connecting the first portion to the second portion, and the first initialization voltage line comprising a fourth portion protruding from a position where the second portion and the third portion contact each other in a first pixel area of the display area;
a first transistor in the first pixel area of the display area and including a first semiconductor layer connected to the fourth portion of the first initialization voltage line, and a first gate electrode; and
a second transistor in a second pixel area adjacent to the first pixel area, the second transistor including a second semiconductor layer connected to the second initialization voltage line, and a second gate electrode,
wherein the first transistor transmits the first initialization voltage to a pixel electrode of a first light-emitting diode configured to emit light of a first color, and the second transistor transmits the second initialization voltage to a pixel electrode of a second light-emitting diode configured to emit light of a second color.

11. The display panel of claim 10, wherein the first initialization voltage line and the second initialization voltage line are on different layers.

12. The display panel of claim 10, wherein the first transistor and the second transistor are line-symmetric with respect to a boundary line in a second direction perpendicular to the first direction.

13. The display panel of claim 10, wherein the first initialization voltage line extends in a zigzag shape.

14. The display panel of claim 10, wherein the second initialization voltage line is on a layer between a second gate electrode of the second transistor and the first initialization voltage line.

15. The display panel of claim 10, wherein the first initialization voltage line is in direct contact with the first semiconductor layer,
the second initialization voltage line is connected to the second semiconductor layer through a first connection electrode, and
the first connection electrode and the first initialization voltage line are on a same layer.

16. The display panel of claim 15, further comprising a third transistor in a third pixel area adjacent to the second pixel area, the third transistor including a third semiconductor layer connected to the second initialization voltage line, and a third gate electrode,
wherein the second initialization voltage line is connected to the third semiconductor layer through a second connection electrode, and
wherein the third transistor transmits the second initialization voltage to a pixel electrode of a third light-emitting diode configured to emit light of a third color.

17. The display panel of claim 10, further comprising:

a first initialization voltage supply line extending in a second direction perpendicular to the first direction in the peripheral area, and configured to supply the first initialization voltage to the first initialization voltage line; and a second initialization voltage supply line extending in the second direction in the peripheral area, and configured to supply the second initialization voltage to the second initialization voltage line.

18. The display panel of claim 17, further comprising a scan driving circuit in the peripheral area and configured to supply a scan signal to the first gate electrode of the first transistor and the second gate electrode of the second transistor, wherein the first initialization voltage supply line and the second initialization voltage supply line overlap the scan driving circuit.

19. The display panel of claim 10, wherein, in at least one of the first initialization voltage or the second initialization voltage, a value at a temperature higher than a reference temperature is different from a value at a temperature below the reference temperature.

* * * * *